United States Patent
Yamazaki et al.

(10) Patent No.: US 9,054,206 B2
(45) Date of Patent: Jun. 9, 2015

(54) METHOD FOR MANUFACTURING SEMICONDUCTOR DEVICE

(75) Inventors: Shunpei Yamazaki, Setagaya (JP); Sachiaki Teduka, Atsugi (JP); Satoshi Toriumi, Ebina (JP); Makoto Foruno, Atsugi (JP); Yasuhiro Jinbo, Atsugi (JP); Koji Dairiki, Atsugi (JP); Hideaki Kuwabara, Isehara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 12/222,109

(22) Filed: Aug. 1, 2008

(65) Prior Publication Data

US 2009/0047759 A1 Feb. 19, 2009

(30) Foreign Application Priority Data

Aug. 17, 2007 (JP) ................... 2007-213057

(51) Int. Cl.
*H01L 21/84* (2006.01)
*H01L 29/786* (2006.01)
(Continued)

(52) U.S. Cl.
CPC ..... *H01L 29/78696* (2013.01); *H01L 29/78678* (2013.01); *H01L 21/02532* (2013.01);
(Continued)

(58) Field of Classification Search
CPC ............... H01L 29/7869; H01L 29/66765; H01L 29/4908; H01L 29/78678
USPC ............................ 438/149, 158; 257/E29.292
See application file for complete search history.

(56) References Cited

U.S. PATENT DOCUMENTS

| | | |
|---|---|---|
| 4,409,134 A | 10/1983 | Yamazaki |
| 5,453,858 A | 9/1995 | Yamazaki |

(Continued)

FOREIGN PATENT DOCUMENTS

| | | |
|---|---|---|
| EP | 0 473 988 | 3/1992 |
| EP | 0729190 A | 8/1996 |

(Continued)

OTHER PUBLICATIONS

Arai. T et al., "41.2: Micro Silicon Technology for Active Matrix OLED Display," SID Digest '07: SID International Symposium Digest of Technical Papers, 2007, vol. XXXVIII, pp. 1370-1373.

(Continued)

*Primary Examiner* — Kimberly Rizkallah
*Assistant Examiner* — Maria Ligai
(74) *Attorney, Agent, or Firm* — Eric J. Robinson; Robinson Intellectual Property Law Office, P.C.

(57) ABSTRACT

After a gate insulating film is formed over a gate electrode, in order to improve the quality of a microcrystalline semiconductor film which is formed in an early stage of deposition, a film near an interface with the gate insulating film is formed under a first deposition condition in which a deposition rate is low but the quality of a film to be formed is high, and then, a film is further deposited under a second deposition condition in which a deposition rate is high. Then, a buffer layer is formed to be in contact with the microcrystalline semiconductor film. Further, plasma treatment with a rare gas such as argon or hydrogen plasma treatment is performed before formation of the film under the first deposition condition for removing adsorbed water on a substrate.

18 Claims, 34 Drawing Sheets

(51) Int. Cl.
*H01L 29/04* (2006.01)
*H01L 29/417* (2006.01)
*H01L 29/49* (2006.01)
*H01L 29/66* (2006.01)
*H01L 21/02* (2006.01)
*H01L 21/67* (2006.01)
*H01L 27/12* (2006.01)

(52) U.S. Cl.
CPC ....... *H01L21/0262* (2013.01); *H01L 21/67207* (2013.01); *H01L 29/04* (2013.01); *H01L 29/41733* (2013.01); *H01L 29/4908* (2013.01); *H01L 29/66765* (2013.01); *H01L 27/1288* (2013.01)

(56) References Cited

U.S. PATENT DOCUMENTS

| | | | |
|---|---|---|---|
| 5,591,987 | A | 1/1997 | Yamazaki et al. |
| 5,648,293 | A | 7/1997 | Hayama et al. |
| 5,648,662 | A | 7/1997 | Zhang et al. |
| 5,677,236 | A | 10/1997 | Saitoh et al. |
| 5,701,167 | A | 12/1997 | Yamazaki |
| 5,766,989 | A | 6/1998 | Maegawa et al. |
| 5,796,116 | A | 8/1998 | Nakata et al. |
| 5,811,328 | A | 9/1998 | Zhang et al. |
| 5,849,601 | A | 12/1998 | Yamazaki |
| 6,023,075 | A | 2/2000 | Yamazaki |
| 6,113,732 | A | 9/2000 | Yoshida et al. |
| 6,124,155 | A | 9/2000 | Zhang et al. |
| 6,166,399 | A | 12/2000 | Zhang et al. |
| 6,252,249 | B1 | 6/2001 | Yamazaki |
| 6,271,062 | B1* | 8/2001 | Nakata et al. ............. 438/151 |
| 6,306,213 | B1 | 10/2001 | Yamazaki |
| 6,335,213 | B1 | 1/2002 | Zhang et al. |
| 6,680,486 | B1* | 1/2004 | Yamazaki ............. 257/66 |
| 6,756,258 | B2 | 6/2004 | Zhang et al. |
| 6,797,548 | B2 | 9/2004 | Zhang et al. |
| 6,847,064 | B2 | 1/2005 | Zhang et al. |
| 7,067,844 | B2 | 6/2006 | Yamazaki |
| 7,098,479 | B1 | 8/2006 | Yamazaki |
| 7,115,902 | B1 | 10/2006 | Yamazaki |
| 7,541,229 | B2 | 6/2009 | Gan et al. |
| 7,776,742 | B2 | 8/2010 | Hasegawa |
| 7,777,231 | B2 | 8/2010 | Gan et al. |
| 2001/0030321 | A1* | 10/2001 | Saito et al. ............. 257/49 |
| 2002/0029818 | A1* | 3/2002 | Murayama et al. ............ 141/65 |
| 2004/0063254 | A1* | 4/2004 | Wang et al. ............. 438/149 |
| 2004/0188685 | A1 | 9/2004 | Lin et al. |
| 2005/0017243 | A1 | 1/2005 | Zhang et al. |
| 2005/0116310 | A1* | 6/2005 | Nishi et al. ............. 257/440 |
| 2006/0024866 | A1* | 2/2006 | Gan et al. ............. 438/149 |
| 2007/0018165 | A1 | 1/2007 | Yamazaki |
| 2007/0298590 | A1* | 12/2007 | Choi et al. ............. 438/478 |
| 2008/0044962 | A1 | 2/2008 | Zhang et al. |
| 2008/0188033 | A1* | 8/2008 | Choi et al. ............. 438/96 |
| 2008/0226823 | A1* | 9/2008 | Hasegawa ............ 427/255.394 |

FOREIGN PATENT DOCUMENTS

| | | |
|---|---|---|
| JP | 60-098680 | 6/1985 |
| JP | 61-087371 | 5/1986 |
| JP | 63-003414 A | 1/1988 |
| JP | 63-215037 A | 9/1988 |
| JP | 04-242724 | 8/1992 |
| JP | 06-045354 | 2/1994 |
| JP | 06-077483 | 3/1994 |
| JP | 07-045833 A | 2/1995 |
| JP | 07-094749 A | 4/1995 |
| JP | 08-088397 A | 4/1996 |
| JP | 08-097436 A | 4/1996 |
| JP | 08-195492 | 7/1996 |
| JP | 09-232235 A | 9/1997 |
| JP | 09-256162 A | 9/1997 |
| JP | 10-144665 A | 5/1998 |
| JP | 11-121761 | 4/1999 |
| JP | 2002-246605 | 8/2002 |
| JP | 2005-049832 | 2/2005 |
| JP | 2005-167051 | 6/2005 |
| JP | 2007-005508 | 1/2007 |
| JP | 2007-035964 | 2/2007 |
| JP | 2007-134730 A | 5/2007 |
| TW | I234288 | 6/2005 |
| WO | WO2005/069358 | 7/2005 |

OTHER PUBLICATIONS

Lee. C et al., "High-Mobility Nanocrystalline Silicon Thin-Film Transistors Fabricated by Plasma-Enhanced Chemical Vapor Deposition," Appl. Phys. Lett. (Applied Physics Letters), May 24, 2005, vol. 86, pp. 22106-1-22106-3.

Lee. C et al., "High-Mobility N-Channel and P-Channel Nanocrystalline Silicon Thin-Film Transistors," IEEE, 2005, pp. 937-940.

Lee. C et al., "Directly Deposited Nanocrystalline Silicon Thin-Film Transistors with Ultra High Mobilities," Appl. Phys. Lett. (Applied Physics Letters), Dec. 18, 2006, vol. 89, pp. 252101-1-252101-3.

Lee. C et al., "How to Achieve High Mobility Thin Film Transistors by Direct Deposition of Silicon Using 13.56 MHz RF PECVD?," IEDM, 2006, pp. 295-298.

Esmaeili-Rad. M et al., "High Stability, Low Leakage Nanocrystalline Silicon Bottom Gate Thin Film Transistors for AMOLED Displays," IEEE, 2006, pp. 303-306.

Lee. H et al., "Leakage Current Mechanisms in Top-Gate Nanocrystalline Silicon Thin-Film Transistors," Appl. Phys. Lett. (Applied Physics Letters), Feb. 28, 2008, vol. 92, pp. 083509-1-083509-3.

Esmaeili-Rad. M et al., "Absence of Defect State Creation in Nanocrystalline Silicon Thin-Film Transistors Deduced from Constant Current Stress Measurements," Appl. Phys. Lett. (Applied Physics Letters), Sep. 12, 2007, vol. 91, pp. 113511-1-113511-3.

Lee. C et al., "Stability of NC—Si:H TFTs with Silicon Nitride Gate Dielectric," IEEE Transactions of Electron Devices, 2007, vol. 54, No. 1, pp. 45-51.

Sazonov. A et al., "Low-Temperature Materials and Thin Film Transistors for Flexible Electronics," Proceedings of the IEEE, Aug. 1, 2005, vol. 93, No. 8, pp. 1420-1428.

Esmaeili-Rad. M et al., "Stability of Nanocrystalline Silicon Bottom-Gate Thin-Film Transistors with Silicon Nitride Gate Dielectric," J. Appl. Phys. (Journal of Applied Physics), Sep. 28, 2007, vol. 102, pp. 064512-1-064512-7.

Lee. C et al., "Top-Gate TFTs Using 13.56 MHz PECVD Microcrystalline Silicon," IEEE Electron Device Letters, Sep. 5, 2005, vol. 26, No. 9, pp. 637-639.

Lee. C et al., "Postdeposition Thermal Annealing and Material Stability of 75° C. Hydrogenated Nanocrystalline Silicon Plasma-Enhanced Chemical Vapor Deposition Films," J. Appl. Phys. (Journal of Applied Physics). Aug. 4, 2005, vol. 98, pp. 034305-1-034305-7.

Lee. C et al., "High-Mobility Nanocrystalline Silicon Thin-Film Transistors Fabricated by Plasma-Enhanced Chemical Vapor Deposition," Appl. Phys. Lett. (Applied Physics Letters), May 24, 2005, vol. 86, pp. 222106-1-222106-3.

Taiwanese Office Action (Application No. 97130077) Dated Dec. 24, 2013.

* cited by examiner

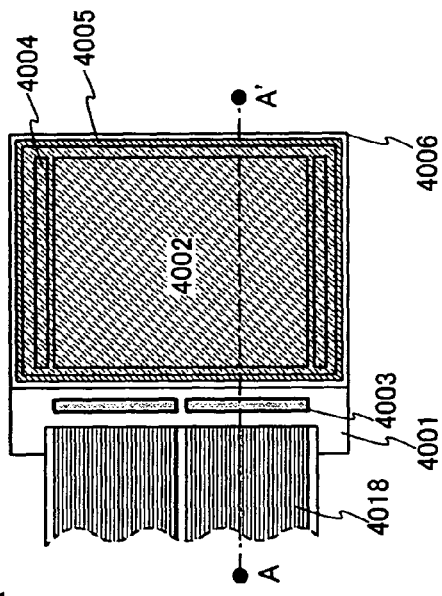
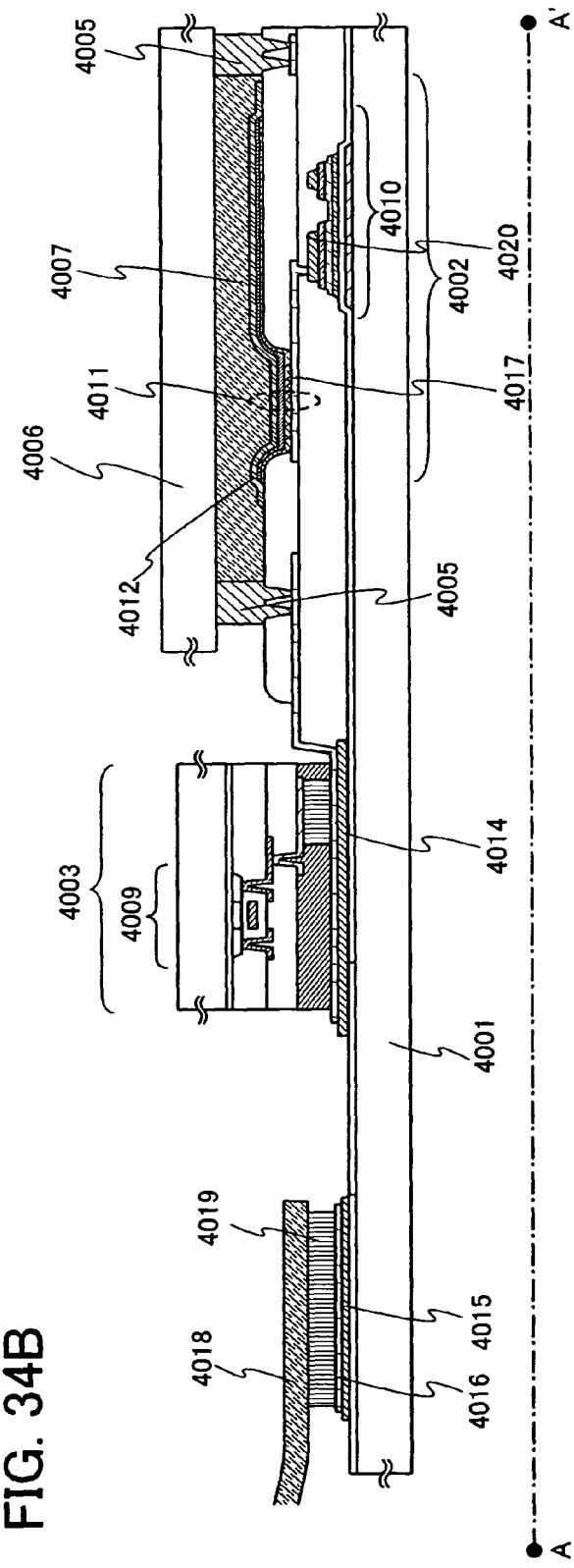
FIG. 34A
FIG. 34B

METHOD FOR MANUFACTURING SEMICONDUCTOR DEVICE

BACKGROUND OF THE INVENTION

1. Field of the Invention

The present invention relates to a semiconductor device including a circuit which is formed using a thin film transistor (hereinafter referred to as a TFT) and a manufacturing method thereof. For example, the present invention relates to an electronic device provided with, as a component, an electro-optical device typified by a liquid crystal display panel or a light-emitting display device having an organic light-emitting element.

Note that in this specification, a semiconductor device refers to all types of devices which can function by utilizing semiconductor characteristics. An electro-optical device, a semiconductor circuit, and an electronic device are all included in the category of the semiconductor device.

2. Description of the Related Art

In recent years, a technique for forming thin film transistors (TFTs) using a semiconductor thin film (the thickness of several nm to several hundred nm) formed over a substrate having an insulating surface has been attracting attention. Thin film transistors have been widely applied to electronic devices such as ICs and electro-optical devices, and their development especially as switching elements in image display devices has been accelerated.

A thin film transistor using an amorphous semiconductor film, a thin film transistor using a polycrystalline semiconductor film, and the like are used as switching elements in image display devices.

In the case of the thin film transistor using an amorphous semiconductor film, an amorphous semiconductor film such as a hydrogenated amorphous silicon film is used; therefore, there is limitation on the process temperature, and heating at a temperature of greater than or equal to 400° C. at which hydrogen is released from the film, intense laser beam irradiation by which surface roughness occurs due to hydrogen in the film, and the like are not performed. The hydrogenated amorphous silicon film is an amorphous silicon film whose electric characteristics are improved by bonding of hydrogen to dangling bonds and disappearance of the dangling bonds as a result.

Further, as a method for forming a polycrystalline semiconductor film such as a polysilicon film, a technique that includes the following steps is known: dehydrogenation treatment for reducing a hydrogen concentration is performed in advance to an amorphous silicon film so that the surface thereof can be prevented from getting rough, a pulsed excimer laser beam is processed into a linear shape by an optical system, and the dehydrogenated amorphous silicon film is scanned and irradiated with the linear laser beam so as to be crystallized.

The thin film transistor using a polycrystalline semiconductor film has advantages in that its mobility is two or more orders of magnitude greater than that of the thin film transistor using an amorphous semiconductor film and a pixel portion of a display device and peripheral driver circuits thereof can be formed over the same substrate. However, the process is more complex because of crystallization of a semiconductor film, compared to the case of using an amorphous semiconductor film; accordingly, there are problems in that the yield is decreased and the cost is increased.

The present applicant has disclosed an FET (field effect transistor) in which a channel formation region is formed of a semiconductor having a mixture of a crystalline structure and a noncrystalline structure in Patent Document 1 (U.S. Pat. No. 5,591,987).

In addition, as switching elements in image display devices, a thin film transistor using a microcrystalline semiconductor film has been used (Patent Document 2: Japanese Published Patent Application No. H4-242724 and Patent Document 3: Japanese Published Patent Application No. 2005-49832).

As a conventional method for manufacturing the above thin film transistor, a technique is known in which an amorphous silicon film is formed over a gate insulating film, a metal film is formed over the amorphous silicon film, and the metal film is irradiated with a diode laser beam so that the amorphous silicon film is changed into a microcrystalline silicon film (Non-Patent Document 1: Toshiaki Arai, et al., SID'07 Digest, 2007, pp. 1370-1373). According to this method, the metal film formed over the amorphous silicon film is to convert light energy of the diode laser beam into thermal energy, and the metal film needs to be removed later for completion of a thin film transistor. That is, this is a method in which the amorphous silicon film is heated only by conduction heating from the metal film to form the microcrystalline silicon film.

SUMMARY OF THE INVENTION

A microcrystalline semiconductor film can be formed by a plasma CVD method, as well as a method in which amorphous silicon is irradiated with a laser beam to form a microcrystalline semiconductor film. In a plasma CVD method, a silane gas is diluted with hydrogen, so that a microcrystalline silicon film can be formed. However, by dilution with hydrogen, that is, by increase in the flow rate of a hydrogen gas, a deposition rate decreases.

A low deposition rate results in a long period of deposition time. Thus, there is a concern that more impurities are contained in the film during formation of the film, and those impurities cause deterioration in electric characteristics of a TFT.

In an inverted staggered TFT structure in which a semiconductor layer is provided over a gate electrode with a gate insulating film interposed therebetween, a semiconductor region which is formed in an early stage of deposition is used as a channel formation region. Accordingly, the higher the quality of the semiconductor region which is formed in the early stage of deposition is, the higher the electric characteristics, e.g., field-effect mobility of a TFT can be.

In addition, if a microcrystalline semiconductor film with a reduced hydrogen concentration is formed to increase a deposition rate, there is a possibility that a region which serves as a channel formation region is almost entirely amorphous.

Furthermore, an inverted staggered TFT which uses a microcrystalline silicon film can have higher field-effect mobility than a TFT which uses an amorphous silicon film, but tends to have higher off current.

The present invention provides a method for forming a microcrystalline semiconductor film with high quality, and a method for forming a microcrystalline semiconductor film by which a period of time required for forming a film with a desired thickness is shortened. Further, the present invention provides a method for manufacturing a semiconductor device with higher field-effect mobility and a lower value of off current than a TFT using an amorphous silicon film, and a method for manufacturing a semiconductor device with higher reliability than a TFT using an amorphous silicon film.

In order to improve the quality of a semiconductor region which is formed in an early stage of deposition, a gate insulating film is formed over a gate electrode, a film near an interface with the gate insulating film is formed under a first deposition condition in which a deposition rate is low but the quality of a film to be formed is high, and then, a film is further deposited under a second deposition condition in which a deposition rate is high.

According to one aspect of the present invention disclosed in this specification, a method for manufacturing a semiconductor device includes the steps of: forming a gate electrode over a substrate having an insulating surface, forming an insulating film over the gate electrode, forming a microcrystalline semiconductor film over the insulating film, and forming a buffer layer to be in contact with the microcrystalline semiconductor film. In formation of the microcrystalline semiconductor film, a deposition condition is changed between steps or continuously so that a deposition rate of a first region near an interface with the buffer layer is higher than that of a second region near an interface with the insulating film. A continuous change in deposition condition means that a level is changed continuously from unit time to unit time. For example, when the average flow rate of a source gas (such as a silane gas) which is introduced to a chamber is increased with time and a relation between the gas flow rate and time is shown by a graph (the graph in which the vertical axis indicates a gas flow rate and the horizontal axis indicates time), the relation is represented by an upward straight line or an upward curve. Alternatively, when the flow rate of a silane gas or the like which is introduced to a chamber is fixed or increased, the average flow rate of the other gas (such as hydrogen or a rare gas) is decreased with time, and a relation between the flow rate of the other gas and time is shown by a graph, the relation is represented by a downward straight line or a downward curve. In addition, a change in deposition condition between steps means that a level is changed discontinuously and variously, that is, introduction of a gas to a chamber and stop of the introduction of a gas are repeated and the flow rate of a gas is increased or decreased at some intervals. Both the change in deposition condition between steps and the continuous change in deposition condition mean that a film is formed over one substrate by changing deposition conditions at least without exposing the substrate to the air.

The first deposition condition in which a deposition rate is low but the quality of a film to be formed is high is set as follows: the ultimate pressure is lowered to be an ultra-high vacuum (UHV) from about $1\times10^{-10}$ Torr to $1\times10^{-7}$ Torr (over $1\times10^{-8}$ Pa and less than or equal to $1\times10^{-5}$ Pa, approximately) so that a residual gas such as oxygen or $H_2O$ in a vacuum chamber (reaction chamber) is reduced in advance before deposition as much as possible, a source gas with high purity is supplied, and substrate temperature in deposition is set at greater than or equal to 100° C. and less than 300° C.

According to another aspect of the present invention disclosed in this specification, a method for manufacturing a semiconductor device includes the steps of: forming a gate electrode over a substrate having an insulating surface; forming an insulating film over the gate electrode; disposing the substrate in a vacuum chamber; forming a first microcrystalline semiconductor film by introducing a source gas to the vacuum chamber under a first deposition condition in which substrate temperature is set at greater than or equal to 100° C. and less than 300° C.; forming a second microcrystalline semiconductor film further in the same vacuum chamber under a second deposition condition in which at least one of substrate temperature, the amount of electric power, timing of application of electric power, the flow rate of a source gas, and a degree of vacuum is different from that under the first deposition condition; and forming a buffer layer over the second microcrystalline semiconductor film.

In the first microcrystalline semiconductor film which is obtained under the first deposition condition, an oxygen concentration is less than or equal to $1\times10^{17}$ atoms/cm$^3$. Oxygen inhibits crystallization when the microcrystalline semiconductor film is formed and could possibly serve as a donor when being introduced to a silicon film, and thus should be particularly reduced. The quality of the microcrystalline semiconductor film which is obtained under the first deposition condition contributes to increase in on current and improvement in field-effect mobility of a TFT which is formed later.

In addition, preferably, before formation of the microcrystalline semiconductor film, the vacuum chamber is baked at greater than or equal to 200° C. and less than or equal to 300° C., a residual gas containing moisture in the vacuum chamber as a main component is removed, and the vacuum chamber is set in a pressure environment with a degree of vacuum of an ultra-high vacuum (UHV) in advance. Further, the inner wall of the vacuum chamber is heated at greater than or equal to 50° C. and less than or equal to 300° C. also during formation of the microcrystalline semiconductor film so that a deposition reaction is accelerated.

The second deposition condition may be a condition in which at least a deposition rate that is higher than that of the first deposition condition can be obtained. For example, a flow rate ratio of a silane gas and a hydrogen gas is made different from that under the first deposition condition, and a hydrogen concentration in the chamber is decreased in such a range that a microcrystalline silicon film can be formed. Also, under the second deposition condition, substrate temperature may be higher than that under the first deposition condition, e.g., greater than or equal to 300° C. and less than 400° C., so that a deposition rate may be increased. When the substrate temperature is made to be different between the first deposition condition and the second deposition condition, the temperature is increased from the substrate temperature under the first deposition condition to the substrate temperature under the second deposition condition right after deposition under the first deposition condition, and the film is formed continuously also when the substrate temperature is being increased. Further, under the second deposition condition, the amount of electric power in generation of plasma may be increased compared to that under the first deposition condition, so that a deposition rate may be increased. Furthermore, an exhaust valve such as a conductance valve of the vacuum chamber may be adjusted, so that a degree of vacuum under the second deposition condition may be made different from that under the first deposition condition and a deposition rate may be increased.

In addition, under the second deposition condition in which a deposition rate is higher than that under the first deposition condition, high-frequency power is applied for a certain period of time, a silane gas is decomposed by plasma, application of high-frequency power is stopped for a certain period of time, and generation of plasma is stopped; such a sequence may be repeated. Under the first deposition condition, continuous discharge is performed in a first deposition period. On the other hand, under the second deposition condition, by varying timing of application of electric power, that is, by a method in which a plurality of periods where discharge is stopped is provided by turning off high-frequency power in a second deposition period of one substrate, a deposition rate is made higher than that under the first deposition condition. Note that deposition time of the microcrystalline semiconductor film includes the first deposition period in which a film is formed under the first deposition condition and the second deposition period in which a film is formed under the second deposition condition. A deposition rate in the second deposition period is higher than that in the first deposition period. A method for forming a film in which discharge time and discharge-stop time are selected as appropriate is also called an intermittent discharge plasma CVD method. In this case, a microcrystalline silicon film is formed under the first deposition condition by a continuous discharge plasma CVD method in which a source gas is affected continuously by discharge of high-frequency power, and a microcrystalline silicon film is further formed in the same chamber under the second deposition condition by an intermittent discharge (also referred to as pulsed) plasma CVD method in which a source gas is affected intermittently by discharge of high-frequency power. Here, the continuous discharge means discharge which is caused by high-frequency power with a temporally continuous wave.

Moreover, under the second deposition condition in which a deposition rate is made higher than that under the first deposition condition, the inner wall of a vacuum chamber in which a microcrystalline semiconductor film is formed may be heated to have a temperature that is higher than the substrate temperature to form a microcrystalline semiconductor film. If the substrate temperature is 100° C. under the first deposition condition, by setting the temperature of the inner wall of the vacuum chamber at 150° C., a microcrystalline semiconductor film can be formed efficiently over the surface of the substrate that has a lower temperature than that of the inner wall of the vacuum chamber.

After the vacuum chamber is evacuated to have an atmosphere with a degree of vacuum of over $1\times10^{-8}$ Pa and less than or equal to $1\times10^{-5}$ Pa, preferably, a hydrogen gas or a rare gas is introduced in advance to the vacuum chamber to generate plasma before disposing the substrate in the vacuum chamber, a residual gas containing moisture in the vacuum chamber as a main component is thus removed, and an environment in which a concentration of residual oxygen in the vacuum chamber is reduced is made.

In addition, after the vacuum chamber is evacuated to have an atmosphere with a degree of vacuum of over $1\times10^{-8}$ Pa and less than or equal to $1\times10^{-5}$ Pa, preferably, a silane gas is introduced in advance to the vacuum chamber before disposing the substrate in the vacuum chamber, so that the silane gas reacts with residual oxygen in the vacuum chamber and is changed into silicon oxide, and oxygen in the vacuum chamber is further reduced. Also, in order to prevent a metal element such as aluminum from being mixed into the microcrystalline semiconductor film being formed, treatment may be performed in advance in which a silane gas is introduced to the vacuum chamber before disposing the substrate in the vacuum chamber, plasma is generated, and the inner wall of the vacuum chamber is covered with a film (also referred to as pre-coating treatment).

A deposition rate is low under the first deposition condition; thus, when a thickness of a film is large in particular, deposition time gets long and impurities such as oxygen is easily mixed into the film. Therefore, when oxygen and moisture in the vacuum chamber is reduced sufficiently before disposing the substrate in the vacuum chamber, impurities such as oxygen are scarcely mixed into the film even with long deposition time, which is important for improving the quality of a microcrystalline silicon film which is formed later.

Further, after disposing the substrate in the vacuum chamber, plasma treatment with a rare gas such as argon or hydrogen plasma treatment may be performed in advance for removing adsorbed water on the substrate before formation of the microcrystalline silicon film, so that an oxygen concentration in the microcrystalline silicon film is reduced to be less than or equal to $1\times10^{17}$ atoms/cm$^3$.

As described above, it is also important to reduce oxygen and moisture of the substrate sufficiently after disposing the substrate in the vacuum chamber, because the quality of the microcrystalline silicon film which is formed later is improved.

By changing a deposition condition from the first deposition condition in an early stage of deposition (a first deposition period) to the second deposition condition in a late stage of deposition (a second deposition period) with a high deposition rate, since microcrystals are formed in the early stage of deposition, a microcrystalline silicon film with high quality can be deposited in the late stage of deposition using the microcrystals formed in the early stage of deposition as nuclei. In addition, by forming the microcrystals in advance in the early stage of deposition, a deposition rate in the late stage of deposition can be increased.

By formation of a film under the second deposition condition using the same chamber continuously after formation of a film under the first deposition condition, time for obtaining a film with a desired thickness can be shortened, compared to the case where a film with a desired thickness is formed only with the first deposition condition without changing the deposition condition. If time for obtaining a film with a desired thickness can be shortened, the microcrystalline silicon film can be formed with almost no impurities such as oxygen being mixed therein. In addition, when the microcrystalline silicon film is formed thinly only with the first deposition condition without changing the deposition condition, influence of the buffer layer that is stacked later is increased, and field-effect mobility of a thin film transistor could possibly be lowered.

Since the microcrystalline silicon film which is obtained under the first deposition condition is sensitive to oxygen, the microcrystalline silicon film is further formed by changing the deposition condition to the second deposition condition with a high deposition rate during formation of the film, so that a microcrystalline silicon film near an interface with the gate insulating film can be protected. The quality of the microcrystalline silicon film which is obtained under the second deposition condition contributes to reduction in off current of a TFT which is formed later.

The microcrystalline silicon film which is obtained by varying the deposition condition in two steps includes at least column-like crystals and an oxygen concentration in the film is less than or equal to $1\times10^{17}$ atoms/cm$^3$. The total thickness of the microcrystalline silicon film which is obtained by varying the deposition condition in two steps is in the range from 5 nm to 100 nm, preferably, 10 nm to 30 nm.

As long as the deposition condition in the early stage is a condition in which a microcrystalline silicon film with high quality is formed, the present invention is not limited to formation of a microcrystalline silicon film by varying a deposition condition in two steps, and a microcrystalline silicon film can be formed by varying a deposition condition in three or more steps. Further, the deposition condition can be changed continuously.

The above microcrystalline silicon film is more sensitive to oxygen than an amorphous silicon film, and thus, it is preferably protected by stacking a buffer layer which does not include crystal grains thereover, without exposure to the air. The buffer layer is formed in a vacuum chamber which is different from the one used for forming a microcrystalline silicon film, with a substrate temperature that is higher than that under the first and second deposition conditions, for example, greater than or equal to 300° C. and less than 400° C. It is effective that substrate temperature in formation of the buffer layer is higher than that under the first and second deposition conditions. This is because the microcrystalline silicon film can be annealed in formation of the buffer layer, resulting in no increase in the number of manufacturing steps, and the quality of the microcrystalline silicon film can be improved. By annealing of the microcrystalline silicon film in formation of the buffer layer, variation in TFT characteristics (such as variation in threshold voltage) in a reliability test in which voltage application is repeatedly performed can be suppressed, and reliability of the TFT can be improved. The buffer layer is formed with a thickness of 100 nm to 400 nm, inclusive, preferably, 200 nm to 300 nm, inclusive. In addition, the buffer layer is formed with an amorphous silicon film with higher defect density than the microcrystalline silicon film. By use of the amorphous silicon film with higher defect density for the buffer layer, off current of a TFT which is formed later can be reduced.

The microcrystalline silicon film tends to have n-type conductivity by mixture of impurities; therefore, it is preferable that the deposition condition be adjusted. For example, a very small amount of a trimethyl boron gas or the like is added to the source gas, so that the microcrystalline silicon film is i-type. By addition of a very small amount of a trimethyl boron gas or the like to the source gas which includes mainly a silane gas and a hydrogen gas, threshold voltage of a thin film transistor can be controlled.

In this specification, the microcrystalline semiconductor film is a film which contains a semiconductor having an intermediate structure between amorphous and crystalline structures (including a single crystal and a polycrystal). This semiconductor is a semiconductor which has a third state that is stable in terms of free energy, and is a crystalline semiconductor which has short-range order and lattice distortion, and column-like or needle-like crystals with a grain size of 0.5 nm to 20 nm grown in the direction of a normal line with respect to the surface of the substrate. In addition, a microcrystalline semiconductor and a non-single crystalline semiconductor are mixed. Microcrystalline silicon, which is a typical example of a microcrystalline semiconductor, has a Raman spectrum which is shifted to a lower wave number side than 520.5 cm$^{-1}$ that is a feature of single crystalline silicon. That is, the peak of a Raman spectrum of microcrystalline silicon is within the range from 480 cm$^{-1}$ (that is a feature of amorphous silicon) to 520.5 cm$^{-1}$ (that is a feature of single crystalline silicon). In addition, microcrystalline silicon is made to contain hydrogen or halogen of at least greater than or equal to 1 at. % for termination of dangling bonds. Moreover, microcrystalline silicon is made to contain a rare gas element such as helium, argon, krypton, or neon to further enhance its lattice distortion, whereby stability is increased and a favorable microcrystalline semiconductor film can be obtained. Such a microcrystalline semiconductor film is disclosed in, for example, U.S. Pat. No. 4,409,134.

The buffer layer may also be formed in the same vacuum chamber as that for forming the microcrystalline silicon film, although throughput is lowered when a plurality of substrates is treated. When the buffer layer is formed successively after formation of the microcrystalline silicon film in the same vacuum chamber, an interface between the layers can be formed without being contaminated with contaminating impurity elements, which is caused when the substrate is transferred; thus, variation in characteristics of the thin film transistor can be reduced.

In addition, a source electrode and a drain electrode are formed over the buffer layer, and a groove is formed in the buffer layer in order to decrease leakage current between the source electrode and the drain electrode.

A semiconductor film containing an n-type impurity element (n$^+$ layer) is provided between the buffer layer and the source and drain electrodes. The buffer layer is provided between the n$^+$ layer and the microcrystalline silicon film so as to prevent contact therebetween. Therefore, the n$^+$ layer, the buffer layer, and the microcrystalline silicon film are stacked below the source electrode. In a similar manner, the n$^+$ layer, the buffer layer, and the microcrystalline silicon film are stacked below the drain electrode. With such a layered structure and a large thickness of the buffer layer, withstand voltage of the thin film transistor can be improved. Further, with a large thickness of the buffer layer, a groove can be formed in a part of the buffer layer without exposing the microcrystalline silicon film which is easily oxidized.

After the above manufacturing process, a semiconductor film containing an n-type impurity element is formed over the buffer layer, source and drain electrodes are formed over the semiconductor film containing the n-type impurity element, the semiconductor film containing the n-type impurity element is etched to form source and drain regions, a part of the buffer layer is etched and removed such that a region overlapping with the source and drain regions is left remaining, so that a thin film transistor is manufactured.

In the thin film transistor which is obtained as described above, when it is turned on, a region near an interface with the gate insulating film in the microcrystalline silicon film with high quality which is formed under the first deposition condition serves as a channel formation region. When the thin film transistor is turned off, a groove which is obtained by etching a part of the buffer layer serves as a path where a very small amount of leakage current flows. Accordingly, compared to a conventional thin film transistor including a single amorphous silicon layer or a conventional thin film transistor including a single microcrystalline silicon layer, a ratio of off current and on current can be increased and switching characteristics are favorable, which lead to improvement in contrast of a display panel.

In accordance with a manufacturing method of the present invention, field-effect mobility of a thin film transistor obtained can be greater than 1 and less than or equal to 50. Therefore, a thin film transistor using the microcrystalline semiconductor film which is obtained according to the manufacturing method of the present invention has current-voltage characteristics represented by a curve with a steep slope in a rising portion, has an excellent response as a switching element, and can be operated at high speed.

A light-emitting device using the thin film transistor which is obtained according to the manufacturing method of the present invention can suppress variation in threshold voltage of thin film transistors, which leads to improvement in reliability.

In addition, a liquid crystal display device using the thin film transistor which is obtained according to the manufacturing method of the present invention can increase field-effect mobility and thus can increase a driving frequency of a driver circuit. The driver circuit can be operated at high speed, so that a frame frequency can be quadruplicated or black frame insertion can be realized

BRIEF DESCRIPTION OF THE DRAWINGS

FIG. 34A is a top view and FIG. 34B is a cross-sectional view illustrating a display panel.

DETAILED DESCRIPTION OF THE INVENTION

Embodiment modes of the present invention will be described below. Note that the present invention can be implemented in various modes, and it is easily understood by those skilled in the art that modes and details thereof can be modified in various ways without departing from the spirit and the scope of the present invention. Therefore, the present invention should not be interpreted as being limited to the following description of the embodiment modes.

(Embodiment Mode 1)

Figure 4:
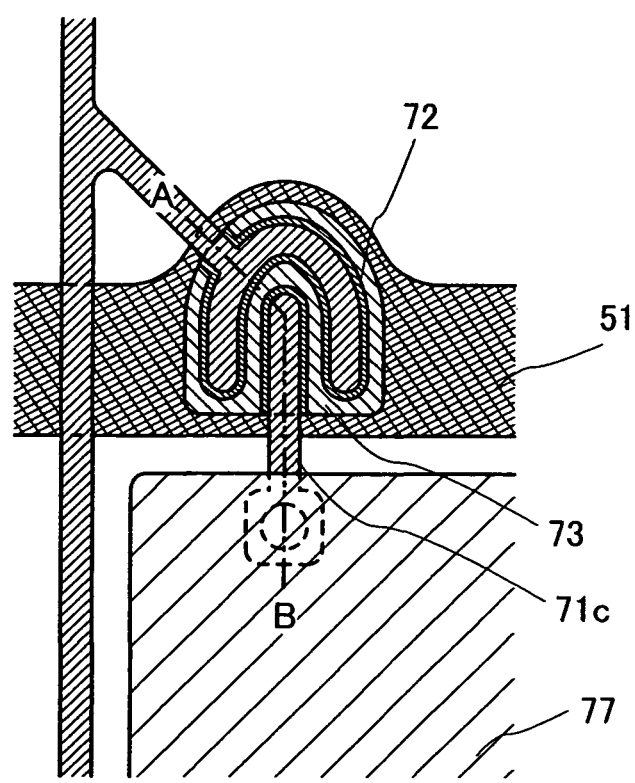
FIG. 4 is a top view illustrating a manufacturing method of the present invention.
Figure 5:
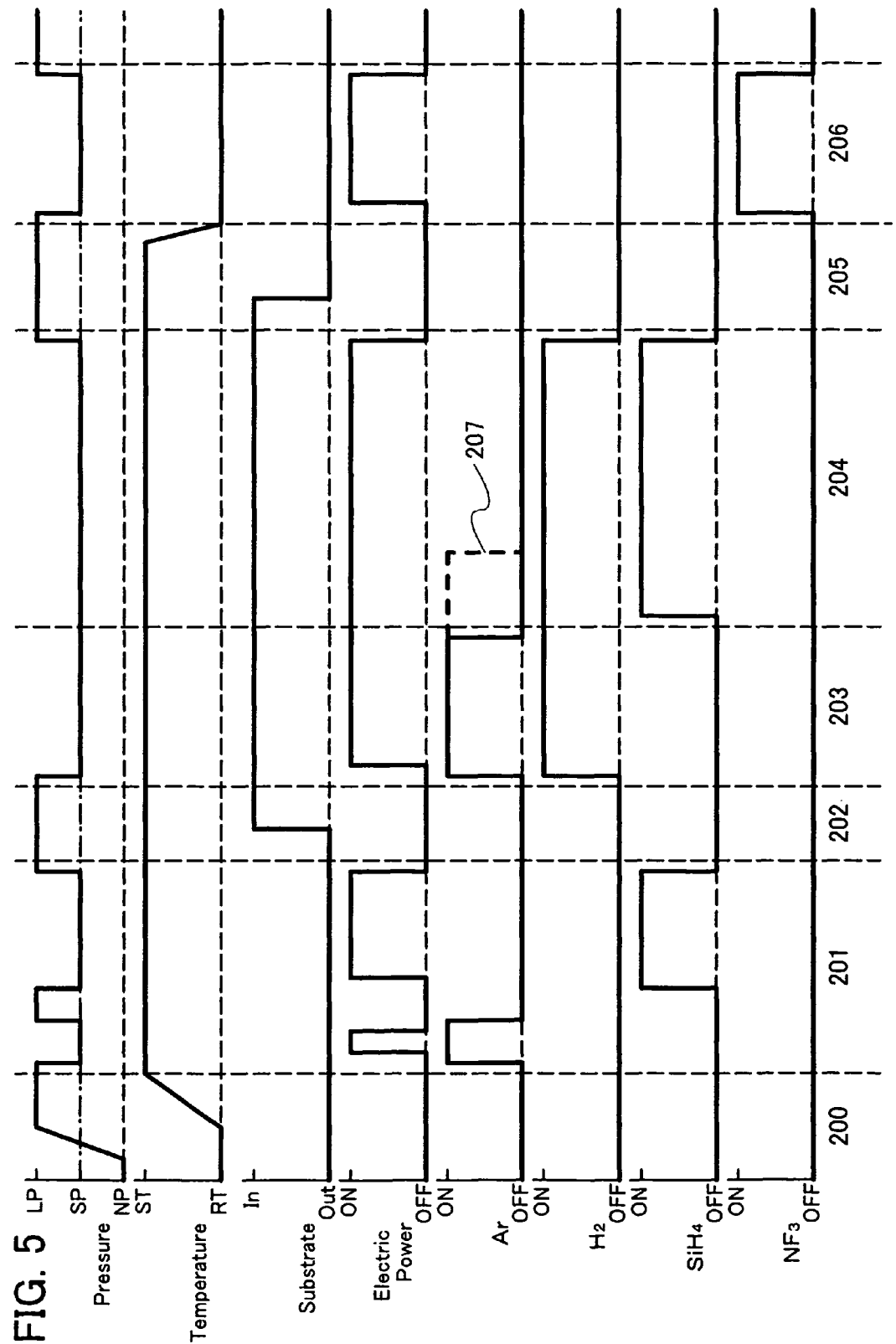
FIG. 5 is a diagram illustrating one example of a timing chart of a process for forming a microcrystalline silicon film.

In this embodiment mode, a manufacturing process of a thin film transistor used for a liquid crystal display device will be described with reference to FIGS. 1A to 1D, FIGS. 2A to 2D, FIGS. 3A to 3C, FIG. 4, and FIG. 5. FIGS. 1A to 1D, FIGS. 2A to 2D, and FIGS. 3A to 3C are cross-sectional views showing a manufacturing process of a thin film transistor, and FIG. 4 is a top view showing a connection region of a thin film transistor and a pixel electrode in a single pixel. Further, FIG. 5 is a timing chart showing a formation method of a microcrystalline silicon film.

An n-channel thin film transistor having a microcrystalline semiconductor film is more suitable for use in a driver circuit than a p-channel thin film transistor having a microcrystalline semiconductor film, because the n-channel one has higher mobility. It is desired that all thin film transistors formed over the same substrate have the same polarity, in order to reduce the number of manufacturing steps. Here, description is made using an n-channel thin film transistor.

Figure 1A:
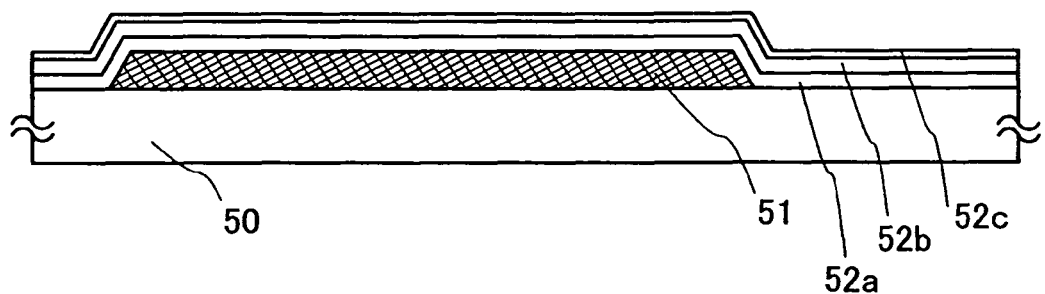
FIGS. 1A to 1D are cross-sectional views illustrating a manufacturing method of the present invention.

As illustrated in FIG. 1A, a gate electrode 51 is formed over a substrate 50. As the substrate 50, any of the following substrates can be used: non-alkaline glass substrates made of barium borosilicate glass, aluminoborosilicate glass, aluminosilicate glass, and the like by a fusion method or a float method. When the substrate 50 is mother glass, the substrate may have any of the following sizes: the first generation (320 mm×400 mm), the second generation (400 mm×500 mm), the third generation (550 mm×650 mm), the fourth generation (680 mm×880 mm or 730 mm×920 mm), the fifth generation (1000 mm×1200 mm or 1100 mm×1250 mm), the sixth generation (1500 mm×1800 mm), the seventh generation (1900 mm×2200 mm), the eighth generation (2160 mm×2460 mm), the ninth generation (2400 mm×2800 mm or 2450 mm×3050 mm), the tenth generation (2950 mm×3400 mm), and the like.

The gate electrode 51 is formed using a metal material such as titanium, molybdenum, chromium, tantalum, tungsten, or aluminum, or an alloy material thereof. The gate electrode 51 can be formed in such a manner that a conductive film is formed over the substrate 50 by a sputtering method or a vacuum evaporation method; a mask is formed over the conductive film by a photolithography technique or an ink-jet method; and the conductive film is etched using the mask. Alternatively, the gate electrode 51 can be formed by discharging a conductive nanopaste of silver, gold, copper, or the like using an ink-jet method, and then baking the nanopaste. Note that, as a barrier metal which improves adhesion of the gate electrode 51 and prevents diffusion of impurities to a base, a nitride film of the above-mentioned metal material may be provided between the substrate 50 and the gate electrode 51. Here, the gate electrode 51 is formed by etching of the conductive film formed over the substrate 50 with use of a resist mask formed using a first photomask.

As a specific example of a gate electrode structure, a molybdenum film may be stacked over an aluminum film to have a structure that prevents hillock and electromigration that are typical phenomena of aluminum. Alternatively, the gate electrode may have a three-layer structure in which an aluminum film is sandwiched between molybdenum films. As other examples of the gate electrode structure, a layered structure in which a molybdenum film is stacked over a copper film, a layered structure in which a titanium nitride film is stacked over a copper film, and a layered structure in which a tantalum nitride film is stacked over a copper film, can be given.

Note that, because a semiconductor film and a wiring are to be formed over the gate electrode 51, it is desired that the gate electrode be processed so as to have tapered end portions in order to prevent disconnection. In addition, although not shown, in this step, a wiring connected to the gate electrode can also be formed at the same time.

Next, gate insulating films 52a, 52b, and 52c are formed in this order over the gate electrode 51. A cross-sectional view up through this step is shown in FIG. 1A.

Each of the gate insulating films 52a, 52b, and 52c can be formed of a silicon oxide film, a silicon nitride film, a silicon oxynitride film, or a silicon nitride oxide film, by a CVD method, a sputtering method, or the like. In order to prevent an interlayer short circuit caused by a pinhole or the like formed in the gate insulating films, it is preferable to form plural layers using different insulating layers. Here, a mode is described in which a silicon nitride film, a silicon oxynitride film, and a silicon nitride film are stacked in this order as the gate insulating films 52a, 52b, and 52c, respectively.

Note that a silicon oxynitride film is a film that contains more oxygen than nitrogen, and includes oxygen, nitrogen, silicon, and hydrogen at concentrations ranging from 55 at. % to 65 at. %, 1 at. % to 20 at. %, 25 at. % to 35 at. %, and 0.1 at. % to 10 at. %, respectively. Further, a silicon nitride oxide film is a film that contains more nitrogen than oxygen, and includes oxygen, nitrogen, silicon, and hydrogen at concentrations ranging from 15 at. % to 30 at. %, 20 at. % to 35 at. %, 25 at. % to 35 at. %, and 15 at. % to 25 at. %, respectively.

A film thickness of each of a first layer and a second layer of the gate insulating films is to be thicker than 50 nm. The first layer of the gate insulating films is preferably a silicon nitride film or a silicon nitride oxide film, in order to prevent diffusion of an impurity (such as an alkali metal) from the substrate. Further, the first layer of the gate insulating films can prevent oxidation of the gate electrode and can also prevent hillock in the case of using aluminum for the gate electrode. A third layer of the gate insulating films that comes into contact with a microcrystalline semiconductor film is to have a thickness that is greater than 0 nm and less than or equal to 5 nm, desirably about 1 nm. The third layer of the gate insulating films is provided to improve adhesion with the microcrystalline semiconductor film. Furthermore, by providing a silicon nitride film as the third layer of the gate insulating films, oxidation of the microcrystalline semiconductor film by heat treatment or laser irradiation that is later performed can be prevented. For example, when an insulating film containing a high amount of oxygen is in contact with a microcrystalline semiconductor film and heat treatment is performed, there is a possibility of the microcrystalline film becoming oxidized.

Further, it is preferable that the gate insulating films be formed by using a microwave plasma CVD apparatus with a frequency of greater than or equal to 1 GHz. A silicon oxynitride film and a silicon nitride oxide film formed with a microwave plasma CVD apparatus have high withstand voltage, and can improve reliability of a thin film transistor.

Although here, the gate insulating films employ a three-layer structure, a single layer of a silicon nitride film may be used in the case where a thin film transistor is used for a switching element of a liquid crystal display device, in which AC driving is performed.

After forming the gate insulating films, the substrate is transferred without exposure to air, and a microcrystalline semiconductor film 53 is preferably formed in a vacuum chamber that is different from a vacuum chamber for forming the gate insulating films.

A procedure for forming the microcrystalline semiconductor film 53 is described below also with reference to FIG. 5. FIG. 5 shows the procedure starting from a step where vacuum evacuation 200 is performed in the reaction chamber that is under atmospheric pressure. Then, the following treatments are shown in chronological order: precoating 201, substrate installation 202, base pretreatment 203, deposition treatment 204, substrate removal 205, and cleaning 206. Note that the procedure is not limited to performing vacuum evacuation starting from atmospheric pressure, and it is preferable to maintain the reaction chamber under a certain degree of vacuum at all times in terms of mass production as well as in terms of reducing the ultimate degree of vacuum in a short time.

In this embodiment mode, ultra-high vacuum evacuation is performed in order to achieve a higher degree of vacuum than $10^{-5}$ Pa in the vacuum chamber before substrate installation. This step corresponds to vacuum evacuation 200 in FIG. 5. In the case of performing such ultra-high vacuum evacuation, it is preferable to use a turbo-molecular pump and a cryopump. Evacuation is performed with the turbo-molecular pump, and vacuum evacuation is performed with the cryopump. It is also effective to perform vacuum evacuation by connecting two turbo-molecular pumps in series. Further, it is preferable to perform heat treatment by providing a heater for baking in the reaction chamber and perform a treatment of degassing from the inner wall of the reaction chamber. In addition, a heater for heating the substrate is also operated to stabilize temperature. A heating temperature of the substrate is 100° C. to 300° C., inclusive, preferably 120° C. to 220° C., inclusive.

Next, precoating 201 is performed before substrate installation, and a silicon film is formed as an inner wall coating film. In precoating 201, after removing a gas (an atmospheric component such as oxygen and nitrogen or an etching gas used in cleaning the reaction chamber) that is attached to the inner wall of the reaction chamber by generating plasma by introducing hydrogen or a rare gas, a silane gas is introduced to generate plasma. Since a silane gas reacts with oxygen, moisture, and the like, by introducing a silane gas and generating silane plasma, oxygen and moisture in the reaction chamber can be removed. Further, by performing precoating 201, a metal element of a member constituting the reaction chamber can be prevented from entering the microcrystalline silicon film as an impurity. In other words, by covering the inside of the reaction chamber with silicon, the inside of the reaction chamber can be prevented from being etched by plasma, and the impurity concentration of the microcrystalline silicon film formed later can be reduced. Precoating 201 includes treatment in which the inner wall of the reaction chamber is covered with a film that is of the same kind as a film to be deposited over the substrate.

After precoating 201, substrate installation 202 is performed. The substrate over which the microcrystalline silicon film is to be deposited is kept in a load chamber that is vacuum evacuated; therefore, a degree of vacuum in the reaction chamber is not degraded much even if the substrate is installed.

Next, base pretreatment 203 is performed. It is preferable that base pretreatment 203 be performed since it is treatment that is particularly effective in the case of forming a microcrystalline silicon film. In the case of forming a microcrystalline silicon film over a glass substrate surface, an insulating film surface, or an amorphous silicon surface by a plasma CVD method, there is a possibility that an amorphous layer may be formed in an initial stage of deposition due to an impurity or lattice mismatch. In order to reduce the thickness of this amorphous layer as much as possible, or to get rid of it if possible, it is preferable to perform base pretreatment 203. As base pretreatment 203, rare gas plasma treatment, hydrogen plasma treatment, or a combination of both is preferably performed. For the rare gas plasma treatment, it is preferable that a rare gas element with a large mass number such as argon, krypton, or xenon be used. This is so that an impurity such as oxygen, moisture, an organic substance, or a metal element that is attached to the surface is removed by a sputtering effect. The hydrogen plasma treatment is effective in that by hydrogen radicals, the above impurity that is adsorbed to the surface is removed, and a clean film surface is formed by an etching effect with respect to the insulating film or the amorphous silicon film. Further, by performing both the rare gas plasma treatment and the hydrogen plasma treatment, an effect of promoting growth of microcrystal nuclei can be expected.

In terms of promoting growth of microcrystal nuclei, it is effective to supply a rare gas such as argon continuously in the initial stage of forming the microcrystalline silicon film, as shown by a broken line 207 in FIG. 5.

Next, deposition treatment 204 for forming the microcrystalline silicon film is performed after base pretreatment 203. In this embodiment mode, a microcrystalline silicon film near an interface with the gate insulating film is formed under a first deposition condition in which a deposition rate is low but the quality of a film to be formed is high, and then a microcrystalline silicon film is deposited further under a second deposition condition in which a deposition rate is high.

There are no particular limitations as long as the deposition rate of the second deposition condition is higher than that under the first deposition condition. Therefore, a microcrystalline silicon film can be formed by a high frequency plasma CVD method with a frequency of several tens of MHz to several hundred MHz or using a microwave plasma CVD apparatus with a frequency of greater than or equal to 1 GHz. Typically, the microcrystalline silicon film can be formed by generating plasma by diluting a silicon hydride such as $SiH_4$ or $Si_2H_6$ with hydrogen. Further, in addition to silicon hydride and hydrogen, one kind or plural kinds of rare gas elements selected from helium, argon, krypton, and neon can be used for dilution to form the microcrystalline semiconductor film. The flow ratio of hydrogen to silicon hydride in these cases is 12:1 to 1000:1, preferably 50:1 to 200:1, and more preferably 100:1. Note that instead of silicon hydride, $SiH_2Cl_2$, $SiHCl_3$, $SiCl_4$, $SiF_4$, or the like can be used.

Further, in the case of adding helium to a source gas, since helium has an ionization energy of 24.5 eV that is the largest among all gases, and has a metastable state in the level of about 20 eV that is a little lower than the ionization energy, only the difference of about 4 eV is necessary for ionization while keeping discharge. Therefore, the discharge starting voltage also shows the lowest value among all gases. Because of such characteristics, helium can maintain plasma with stability. Further, since helium can form uniform plasma, even if an area of a substrate over which a microcrystalline silicon film is deposited is large, helium has an effect of making plasma density uniform.

Further, an energy band width may be adjusted to 1.5 eV to 2.4 eV or 0.9 eV to 1.1 eV by mixing a hydride of carbon such as $CH_4$ or $C_2H_6$, a germanium hydride such as $GeH_4$ or $GeF_4$, or a germanium fluoride into a gas such as silane. By adding carbon or germanium to silicon, the temperature characteristic of a TFT can be changed.

Here, under the first deposition condition, silane is diluted greater than 100 times and less than or equal to 2000 times with hydrogen and/or a rare gas, and a heating temperature of the substrate is greater than or equal to 100° C. and less than 300° C., preferably 120° C. to 220° C., inclusive. In order to promote growth of microcrystalline silicon, a film is preferably formed at 120° C. to 220° C., inclusive.

Figure 1B:
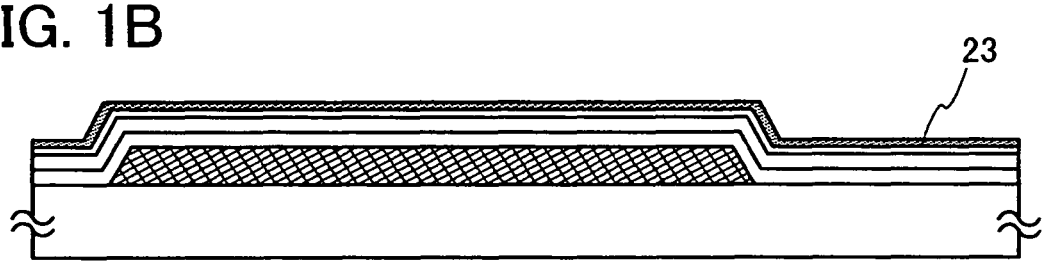

A cross-sectional view up through the step under the first deposition condition is shown in FIG. 1B. Over the gate insulating film 52c, a microcrystalline silicon film 23 is formed, which is formed at a low deposition rate but has high quality. The quality of this microcrystalline semiconductor film 23 obtained under the first deposition condition contributes to increasing the on-current and improving the field-effect mobility of a TFT that is formed later; therefore, it is important to sufficiently reduce an oxygen concentration in the film to an oxygen concentration of less than or equal to $1\times10^{17}$ atoms/cm$^3$. Further, by the above procedure, not only the concentration of oxygen that mixes into the microcrystalline semiconductor film is reduced, but those of nitrogen and carbon can also be reduced; therefore, the microcrystalline semiconductor film becoming an n-type can be prevented.

Figure 1C:
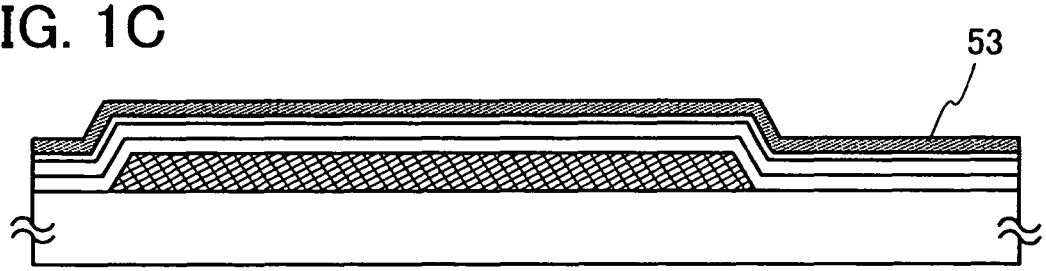

Next, a deposition rate is increased from that under the first deposition condition to that under the second deposition condition, to form a microcrystalline semiconductor film 53. A cross-sectional view of this stage is shown in FIG. 1C. The film thickness of the microcrystalline semiconductor film 53 may be 50 nm to 500 nm (preferably 100 nm to 250 nm). Note that in this embodiment mode, deposition time of the microcrystalline semiconductor film 53 includes a first deposition period in which deposition is performed under the first deposition condition, and a second deposition period in which deposition is performed under the second deposition condition. Note that although a film formed under the first deposition condition can be called a first microcrystalline semiconductor film and a film formed under the second deposition condition can be called a second microcrystalline semiconductor film, it is difficult to identify a clear interface between the first microcrystalline semiconductor film and the second microcrystalline semiconductor film after deposition. Accordingly, here, a stacked layer film obtained by changing the condition during deposition is referred to as a microcrystalline semiconductor film.

In this embodiment mode, under the second deposition condition, silane is diluted 12 times to 100 times with hydrogen and/or a rare gas, and a heating temperature of the substrate is greater than or equal to 100° C. and less than 400° C., preferably 120° C. to 220° C., inclusive. Note that a deposition rate is 3.05 nm/min in the case of forming a microcrystalline silicon film under the following condition: a capacitively coupled (parallel plate) plasma CVD apparatus is used, a gap (a distance between an electrode surface and a substrate surface) is 20 nm, a degree of vacuum in the reaction chamber is 100 Pa, substrate temperature is 300° C., 20 W of high-frequency power with a frequency of 60 MHz is applied, and a silane gas (the flow rate of 8 sccm) is diluted 50 times with hydrogen (the flow rate of 400 sccm). The Raman intensity ratio (Ic/Ia) of the microcrystalline silicon film which is obtained under this deposition condition is 3.52. In addition, when only the flow rate of a silane gas is changed to 4 sccm and diluted 100 times under the above deposition condition, a deposition rate for forming a microcrystalline silicon film is 1.53 nm/min. In this manner, according to the experiment results, it is confirmed that a deposition rate is increased by fixing the flow rate of hydrogen and increasing the flow rate of silane. The Raman intensity ratio (Ic/Ia) of the microcrystalline silicon film which is obtained by dilution of silane 100 times is 6.19. According to the experiment results, it is confirmed that crystallinity of a microcrystalline silicon film formed under the deposition condition with a low deposition rate tends to be high, compared to the deposition condition with a high deposition rate.

In addition, when a microcrystalline silicon film is formed under the above condition in which the deposition rate of 1.53 nm/min is obtained, with just the substrate temperature changed to 200° C., a deposition rate of 1.286 nm/min can be obtained. That is, with the substrate temperature lowered, a deposition rate of the microcrystalline silicon film is slightly lowered. The microcrystalline silicon film is formed in a greatly different way from an amorphous silicon film. For example, in formation of the amorphous silicon film, a deposition rate tends to be increased when the substrate temperature is lowered. In addition, it is confirmed that when the substrate temperature is set at 200° C. under the deposition condition of the microcrystalline silicon film, by fixing the flow rate of hydrogen and increasing the flow rate of silane, a deposition rate tends to increase.

In this embodiment mode, a capacitively coupled (parallel plate) plasma CVD apparatus is used, a gap (a distance between an electrode surface and a substrate surface) is set at 20 nm, and a microcrystalline silicon film is formed under the first deposition condition and the second deposition condition. Under the first deposition condition, a degree of vacuum in the reaction chamber is 100 Pa, substrate temperature is 100° C., 30 W of high-frequency power with a frequency of 60 MHz is applied, and a silane gas (the flow rate of 2 sccm) is diluted 200 times with hydrogen (the flow rate of 400 sccm). Under the second deposition condition, in order to increase a deposition rate, the gas flow rate is changed, and a silane gas of 4 sccm is diluted 100 times with hydrogen (the flow rate of 400 sccm) (other conditions are the same as in the first deposition condition).

Next, after formation of the microcrystalline silicon film under the second deposition condition, supply of the source gas such as silane and hydrogen, and the high-frequency power are stopped, and substrate removal 205 is performed. In the case of performing the deposition treatment to a subsequent substrate, the same treatment starting from substrate installation 202 is performed. In order to remove a coating film or powder that is attached to the inside of the reaction chamber, cleaning 206 is performed.

In cleaning 206, plasma etching is performed by introducing an etching gas typified by $NF_3$ and $SF_6$. Alternatively, cleaning 206 is performed by introducing a gas capable of etching without using plasma, such as $ClF_3$. It is preferable that cleaning 206 be performed with the heater for heating the substrate turned off, and with the temperature of the inner wall of the chamber reduced. This is to suppress generation of a reaction by-product due to etching. After completion of cleaning 206, the same treatments as described above may be performed to the subsequent substrate starting from precoating 201.

Next, after forming the microcrystalline semiconductor film 53, the substrate is transferred without exposure to air, and a buffer layer 54 is preferably formed in a vacuum chamber that is different from the vacuum chamber for forming the microcrystalline semiconductor film 53. By having separate vacuum chambers for forming the buffer layer 54 and forming the microcrystalline semiconductor film 53, the vacuum chamber for forming the microcrystalline semiconductor film 53 can be a chamber dedicated to having an ultra-high vacuum prior to introducing the substrate. Accordingly, contamination by an impurity can be suppressed to a minimum, and the time it takes to reach an ultra-high vacuum can be shortened. This is particularly effective in the case of performing baking to reach the ultra-high vacuum, because it takes time for the inner-wall temperature of the chamber to become lower and stable. Furthermore, by having separate vacuum chambers, different frequencies of high-frequency power can be used according to film qualities that are to be obtained. For example, it is possible that a microcrystalline semiconductor film is formed in a first chamber using high-frequency power with a frequency of 60 MHz, and then, a buffer layer is formed in a second chamber using high-frequency power with a frequency of 13.56 MHz.

The buffer layer 54 is formed using an amorphous semiconductor film containing hydrogen, nitrogen, or halogen. An amorphous semiconductor film containing hydrogen can be formed by using hydrogen with a flow rate that is 1 times to 10 times, preferably 1 times to 5 times the flow rate of silicon hydride. Further, an amorphous semiconductor film containing nitrogen can be formed by using nitrogen or ammonia with the above silicon hydride. In addition, an amorphous semiconductor film containing fluorine, chlorine, bromine, or iodine can be formed by using a gas containing fluorine, chlorine, bromine, or iodine ($F_2$, $Cl_2$, $Br_2$, $I_2$, HF, HCl, HBr, HI, or the like) with the above silicon hydride. Note that instead of silicon hydride, $SiH_2Cl_2$, $SiHCl_3$, $SiCl_4$, $SiF_4$, or the like can be used.

Further, the amorphous semiconductor film for the buffer layer 54 can be formed by sputtering using hydrogen or a rare gas with an amorphous semiconductor as a target. At this time, by including ammonia, nitrogen, or $N_2O$ in an atmosphere of the chamber, an amorphous semiconductor film containing nitrogen can be formed. Further, by including a gas containing fluorine, chlorine, bromine, or iodine ($F_2$, $Cl_2$, $Br_2$, $I_2$, HF, HCl, HBr, HI, or the like) in the atmosphere, an amorphous semiconductor film containing fluorine, chlorine, bromine, or iodine can be formed.

The buffer layer 54 is preferably formed of an amorphous semiconductor film that does not contain crystal grains. Therefore, in the case of forming the buffer layer 54 by a high frequency plasma CVD method with a frequency of several tens of MHz to several hundred MHz or a microwave plasma CVD method, it is preferable to control a deposition condition so that an amorphous semiconductor film that does not contain crystal grains is formed.

The buffer layer 54 is partially etched later in a formation process of a source region and a drain region. It is preferable that the buffer layer 54 is formed with a sufficient thickness so that a part thereof is left remaining after etching, so as not to expose the microcrystalline semiconductor film 53. Typically, the buffer layer 54 is formed with a thickness of 100 nm to 400 nm, inclusive, preferably 200 nm to 300 nm, inclusive. In a display device in which high voltage is applied to a thin film transistor (for example, about 15V), typically a liquid crystal display device, forming the buffer layer 54 with a large thickness in the above range makes a withstand voltage high, which can result in avoiding deterioration of the thin film transistor even when high voltage is applied to the thin film transistor.

Note that in the buffer layer 54, an impurity element imparting one conductivity type such as phosphorus or boron is not added intentionally. The buffer layer 54 functions as a barrier layer so that an impurity element from a semiconductor film 55, to which an impurity element imparting one conductivity type is added, is not dispersed into the microcrystalline semiconductor film 53. In the case of not providing the buffer layer 54, when the microcrystalline semiconductor film 53 and the semiconductor film 55 to which the impurity element imparting one conductivity type is added come into contact with each other, the impurity element moves in a later etching step or heat treatment, and there is a possibility that control of a threshold voltage becomes difficult.

Further, by forming the buffer layer 54 over the surface of the microcrystalline semiconductor film 53, natural oxidation of surfaces of crystal grains contained in the microcrystalline semiconductor film 53 can be prevented. In a region where an amorphous semiconductor and crystal grains come into contact with each other, it is particularly easy for a crack to be formed due to localized stress. When this crack is exposed to oxygen, the crystal grains are oxidized, and silicon oxide is formed.

An energy gap of the buffer layer 54 that is an amorphous semiconductor film is larger than that of the microcrystalline semiconductor film 53 (an energy gap of the amorphous semiconductor film is 1.6 eV to 1.8 eV, and an energy gap of the microcrystalline semiconductor film 53 is 1.1 eV to 1.5 eV). Also, resistance is higher and electron mobility is lower in the buffer layer 54 than in the microcrystalline semiconductor film 53, and the electron mobility of the buffer layer 54 is $\frac{1}{5}$ to $\frac{1}{10}$ of that of the microcrystalline semiconductor film 53. Accordingly, in a thin film transistor that is formed later, the buffer layer 54 that is formed between source and drain regions and the microcrystalline semiconductor film 53 functions as a high-resistant region, and the microcrystalline semiconductor film 53 functions as a channel formation region. Therefore, an off-current of the thin film transistor can be reduced. In the case of using the thin film transistor for a switching element of a display device, contrast of the display device can be improved.

It is preferable that the buffer layer 54 be formed over the microcrystalline semiconductor film 53 by a plasma CVD method, at substrate temperatures of greater than or equal to 300° C. and less than 400° C. By this treatment, hydrogen is supplied to the microcrystalline semiconductor film 53, and the same effect as hydrogenizing the microcrystalline semiconductor film 53 can be obtained. In other words, by depositing the buffer layer 54 over the microcrystalline semiconductor film 53, hydrogen is dispersed in the microcrystalline semiconductor film 53, and dangling bonds can be terminated. Further, during formation of the buffer layer 54, annealing can be performed to the microcrystalline semiconductor film 53 to improve film quality. In particular, although the film obtained under the second deposition condition is formed at a higher deposition rate than the film obtained under the first deposition condition, crystallinity obtained under the second deposition condition tends to be degraded compared to crystallinity obtained under the first deposition condition. However, by annealing during formation of the buffer layer, film quality such as crystallinity can be improved.

Figure 1D:
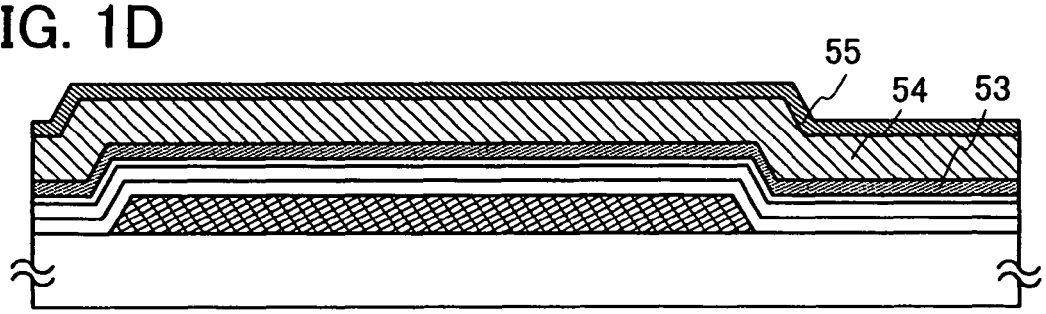

Next, after forming the buffer layer 54, the substrate is transferred without exposure to air, and the semiconductor film 55 to which the impurity element imparting one conductivity type is added is preferably formed in a vacuum chamber that is different from the vacuum chamber for forming the buffer layer 54. A cross-sectional view at this stage is shown in FIG. 1D. By forming the semiconductor film 55 to which the impurity element imparting one conductivity is added in a vacuum chamber that is different from the vacuum chamber for forming the buffer layer 54, the impurity element imparting one conductivity type can be prevented from mixing into the buffer layer when the buffer layer is formed.

To the semiconductor film 55 to which the impurity element imparting one conductivity is added, in the case of forming an n-channel thin film transistor, phosphorus as a typical impurity element may be added, and an impurity gas such as $PH_3$ may be added to silicon hydride. Alternatively, in the case of forming a p-channel thin film transistor, boron as a typical impurity element may be added, and an impurity gas such as $B_2H_6$ may be added to silicon hydride. The semiconductor film 55 to which the impurity element imparting one conductivity type is added can be formed of a microcrystalline semiconductor or an amorphous semiconductor. The semiconductor film 55 to which the impurity element imparting one conductivity type is added is formed to have a thickness of 2 nm to 50 nm, inclusive. By the thickness of the semiconductor film 55 to which the impurity element imparting one conductivity type is added being thin, throughput can be improved.

Figure 2A:
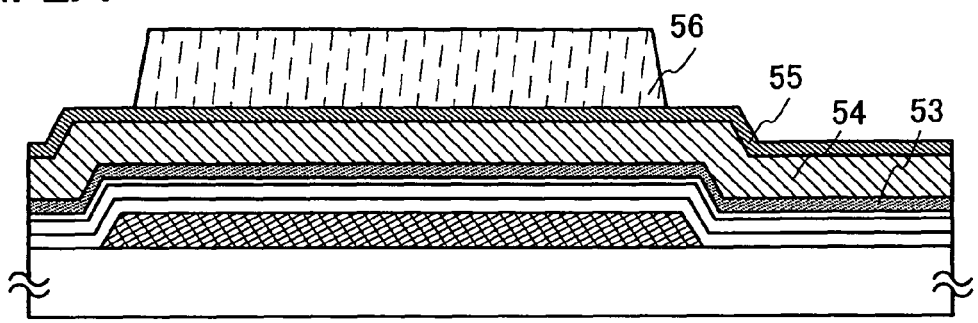
FIGS. 2A to 2D are cross-sectional views illustrating a manufacturing method of the present invention.

Next, as shown in FIG. 2A, a resist mask 56 is formed over the semiconductor film 55 to which the impurity element imparting one conductivity is added. The resist mask 56 is formed by a photolithography technique or an ink-jet method. Here, the resist mask 56 is formed by performing exposure to light and development to a resist that is applied over the semiconductor film 55 to which the impurity element imparting one conductivity type is added, using a second photomask.

Figure 2B:
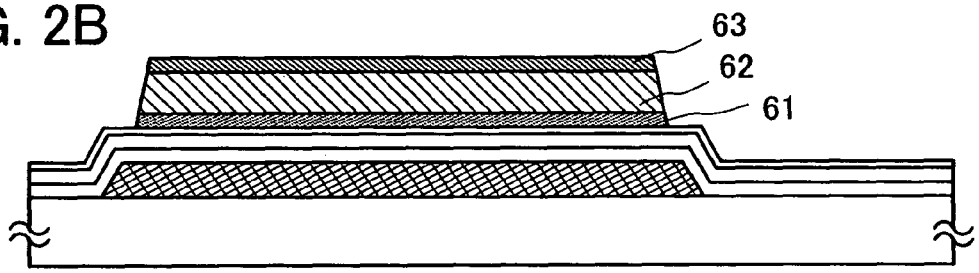

Next, the microcrystalline semiconductor film 53, the buffer layer 54, and the semiconductor film 55 to which the impurity element imparting one conductivity is added are etched using the resist mask 56, to form a microcrystalline semiconductor film 61, a buffer layer 62, and a semiconductor film 63 to which the impurity element imparting one conductivity type is added, as shown in FIG. 2B. After that, the resist mask 56 is removed.

By surfaces of end portions of the microcrystalline semiconductor film 61 and the buffer layer 62 having inclines, occurrence of a leakage current between source and drain regions formed over the buffer layer 62 and the microcrystalline semiconductor film 61 can be prevented. In addition, occurrence of a leakage current between source and drain electrodes and the microcrystalline semiconductor film 61 can be prevented. Inclination angles of the surfaces of the end portions of the microcrystalline semiconductor film 61 and the buffer layer 62 are each 30° to 90°, preferably 45° to 80°. With such an angle, disconnection of the source electrode or the drain electrode due to a step shape can be prevented.

Figure 2C:
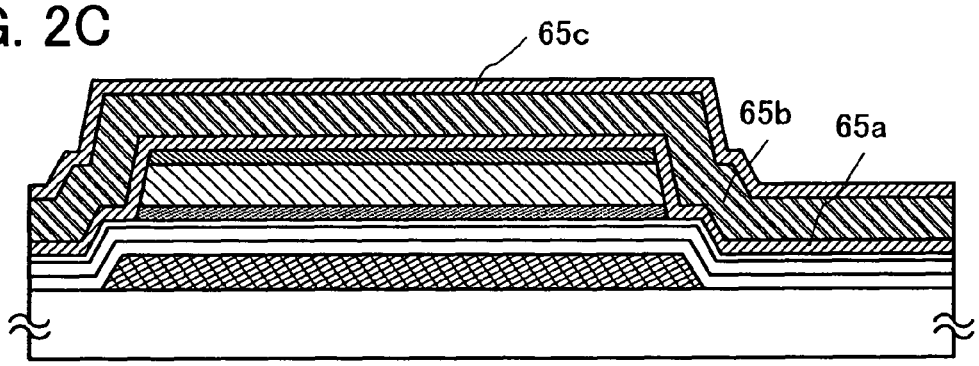

Next, as shown in FIG. 2C, conductive films 65a to 65c are formed so as to cover the semiconductor film 63 to which the impurity element imparting one conductivity type is added and the gate insulating film 52c. It is preferable that the conductive films 65a to 65c are formed as a single layer of aluminum, copper, or an aluminum alloy to which an element that improves heat resistance or an element that prevents hillock such as silicon, titanium, neodymium, scandium, or molybdenum is added; or as stacked layers thereof. Alternatively, a film on a side that is in contact with the semiconductor film to which the impurity element imparting one conductivity type is added may be formed of titanium, tantalum, molybdenum, tungsten, or a nitride thereof, and then aluminum or an aluminum alloy may be formed thereover to form a layered structure. Further alternatively, the layered structure may be that in which aluminum or an aluminum alloy is sandwiched by titanium, tantalum, molybdenum, tungsten, or a nitride thereof, from above and below. Here, as the conductive film, a conductive film with a three-layer stacked-layer structure of the conductive films 65a to 65c is shown, and a stacked-layer conductive film using molybdenum films for the conductive films 65a and 65c and an aluminum film for the conductive film 65b, and a stacked-layer conductive film using titanium films for the conductive films 65a and 65c and an aluminum film for the conductive film 65b are shown. The conductive films 65a to 65c are formed by a sputtering method or a vacuum evaporation method.

Figure 2D:
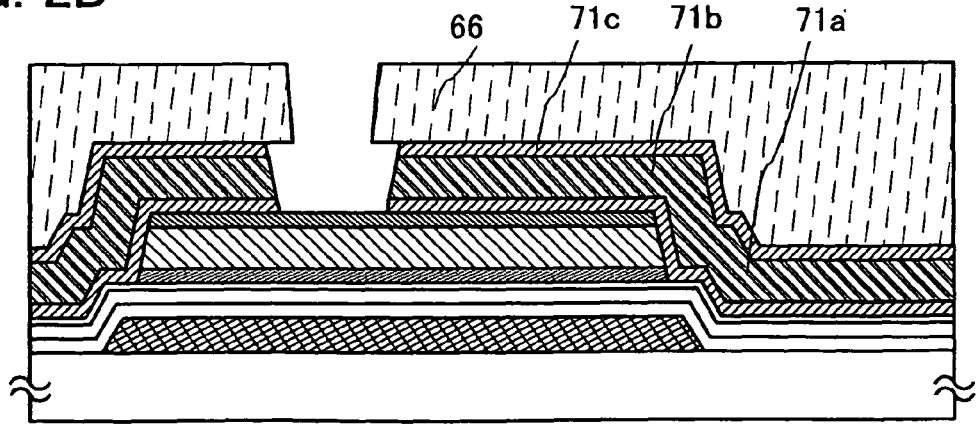

Next, as shown in FIG. 2D, a resist mask 66 is formed over the conductive films 65a to 65c using a third photomask, and the conductive films 65a to 65c are partially etched to form pairs of source and drain electrodes 71a to 71c. By performing wet etching on the conductive films 65a to 65c, the conductive films 65a to 65c are etched as selected. As a result, the conductive films are isotropically etched, and thus, the source and drain electrodes 71a to 71c can be formed to have a smaller area than the resist mask 66.

Figure 3A:
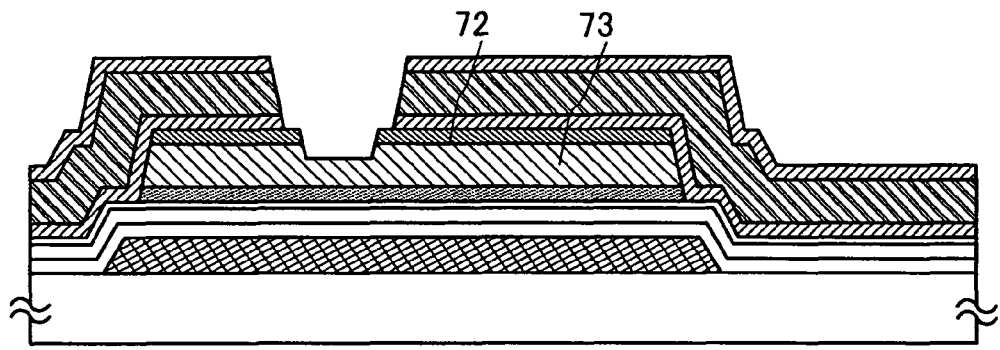
FIGS. 3A to 3C are cross-sectional views illustrating a manufacturing method of the present invention.

Next, as shown in FIG. 3A, the semiconductor film 63 to which the impurity element imparting one conductivity type is added is etched using the resist mask 66, to form a pair of source and drain regions 72. Further, in this etching step, a part of the buffer layer 62 is also etched. The buffer layer that is partially etched and has a depression (groove) is referred to as a buffer layer 73. The source and drain regions 72 and the depression (groove) of the buffer layer 73 can be formed in the same step. By making a depth of the depression (groove) of the buffer layer to be ½ to ⅓ of a thickness of the thickest region of the buffer layer 73, it is possible to have distance between the source region and the drain region. Accordingly, a leakage current between the source and drain regions can be reduced. After that, the resist mask 66 is removed.

When the resist mask 66 is exposed to plasma used in dry etching or the like, the resist mask is altered and it is not removed completely in a resist removal step. Accordingly, the buffer layer is etched by about 50 nm to prevent residue from being left behind. The resist mask 66 is used twice, once in the treatment for partially etching the portion of the conductive films 65a to 65c, and once in the etching treatment during formation of the source and drain regions 72. When dry etching is used in both treatments, residue is easily left behind; therefore, it is effective to form the buffer layer, which may be etched when the residue is removed completely, to be thick. In addition, the buffer layer 73 can prevent plasma damage to the microcrystalline semiconductor film 61 during dry etching.

Figure 3B:
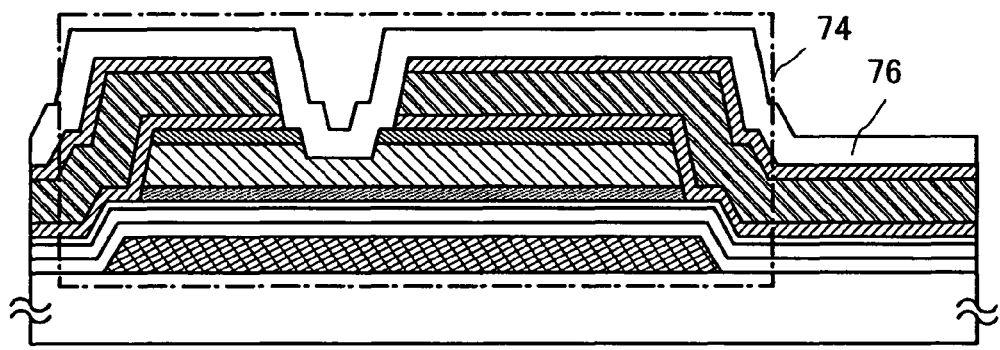
Figure 3C:
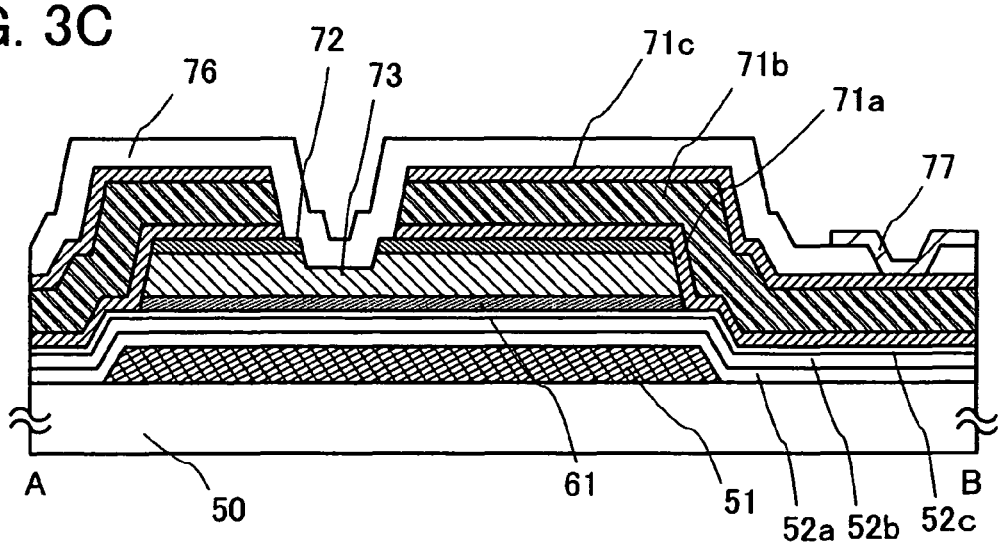

Next, as shown in FIG. 3B, an insulating film 76 is formed so as to cover the source and drain electrodes 71a to 71c, the source and drain regions 72, the buffer layer 73, the microcrystalline semiconductor film 61, and the gate insulating film 52c. The insulating film 76 can be formed by using the same method as the method used for forming the gate insulating films 52a, 52b and 52c. Note that the insulating film 76 is for preventing entrance of a contaminating impurity such as an organic substance, a metal substance, or water vapor which is contained in the air, and a dense film is preferable. Further, by using a silicon nitride film for the insulating film 76, the oxygen concentration in the buffer layer 73 can be at less than or equal to $5 \times 10^{19}$ atoms/cm³, preferably at less than or equal to $1 \times 10^{19}$ atoms/cm³.

As shown in FIG. 3B, by having end portions of the source and drain electrodes 71a to 71c not align with end portions of the source and drain regions 72, a leakage current and short circuit between the source and drain electrodes can be prevented since there is distance between the source and drain electrodes 71a to 71c. Further, by the end portions of the source and drain electrodes 71a to 71c not aligning with the end portions of the source and drain regions 72, a leakage current between the gate electrode 51 and the source and drain electrodes 71a to 71c can be prevented because an electrical field does not concentrate at the end portions of the source and drain electrodes 71a to 71c and the source and drain regions 72. Accordingly, a thin film transistor with high reliability and high withstand voltage can be manufactured.

By the above process, a thin film transistor 74 can be formed.

In the thin film transistor described in this embodiment mode, the gate insulating film, the microcrystalline semiconductor film, the buffer layer, the source and drain regions, and the source and drain electrodes are stacked over the gate electrode, and the buffer layer covers the surface of the microcrystalline semiconductor film which functions as a channel formation region. In addition, a depression (a groove) is formed in a part of the buffer layer, and regions other than the depression are covered with the source and drain regions. That is, because there is distance between the source region and the drain region due to the depression formed in the buffer layer, a leakage current between the source and drain regions can be reduced. In addition, because the depression is formed by etching of a part of the buffer layer, an etching residue which is generated in the formation step of the source and drain regions can be removed. Accordingly, a leakage current (parasitic channel) can be prevented from being generated between the source and drain regions through the residue.

The buffer layer is formed between the microcrystalline semiconductor film that functions as a channel formation region and the source and drain regions. In addition, the buffer layer covers the surface of the microcrystalline semiconductor film. Because the buffer layer, which has high resistance, is formed also between the microcrystalline semiconductor film and the source and drain regions, occurrence of a leakage current can be reduced in a thin film transistor, and deterioration due to application of high voltage can be suppressed. In addition, the buffer layer, the microcrystalline semiconductor film, and the source and drain regions are formed in regions that overlap with the gate electrode. Accordingly, a structure thereof is not affected by a shape of an end portion of the gate electrode. When the gate electrode is formed to have a layered structure and aluminum is used in a lower layer, there is a possibility of generation of hillock due to aluminum being exposed on a side surface of the gate electrode. However, by a structure in which the source and drain regions do not overlap with the end portions of the gate electrode, short circuit occurring in a region overlapping with the side surface of the gate electrode can be prevented. Moreover, because the amorphous semiconductor film, the surface of which is subjected to termination by hydrogen, is formed as the buffer layer over the surface of the microcrystalline semiconductor film, the microcrystalline semiconductor film can be prevented from being oxidized, and an etching residue which is generated in the formation step of the source and drain regions can be prevented from being mixed into the microcrystalline semiconductor film. Accordingly, the thin film transistor has high electric characteristics and high withstand voltage.

Further, a channel length of the thin film transistor can be shortened, and a planar area of the thin film transistor can be made smaller.

Next, a contact hole is formed in the insulating film 76 by etching a part of the insulating film 76 using a resist mask that is formed using a fourth photomask. Then, a pixel electrode 77 is formed in the contact hole to be in contact with the source or drain electrode 71c. Note that FIG. 3C corresponds to a cross-sectional view in FIG. 4 along a chain line A-B.

As illustrated in FIG. 4, it can be seen that end portions of the source and drain regions 72 are located outside the end portions of the source and drain electrodes 71c. In addition, end portions of the buffer layer 73 are located outside the end portions of the source and drain electrodes 71c and the source and drain regions 72. Further, one of the source and drain electrodes surrounds the other of the source and drain electrodes (specifically, the former electrode is in a U-shape or a C-shape). Thus, an area of a region in which carriers move can be increased, and thus the amount of current can be increased and an area for a thin film transistor can be reduced. Over the gate electrode, the microcrystalline semiconductor film and the source and drain electrodes are overlapped, and thus influence by unevenness of the gate electrode is small and reduction of coverage and generation of a leakage current can be suppressed. Note that one of the source and drain electrodes also functions as a source or drain wiring.

Further, for the pixel electrode 77, a light-transmitting conductive material can be used, such as indium oxide containing tungsten oxide, indium zinc oxide containing tungsten oxide, indium oxide containing titanium oxide, indium tin oxide containing titanium oxide, indium tin oxide, indium zinc oxide, or indium tin oxide to which silicon oxide is added.

Furthermore, the pixel electrode 77 can be formed using a conductive composition containing a conductive high-molecular material (also called a "conductive polymer"). The pixel electrode 77 formed using a conductive composition preferably has a sheet resistance of less than or equal to 10000 Ω/□, and transmittance of greater than or equal to 70% at a wavelength of 550 nm. In addition, it is preferable that the conductive high-molecular material contained in the conductive composition have an electrical resistivity of less than or equal to 0.1 Ω·cm.

As the conductive high-molecular material, a so-called π electron conjugated conductive high-molecular material can be used. For example, polyaniline or a derivative thereof, polypyrrole or a derivative thereof, polythiophene or a derivative thereof, or a copolymer of at least two types of the above can be given.

Here, as the pixel electrode 77, a film of indium tin oxide is formed by a sputtering method, and then a resist is applied over the indium tin oxide film. Next, the resist is exposed to light and developed using a fifth photomask, and a resist mask is formed. Then, the pixel electrode 77 is formed by etching the indium tin oxide film using the resist mask.

Accordingly, an element substrate that can be used for a display device can be formed.

(Embodiment Mode 2)

This embodiment mode shows one example of a multi-chamber plasma CVD apparatus suitable for formation of a gate insulating film, a microcrystalline semiconductor film, and an n+ layer included in the TFT described in Embodiment Mode 1.

Figure 6:
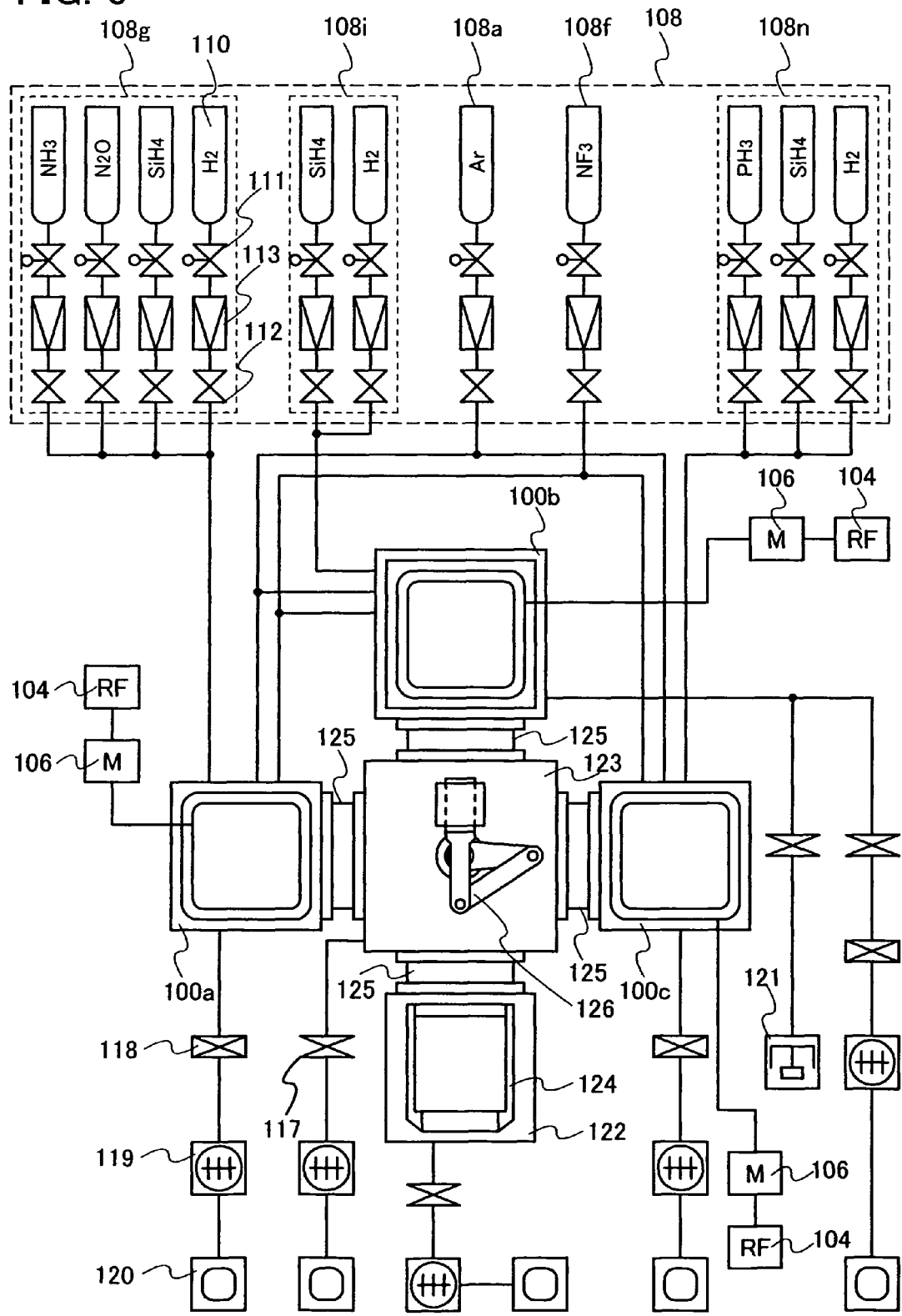
FIG. 6 is a top view illustrating a structure of a multi-chamber plasma CVD apparatus provided with three treatment chambers.

FIG. 6 shows one example of a multi-chamber plasma CVD apparatus provided with a plurality of reaction chambers. This apparatus is provided with a common chamber 123, a load/unload chamber 122, a first reaction chamber 100a, a second reaction chamber 100b, and a third reaction chamber 100c. This apparatus is a single wafer-processing type in which a substrate set in a cassette 124 in the load/unload chamber 122 is transferred to/from each reaction chamber by a transfer unit 126 in the common chamber 123. A gate valve 125 is provided between the common chamber 123 and each reaction chamber, so that processing in one reaction chamber does not affect processing in other reaction chambers.

The reaction chambers are sorted according to the kinds of thin films to be formed. For example, an insulating film such as a gate insulating film is formed in the first reaction chamber 100a, a microcrystalline semiconductor layer which forms a channel is formed in the second reaction chamber 100b, and a buffer layer and a semiconductor layer to which an impurity element imparting one conductivity type is added and which forms a source and a drain are formed in the third reaction chamber 100c. Of course, the number of the reaction chambers is not limited to three, and can be increased or decreased as needed. Further, one film may be formed in one reaction chamber, or a plurality of films may be formed in one reaction chamber.

As another example, an insulating film such as a gate insulating film is formed in the first reaction chamber 100a, a microcrystalline semiconductor layer which forms a channel and a buffer layer are formed in the second reaction chamber 100b, and a semiconductor layer to which an impurity element imparting one conductivity type is added and which forms a source and a drain is formed in the third reaction chamber 100c.

A turbo molecular pump 119 and a dry pump 120 are connected to each reaction chamber as exhaust units. The exhaust units are not limited to a combination of these vacuum pumps and can employ other vacuum pumps as long as they can evacuate the reaction chamber to a degree of vacuum of about $10^{-5}$ Pa to $10^{-1}$ Pa. A cryopump 121 is connected to the second reaction chamber 100b in which a microcrystalline semiconductor film is formed so that the reaction chamber is evacuated to an ultra-high vacuum (UHV). A butterfly valve 117 is provided between an exhaust unit and each reaction chamber. With the butterfly valve 117, vacuum-evacuation can be blocked. Further, an evacuation rate is controlled by a conductance valve 118, so that pressure in each reaction chamber can be controlled. The combination of the exhaust units shown in FIG. 6 is one example and the combination is not particularly limited thereto.

A gas supply unit 108 includes a cylinder 110 filled with a gas used for processing such as a semiconductor material gas or a rare gas, a stop valve 112, a mass flow controller 113, and the like. A gas supply unit 108g is connected to the first reaction chamber 100a to supply a gas for forming a gate insulating film. A gas supply unit 108i is connected to the second reaction chamber 100b to supply a gas for forming a microcrystalline semiconductor film. A gas supply unit 108n is connected to the third reaction chamber 100c to supply a gas for forming, for example, an n-type semiconductor film. A gas supply unit 108a supplies argon, and a gas supply unit 108f supplies an etching gas used for cleaning of the inside of the reaction chambers. Thus, the gas supply units 108a and 108f are provided in common for each reaction chamber.

A high-frequency power supply unit is connected to each reaction chamber for generating plasma. The high-frequency power supply unit includes a high-frequency power source 104 and a matching box 106. A frequency of the high-frequency power source 104 is several tens of MHz to several hundred MHz, such as 13.56 MHz, 27 MHz, or 60 MHz.

As in this embodiment mode, when a plurality of reaction chambers is used and connected to a common chamber as shown in FIG. 6, a plurality of different layers can be formed successively without being exposed to the air.

This embodiment mode can be combined with Embodiment Mode 1 as appropriate.

(Embodiment Mode 3)

Figure 7:
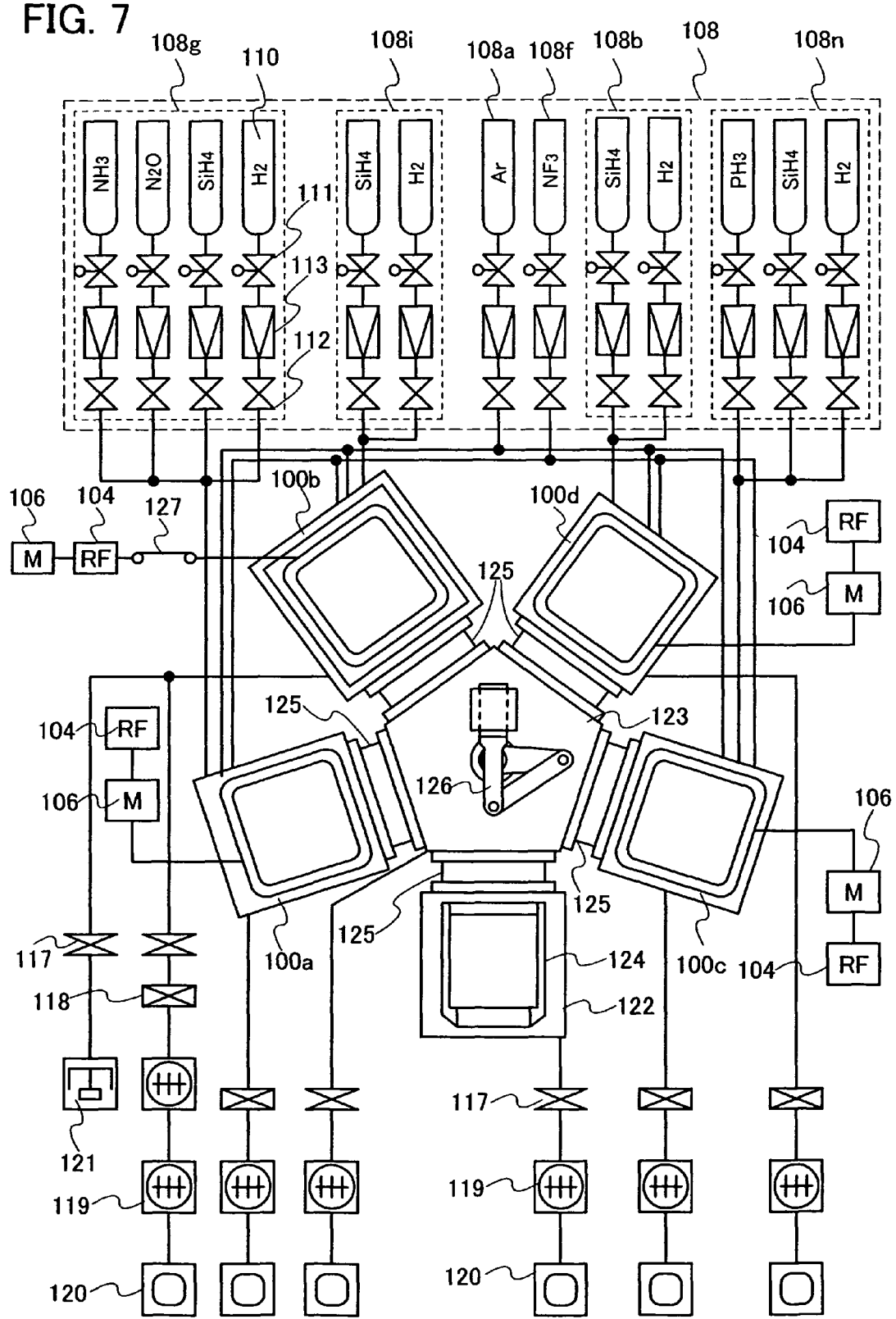
FIG. 7 is a top view illustrating a multi-chamber plasma CVD apparatus provided with four treatment chambers.

This embodiment mode will describe a manufacturing process of a thin film transistor using a multi-chamber plasma CVD apparatus which is different from that in FIG. 6 described in Embodiment Mode 2, with reference to FIG. 7. FIG. 6 shows the apparatus provided with three reaction chambers, whereas FIG. 7 is a top view of a multi-chamber plasma CVD apparatus provided with four reaction chambers.

FIG. 7 shows a structure in which a fourth reaction chamber 100d is provided in addition to the structure of the multi-chamber plasma CVD apparatus of FIG. 6. In FIG. 7, the same components as in FIG. 6 are denoted by the same reference numerals and detailed description thereof is omitted. Further, a combination of exhaust units shown in FIG. 7 is one example and the combination is not particularly limited thereto.

A gas supply unit 108b is connected to the fourth reaction chamber 100d. The structure of the high-frequency power supply units and the exhaust units is the same as in FIG. 6. The reaction chambers can be sorted according to the kinds of thin films to be formed. For example, an insulating film such as a gate insulating film is formed in the first reaction chamber 100a, a microcrystalline semiconductor layer which forms a channel is formed in the second reaction chamber 100b, a buffer layer which protects a semiconductor layer for forming a channel is formed in the fourth reaction chamber 100d, and a semiconductor layer to which an impurity element imparting one conductivity type is added and which forms a source and a drain is formed in the third reaction chamber 100c. Each thin film is formed best at a certain deposition temperature (referred to as substrate temperature), and the deposition temperature can be easily controlled by formation of each film in a different reaction chamber. Furthermore, since the same kind of films can be formed repeatedly in the same reaction chamber, an influence of residual impurities due to films which have been formed can be eliminated.

In addition, in FIG. 7, the second reaction chamber 100b is provided with a switch 127 which controls application of high-frequency power. Under the first deposition condition, a microcrystalline semiconductor layer is formed by a continuous discharge plasma CVD method in which a source gas is affected continuously by discharge of high-frequency power by keeping the switch 127 turned on. Then, under the second deposition condition, the switch 127 is controlled to be turned on and off, and a microcrystalline semiconductor layer is further formed by an intermittent discharge plasma CVD method in which a source gas is affected intermittently by discharge of high-frequency power. In other words, under the first deposition condition, continuous discharge is performed in the first deposition period, and under the second deposition condition, a deposition rate is made higher than that under the first deposition condition by a method in which a plurality of discharge-stop-periods is provided in the second deposition period of one substrate by turning off the high-frequency power. The deposition rate under the second deposition condition can be higher than that under the first deposition condition by the control of turning on and off the high-frequency power; thus, this method is easier than other methods in which other conditions are changed.

This embodiment mode can be combined with Embodiment Mode 1 or 2 as appropriate.

(Embodiment Mode 4)

A manufacturing method of a thin film transistor, which is different from that in Embodiment Mode 1, will be described with reference to FIGS. 8A to 8D, FIGS. 9A and 9B, FIGS. 10A to 10C, FIGS. 11A and 11B, and FIGS. 12A to 12C. In this embodiment mode, a process for manufacturing a thin film transistor, which uses a process capable of reducing the number of photomasks compared to Embodiment Mode 1, will be described.

In a similar manner to FIG. 1A described in Embodiment Mode 1, a conductive film is formed over a substrate 50, a resist is applied over the conductive film, and the conductive film is partially etched using a resist mask formed by photolithography using a first photomask, so that a gate electrode 51 is formed. Next, over the gate electrode 51, gate insulating film 52a, 52b, and 52c are formed in this order.

Next, in a similar manner to FIG. 1B described in Embodiment Mode 1, a microcrystalline semiconductor film 23 is formed under the first deposition condition. Then, in a similar manner to FIG. 1C described in Embodiment Mode 1, a microcrystalline semiconductor film 53 is formed in the same chamber under the second deposition condition. Next, in a similar manner to FIG. 1D described in Embodiment Mode 1, a buffer layer 54 and a semiconductor film 55 to which an impurity element imparting one conductivity type is added are formed in sequence over the microcrystalline semiconductor film 53.

Figure 9A:
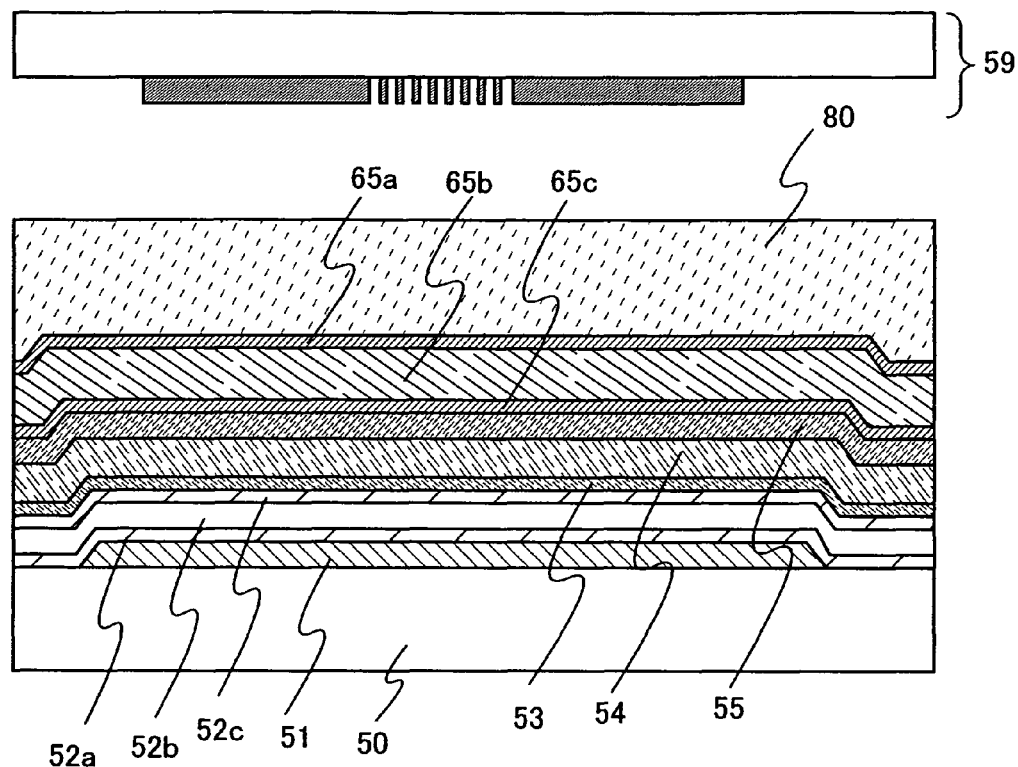
FIGS. 9A and 9B are cross-sectional views illustrating a manufacturing process of the present invention.

Next, conductive films 65a to 65c are formed over the semiconductor film 55 to which the impurity element imparting one conductivity type is added. Next, as shown in FIG. 9A, a resist 80 is applied over the conductive film 65a.

As the resist 80, a positive resist or a negative resist can be used. In this embodiment mode, a positive resist is used.

Next, a multi-tone mask 59 is used as a second photomask and the resist 80 is irradiated with light, whereby the resist 80 is exposed to light.

The exposure to light with the use of the multi-tone mask 59 will be described below with reference to FIGS. 8A to 8D.

The multi-tone mask is a mask capable of performing exposure to light at three levels: an exposed portion, a half-tone-exposed portion, and an unexposed portion; therefore, a resist mask having regions with different thicknesses (typically, two kinds of thicknesses) can be formed by one exposure-to-light and development process. Thus, the use of the multi-tone mask can reduce the number of photomasks.

Figure 8A:
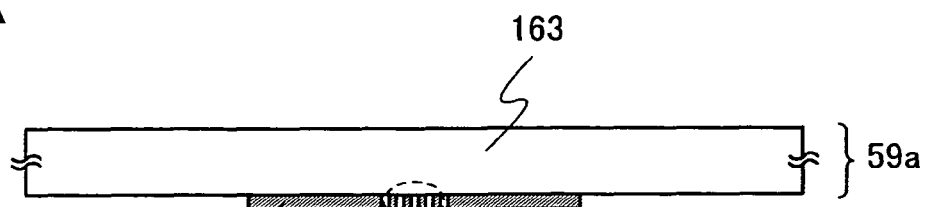
FIGS. 8A to 8D are views illustrating a multi-tone mask which can be applied to the present invention.
Figure 8B:
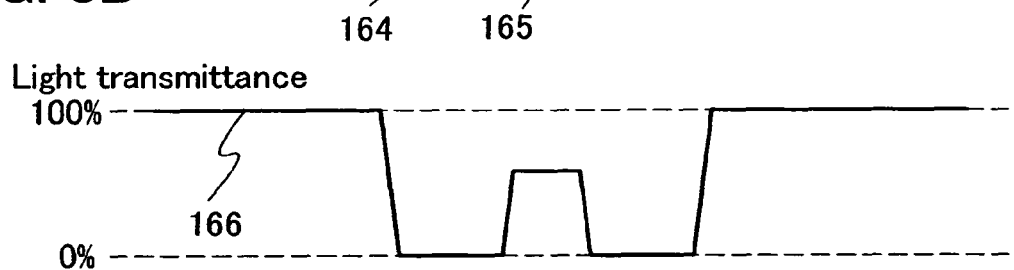
Figure 8C:
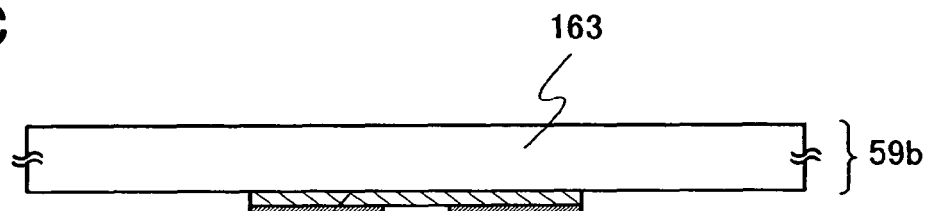

As typical examples of the multi-tone mask, a gray-tone mask 59a shown in FIG. 8A and a half-tone mask 59b shown in FIG. 8C are given.

As shown in FIG. 8A, the gray-tone mask 59a includes a light-transmitting substrate 163 provided with a light-blocking portion 164 and a diffraction grating 165. The light transmittance in the light-blocking portion 164 is 0%. In contrast, the light transmittance at the diffraction grating 165 can be controlled by setting an interval between light-transmitting portions such as slits, dots, or meshes to an interval of less than or equal to the limit of resolution of light used for the exposure. Note that a slit, dot, or mesh form with regular intervals, or a slit, dot, or mesh form with irregular intervals can be used for the diffraction grating 165.

As the light-transmitting substrate 163, a light-transmitting substrate made of quartz or the like can be used. The light-blocking portion 164 and the diffraction grating 165 can be each formed of a light-blocking material by which light is absorbed, such as chromium or chromium oxide.

In the case where the gray-tone mask 59a is irradiated with exposure light, as shown in FIG. 8B, light transmittance 166 in the light-blocking portion 164 is 0% and the light transmittance 166 in a region where the light-blocking portion 164 and the diffraction grating 165 are not provided is 100%. Further, the light transmittance in the diffraction grating 165 can be controlled within the range of 10% to 70%. The light transmittance in the diffraction grating 165 can be controlled by adjusting the interval of slits, dots, or meshes of the diffraction grating and the pitch thereof.

As shown in FIG. 8C, the half-tone mask 59b includes the light-transmitting substrate 163 provided with a semi-lighttransmitting portion 167 and a light-blocking portion 168. As the semi-light-transmitting portion 167, MoSiN, MoSi, MoSiO, MoSiON, CrSi, or the like can be used. The light-blocking portion 168 can be formed of a light-blocking material by which light is absorbed, such as chromium or chromium oxide.

Figure 8D:
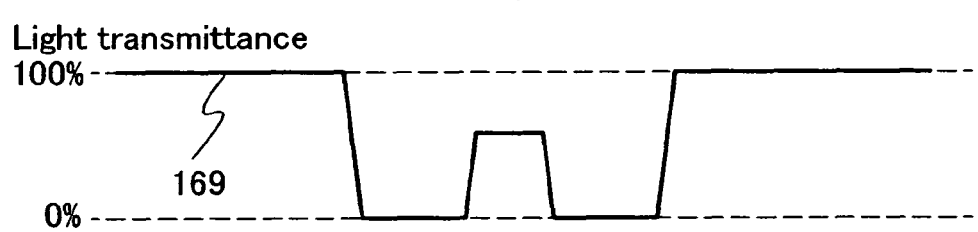

In the case where the half-tone mask 59b is irradiated with exposure light, as shown in FIG. 8D, light transmittance 169 in the light-blocking portion 168 is 0% and the light transmission 169 in a region where the light-blocking portion 168 and the semi-light-transmitting portion 167 are not provided is 100%. Further, the light transmission in the semi-light-transmitting portion 167 can be controlled within the range of 10% to 70%. The light transmittance in the semi-light-transmitting portion 167 can be controlled by the material of the semi-light-transmitting portion 167.

Figure 9B:
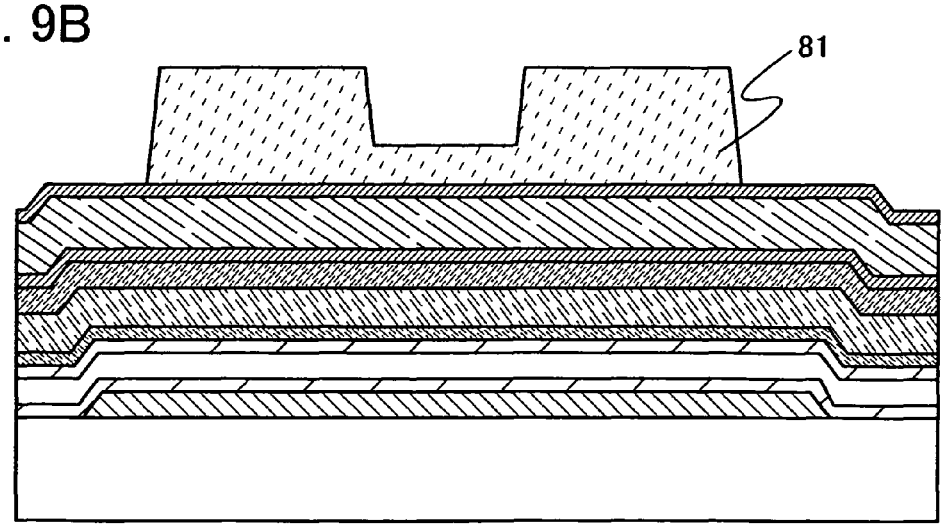

After the exposure to light using the multi-tone photomask, development is carried out, whereby a resist mask 81 having regions with different thicknesses can be formed as shown in FIG. 9B.

Figure 10A:
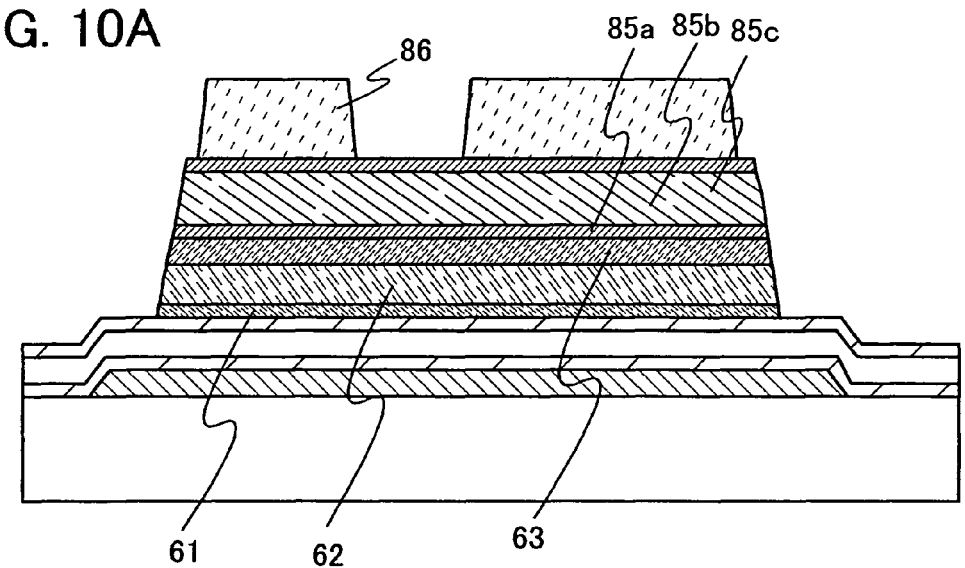
FIGS. 10A to 10C are cross-sectional views illustrating a manufacturing process of the present invention.

Next, with the resist mask 81, the microcrystalline semiconductor film 53, the buffer layer 54, the semiconductor film 55 to which the impurity element imparting one conductivity type is added, and the conductive films 65a to 65c are etched. As a result, a microcrystalline semiconductor film 61, a buffer layer 62, a semiconductor film 63 to which the impurity element imparting one conductivity type is added, and conductive films 85a to 85c as shown in FIG. 10A can be formed. Note that FIG. 10A corresponds to a cross-sectional view taken along a line A-B in FIG. 12A (although a resist mask 86 is not shown).

Next, the resist mask 81 is ashed. As a result, the area and thickness of the resist mask are reduced. At this time, the resist mask in a region with a small thickness (a region overlapping with part of the gate electrode 51) is removed to form the resist mask 86 as shown in FIG. 10A.

Figure 10B:
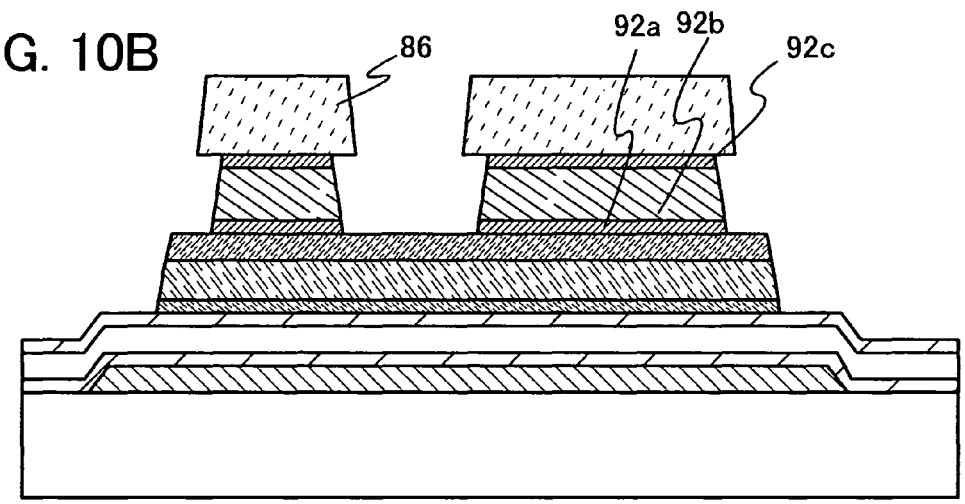

Next, the conductive films 85a to 85c are etched to be separated using the resist mask 86. As a result, pairs of source and drain electrodes 92a to 92c can be formed as shown in FIG. 10B. When the conductive films 85a to 85c are etched by wet etching using the resist mask 86, the conductive films 85a to 85c are etched as selected. Since the conductive films are isotropically etched, the source and drain electrodes 92a to 92c with a smaller area than the resist mask 86 can be formed.

Next, the semiconductor film 63 to which the impurity element imparting one conductivity type is added is etched using the resist mask 86 to form a pair of source and drain regions 88. In the etching step, a part of the buffer layer 62 is also etched. The buffer layer after being etched partially is referred to as a buffer layer 87. The buffer layer 87 has a recessed portion. The source and drain regions and the recessed portion (groove) in the buffer layer can be formed by the same step. Here, the buffer layer 87 is partially etched with use of the resist mask 86 having a smaller area than the resist mask 81, so that end portions of the buffer layer 87 are located outside the source and drain regions 88. After that, the resist mask 86 is removed. End portions of the source and drain electrodes 92a to 92c are not aligned with those of the source and drain regions 88, and the end portions of the source and drain regions 88 are located outside those of the source and drain electrodes 92a to 92c.

Figure 10C:
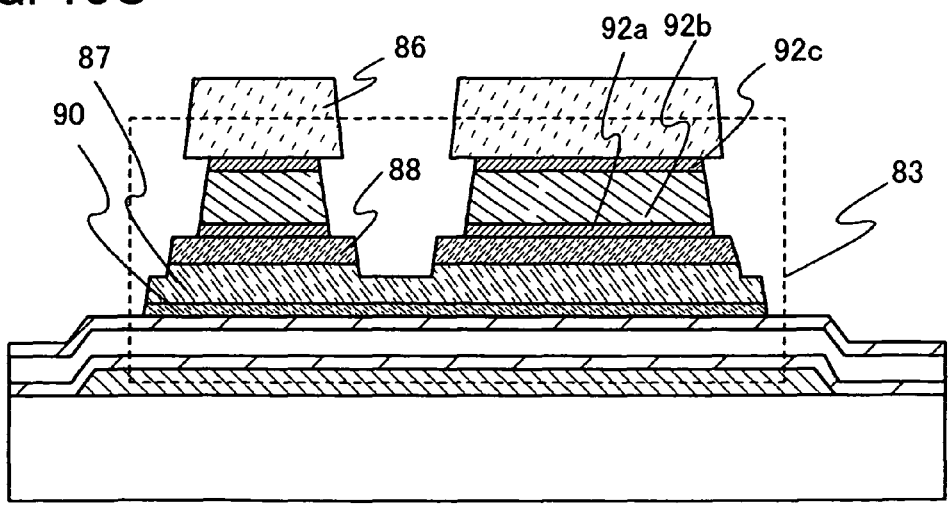
Figure 12A:
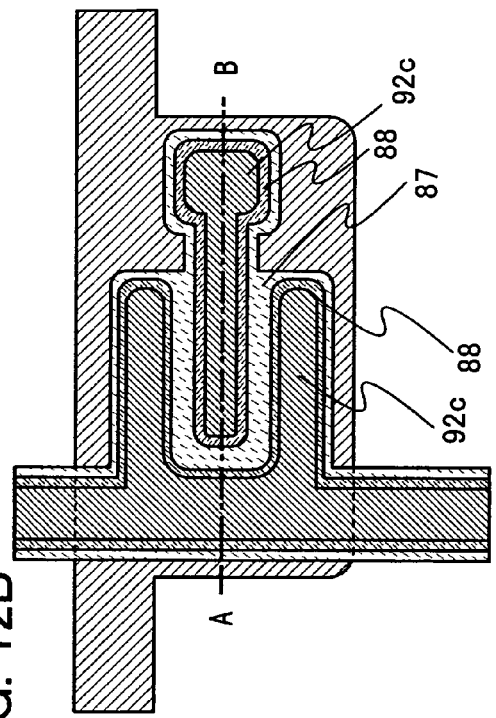
FIGS. 12A to 12C are top views illustrating a manufacturing process of the present invention.
Figure 12B:
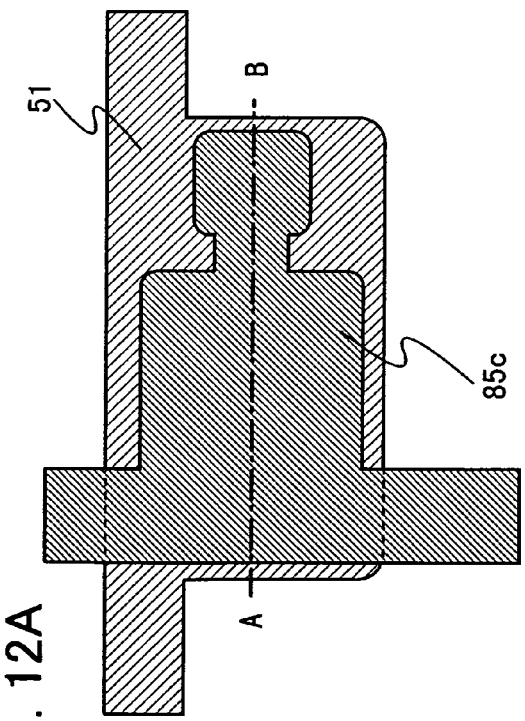
Figure 12C:
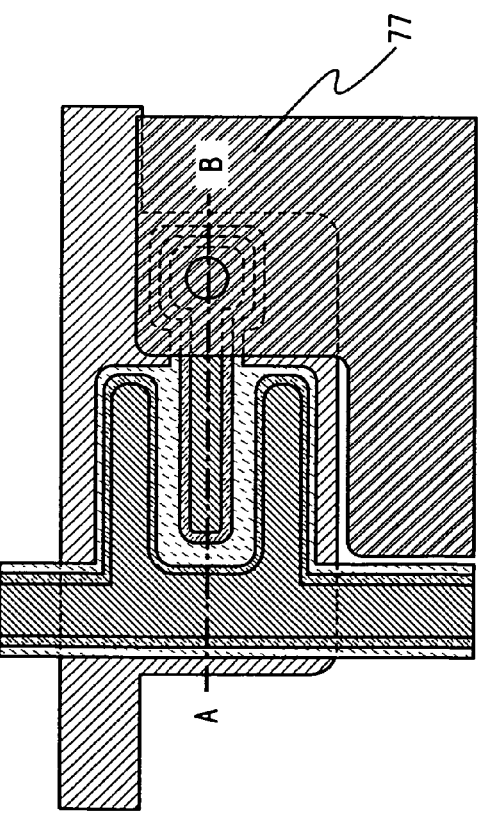

Note that FIG. 10C corresponds to a cross-sectional view taken along a line A-B in FIG. 12B. As shown in FIG. 12B, the end portions of the source and drain regions 88 are located outside those of the source and drain electrodes 92c. Further, end portions of the buffer layer 87 are located outside those of the source and drain electrodes 92c and those of the source and drain regions 88. Furthermore, one of the source and drain electrodes surrounds the other of the source and drain electrodes (specifically, the former electrode is in a U-shape or a C-shape). Therefore, the area of a region where carriers move can be increased; and thus the amount of current can be increased, and the area of a thin film transistor can be reduced. Further, roughness of the gate electrode has little influence because the microcrystalline semiconductor film and the source and drain electrodes overlap with each other over the gate electrode, thereby suppressing reduction in coverage and generation of leakage current. Note that either the source electrode or the drain electrode also functions as a source wiring or a drain wiring.

As shown in FIG. 10C, the end portions of the source and drain electrodes 92a to 92c are not aligned with those of the source and drain regions 88, and there is distance between the end portions of the source and drain electrodes 92a to 92c; thus, leakage current or short circuit between the source and drain electrodes can be prevented. In addition, since the end portions of the source and drain electrodes 92a to 92c are not aligned with those of the source and drain regions 88, an electric field is not concentrated at the end portions of the source and drain electrodes 92a to 92c and the source and drain regions 88; thus, leakage current between the gate electrode 51 and the source and drain electrodes 92a to 92c can be prevented. Accordingly, a thin film transistor with high reliability and high withstand voltage can be manufactured.

Through the above process, a thin film transistor 83 can be formed. The thin film transistor can be formed using two photomasks.

Figure 11A:
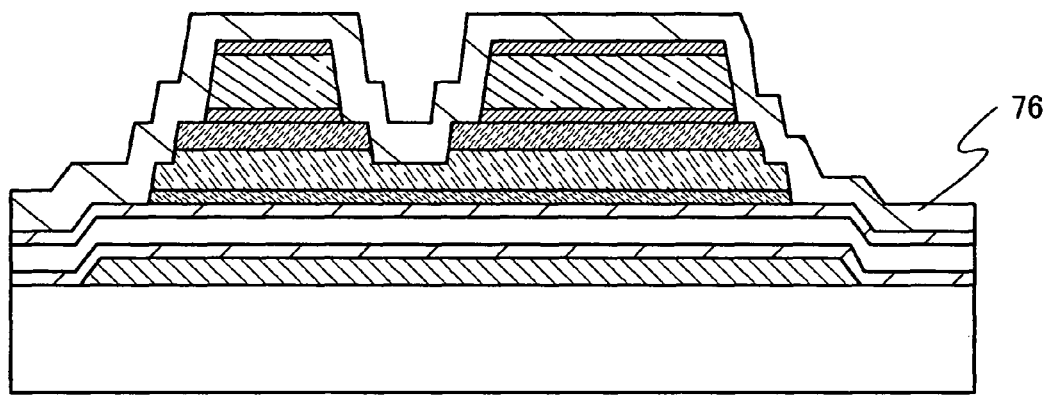
FIGS. 11A and 11B are cross-sectional views illustrating a manufacturing process of the present invention.
Figure 11B:
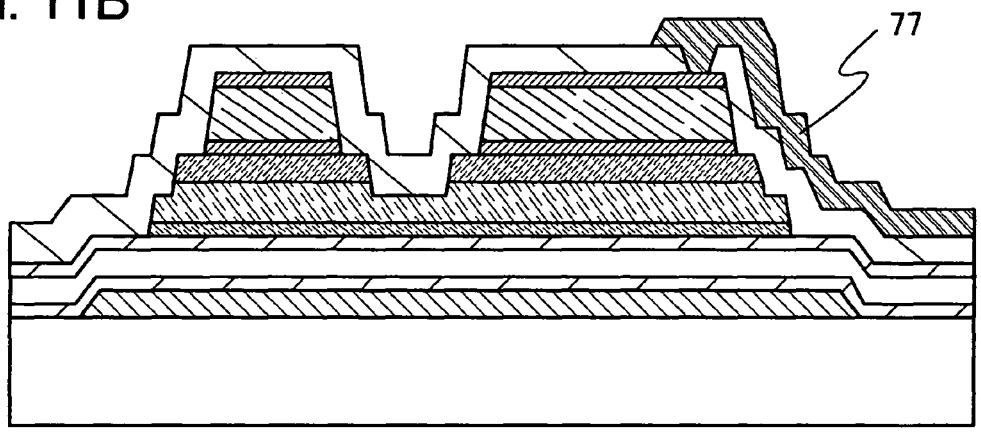

Next, as shown in FIG. 11A, an insulating film 76 is formed over the source and drain electrodes 92a to 92c, the source and drain regions 88, the buffer layer 87, the microcrystalline semiconductor film 90, and the gate insulating film 52c. The insulating film 76 can be formed by the same method as that of the gate insulating films 52a to 52c.

Next, a contact hole is formed in the insulating film 76 by partially etching the insulating film 76 using a resist mask formed using a third photomask. Then, a pixel electrode 77 that is in contact with the source or drain electrode 92c through the contact hole is formed. In this embodiment mode, the pixel electrode 77 is formed as follows: an indium tin oxide film is formed by a sputtering method; a resist is applied over the indium tin oxide film; the resist is exposed to light and developed using a fourth photomask, thereby forming a resist mask; and then, the indium tin oxide film is etched using the resist mask. Note that FIG. 11B corresponds to a cross-sectional view taken along a line A-B in FIG. 12C.

In this manner, an element substrate which can be used for a display device can be formed using a multi-tone mask to reduce the number of masks.

In addition, this embodiment mode can be combined with any of Embodiment Modes 1 to 3 as appropriate.

(Embodiment Mode 5)

In this embodiment mode, a liquid crystal display device including the thin film transistor described in Embodiment Mode 1 will be described below as one mode of the display device.

First, a vertical alignment (VA) liquid crystal display device is described. The VA liquid crystal display device is a kind of form in which alignment of liquid crystal molecules of a liquid crystal panel is controlled. The VA liquid crystal display device is a form in which liquid crystal molecules are vertical to a panel surface when voltage is not applied. In particular, in this embodiment mode, it is devised that a pixel is divided into several regions (sub-pixels) so that liquid crystal molecules are aligned in a different direction in each region. This is referred to as domain multiplication or multi-domain design. In the following description, a liquid crystal display device with multi-domain design is described.

Figure 13:
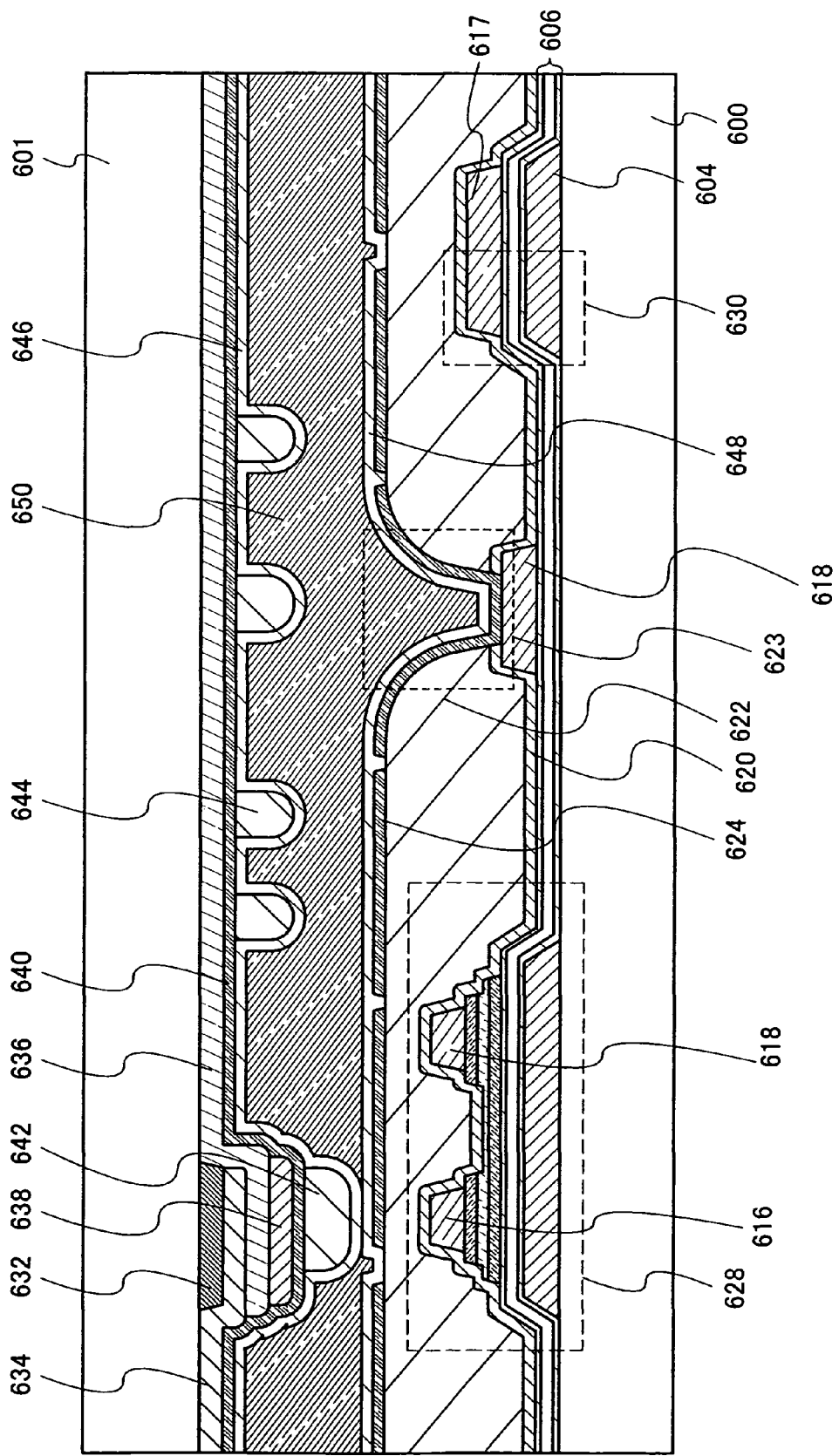
FIG. 13 is a view illustrating one example of a liquid crystal display device.
Figure 14:
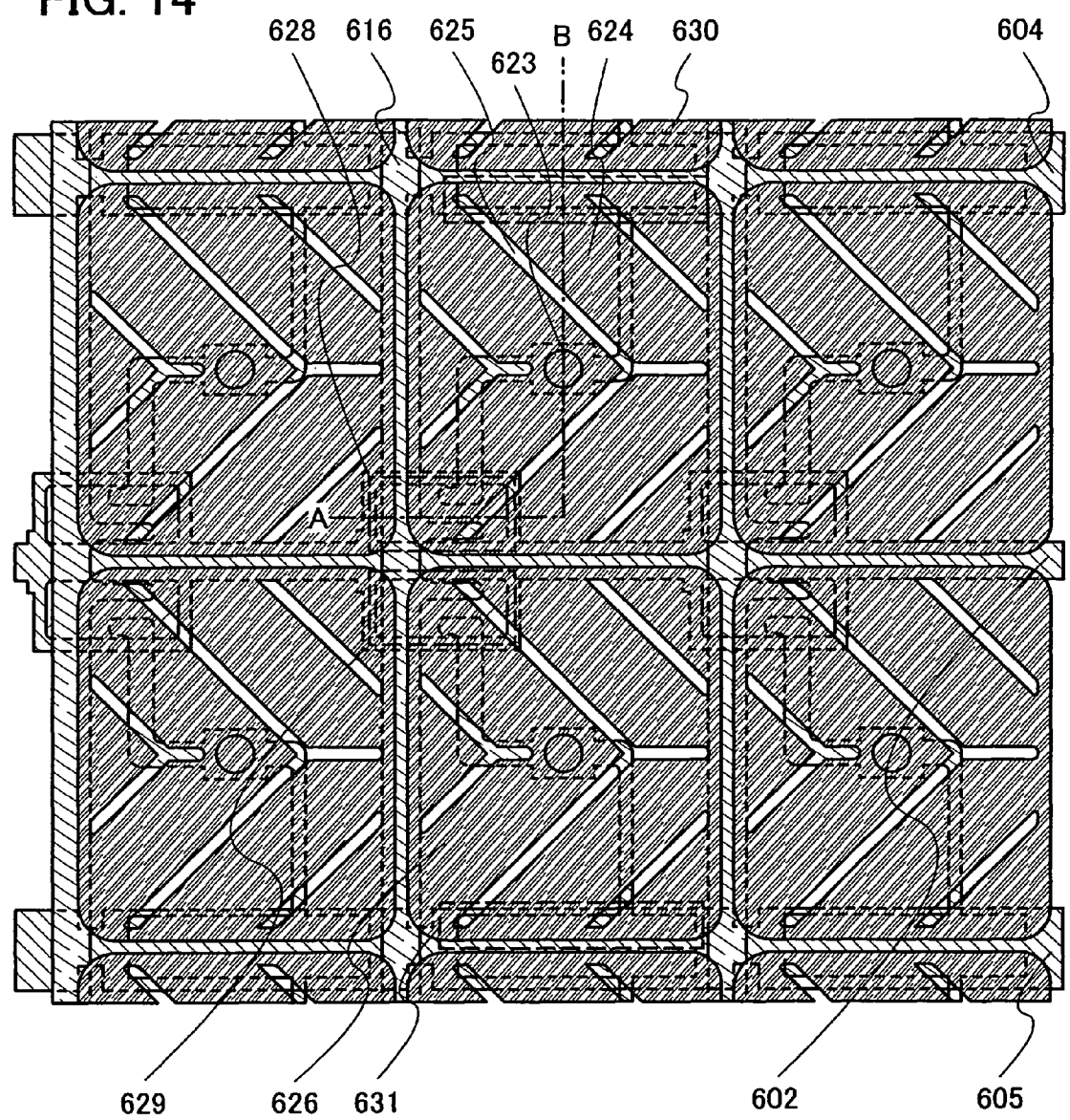
FIG. 14 is a view illustrating one example of a liquid crystal display device.
Figure 15:
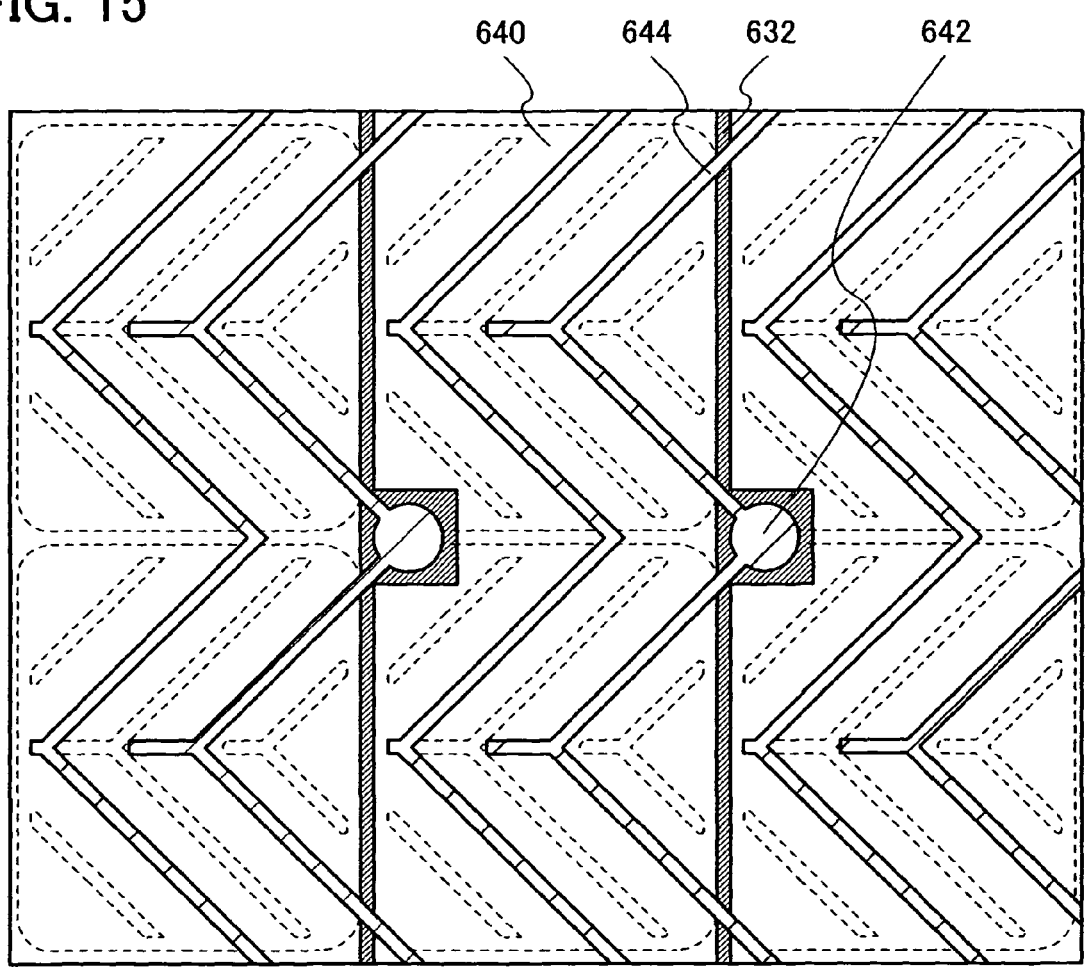
FIG. 15 is a view illustrating one example of a liquid crystal display device.

FIG. 14 and FIG. 15 show a pixel electrode and a counter electrode, respectively. FIG. 14 is a plan view of a side of a substrate on which the pixel electrode is formed. FIG. 13 shows a cross-sectional structure along a line A-B in FIG. 14. FIG. 15 is a plan view of a side of a substrate on which the counter electrode is formed. Hereinafter, description is made with reference to these drawings.

FIG. 13 illustrates a state in which a substrate 600 provided with a TFT 628, a pixel electrode 624 connected to the TFT 628, and a storage capacitor portion 630 overlaps with a counter substrate 601 provided with a counter electrode 640 and the like, and liquid crystal is injected therebetween.

At the position where the counter substrate 601 is provided with a spacer 642, a light-blocking film 632, a first color film 634, a second color film 636, a third color film 638, and the counter electrode 640 are formed. With this structure, the height of a projection 644 for controlling alignment of the liquid crystal and the height of the spacer 642 vary. An alignment film 648 is formed over the pixel electrode 624. Similarly, the counter electrode 640 is provided with an alignment film 646. A liquid crystal layer 650 is formed between the alignment films 646 and 648.

Although a columnar spacer is used for the spacer 642 in this embodiment mode, bead spacers may also be dispersed. Further, the spacer 642 may be formed over the pixel electrode 624 provided over the substrate 600.

The TFT 628, the pixel electrode 624 connected to the TFT 628, and the storage capacitor portion 630 are formed over the substrate 600. The pixel electrode 624 is connected to a wiring 618 via a contact hole 623 which penetrates an insulating film 620 which covers the TFT 628, the wiring 618, and the storage capacitor portion 630 and also penetrates a third insulating film 622 which covers the insulating film 620. The thin film transistor described in Embodiment Mode 1 can be used as the TFT 628 as appropriate. The storage capacitor portion 630 includes a first capacitor wiring 604 which is formed in a similar manner to a gate wiring 602 of the TFT 628, a gate insulating film 606, and a second capacitor wiring 617 which is formed in a similar manner to a wiring 616 and the wiring 618.

A liquid crystal element is formed by overlapping of the pixel electrode 624, the liquid crystal layer 650, and the counter electrode 640.

FIG. 14 shows a structure over the substrate 600. The pixel electrode 624 is formed using the material described in Embodiment Mode 1. The pixel electrode 624 is provided with a slit 625. The slit 625 is for controlling alignment of the liquid crystal.

A TFT 629, a pixel electrode 626 connected to the TFT 629, and a storage capacitor portion 631 shown in FIG. 14 can be formed in a similar manner to the TFT 628, the pixel electrode 624, and the storage capacitor portion 630, respectively. Both the TFT 628 and the TFT 629 are connected to the wiring 616. A pixel of this liquid crystal panel includes the pixel electrodes 624 and 626. Each of the pixel electrodes 624 and 626 is in a sub-pixel.

FIG. 15 shows a structure of the counter substrate side. The counter electrode 640 is formed over the light-blocking film 632. The counter electrode 640 is preferably formed using a material similar to that of the pixel electrode 624. The projection 644 for controlling alignment of the liquid crystal is formed over the counter electrode 640. Moreover, the spacer 642 is formed corresponding to the position of the light-blocking film 632.

Figure 16:
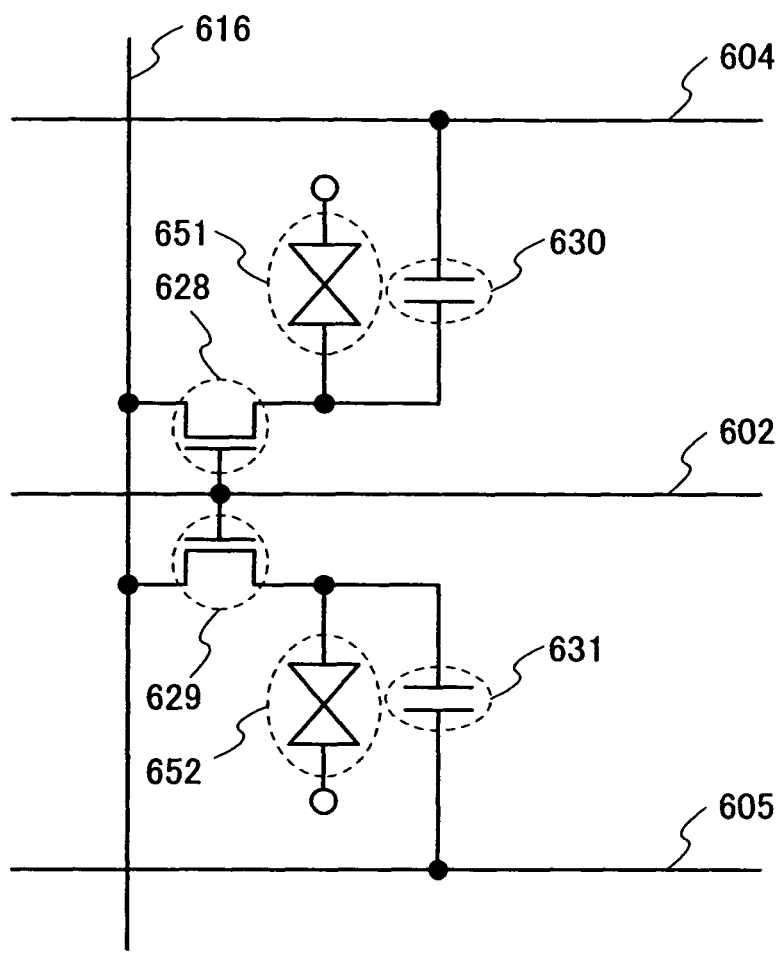
FIG. 16 is a diagram illustrating one example of a liquid crystal display device.

FIG. 16 shows an equivalent circuit of this pixel structure. Both the TFT 628 and the TFT 629 are connected to the gate wiring 602 and the wiring 616. In this case, when potentials of the capacitor wiring 604 and a capacitor wiring 605 are different from each other, operations of liquid crystal elements 651 and 652 can vary. That is, alignment of the liquid crystal is precisely controlled and a viewing angle is increased by individual control of potentials of the capacitor wirings 604 and 605.

When voltage is applied to the pixel electrode 624 provided with the slit 625, electric field distortion (an oblique electric field) is generated near the slit 625. The slit 625 and the projection 644 on the counter substrate 601 side are alternately arranged in an engaging manner and thus, an oblique electric field is effectively generated to control alignment of the liquid crystal, so that a direction of alignment of the liquid crystal varies depending on location. That is, a viewing angle of the liquid crystal panel is increased by domain multiplication.

Next, another VA liquid crystal display device, which is different from the above-described device, is described with reference to FIG. 17, FIG. 18, FIG. 19, and FIG. 20.

Figure 17:
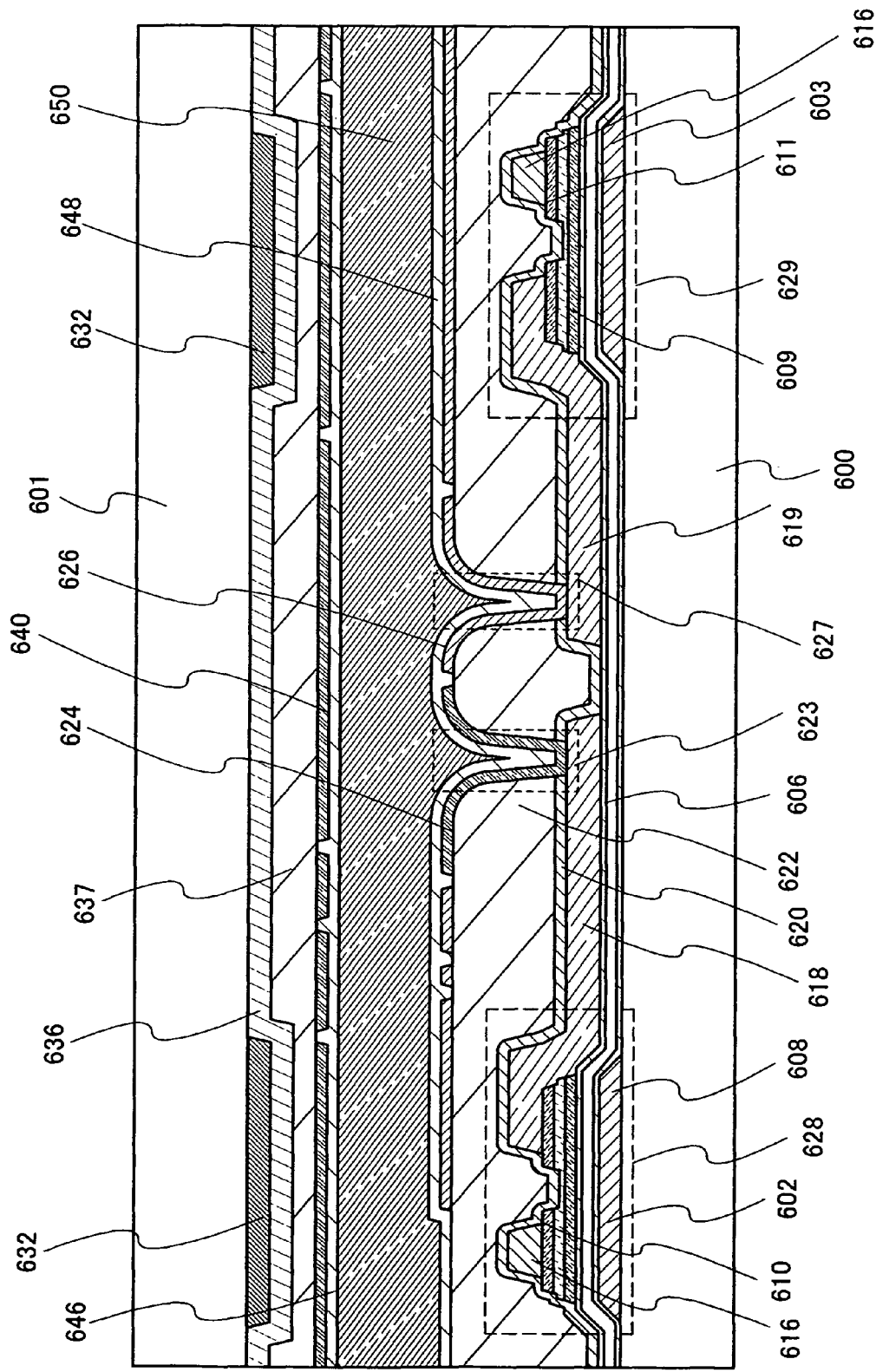
FIG. 17 is a view illustrating one example of a liquid crystal display device.
Figure 18:
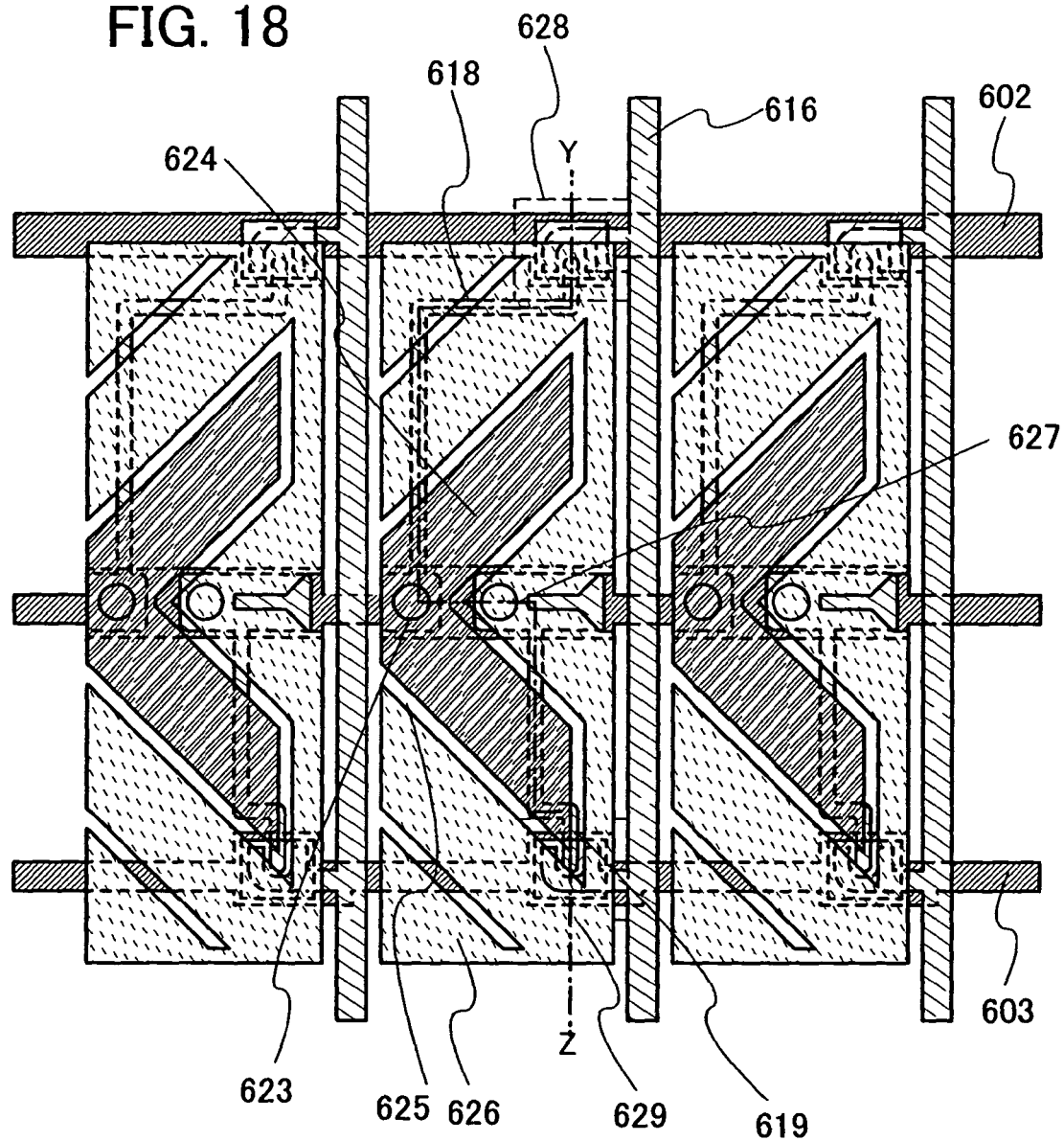
FIG. 18 is a view illustrating one example of a liquid crystal display device.

FIG. 17 and FIG. 18 each show a pixel structure of the VA liquid crystal panel. FIG. 18 is a plan view of the substrate 600. FIG. 17 shows a cross-sectional structure along a line Y-Z in FIG. 18. Hereinafter, description is made with reference to these drawings.

In this pixel structure, a plurality of pixel electrodes is included in one pixel, and a TFT is connected to each pixel electrode. Each TFT is driven by a different gate signal. That is, a multi-domain pixel has a structure in which a signal supplied to each pixel electrode is individually controlled.

Via a contact hole 623, a pixel electrode 624 is connected to a TFT 628 through a wiring 618. Via a contact hole 627, a pixel electrode 626 is connected to a TFT 629 through a wiring 619. A gate wiring 602 of the TFT 628 and a gate wiring 603 of the TFT 629 are separated so that different gate signals can be given thereto. In contrast, a wiring 616 functioning as a data line is used in common for the TFTs 628 and 629. As each of the TFTs 628 and 629, the thin film transistor described in Embodiment Mode 1 can be used as appropriate.

Figure 20:
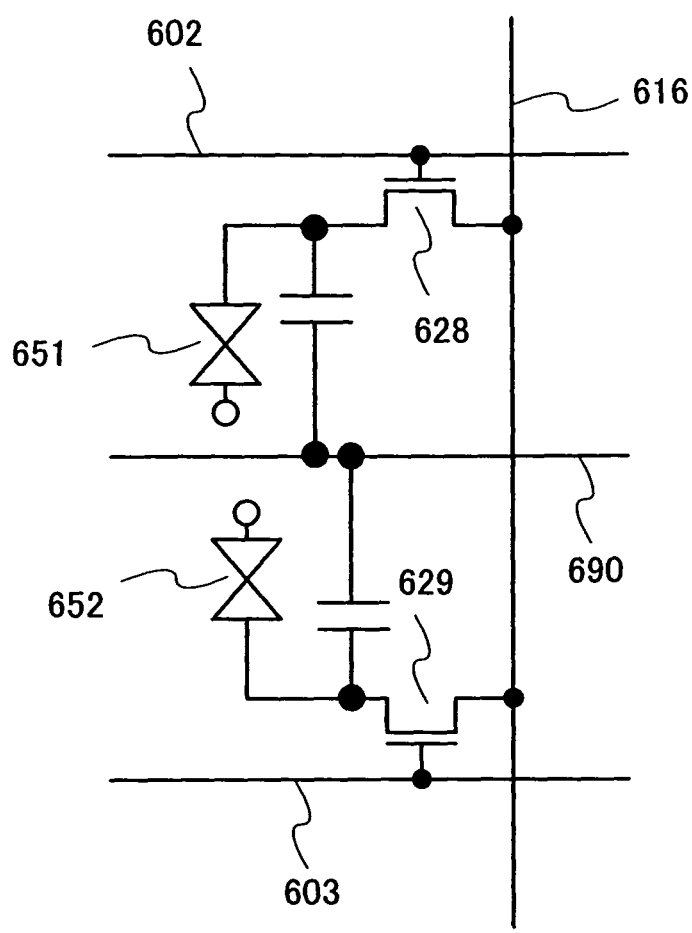
FIG. 20 is a diagram illustrating one example of a liquid crystal display device.

The pixel electrodes 624 and 626 have different shapes and are separated by a slit 625. The pixel electrode 626 is formed so as to surround the external side of the pixel electrode 624 which is spread in a V-shape. Timing of voltage application is made to vary between the pixel electrodes 624 and 626 by the TFTs 628 and 629 in order to control alignment of the liquid crystal. FIG. 20 shows an equivalent circuit of this pixel structure. The TFT 628 is connected to the gate wiring 602. The TFT 629 is connected to the gate wiring 603. When different gate signals are supplied to the gate wirings 602 and 603, operation timings of the TFTs 628 and 629 can vary.

Figure 19:
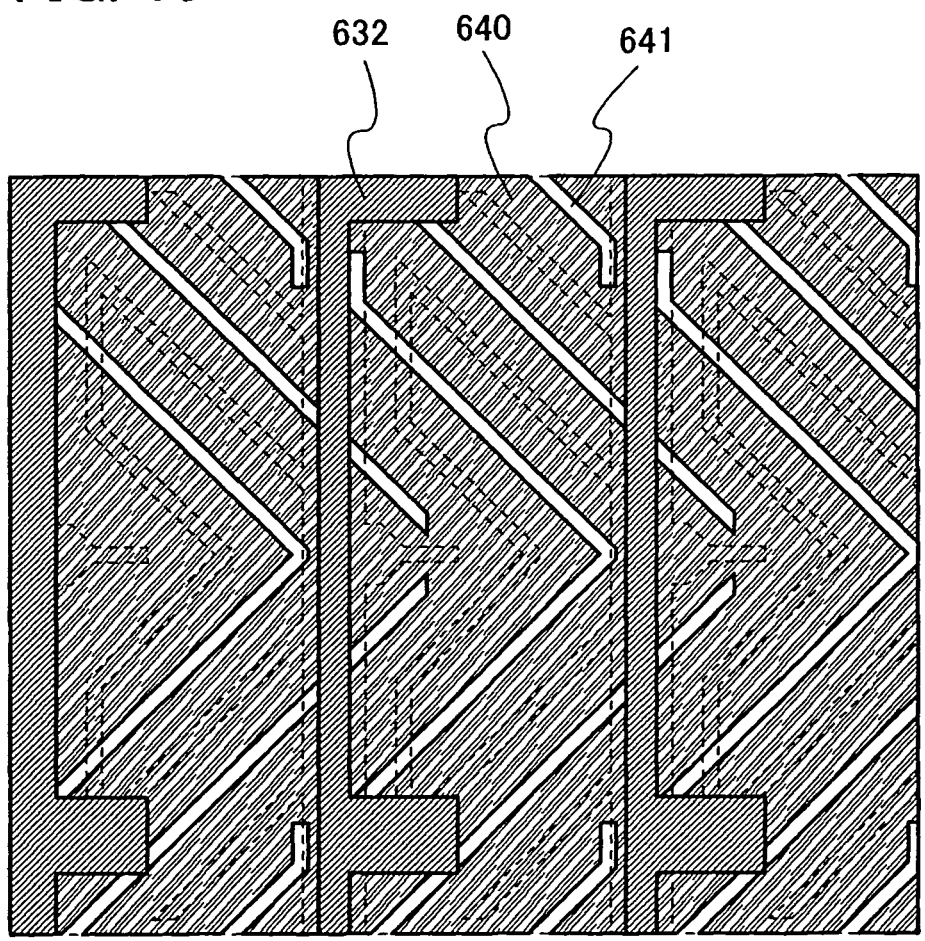
FIG. 19 is a view illustrating one example of a liquid crystal display device.

A counter substrate 601 is provided with a light-blocking film 632, a color film 636, and a counter electrode 640. Moreover, a planarization film 637 is formed between the color film 636 and the counter electrode 640 to prevent alignment disorder of the liquid crystal. FIG. 19 shows a structure of the counter substrate side. A slit 641 is formed in the counter electrode 640, which is used in common between different pixels. The slit 641 and the slit 625 on the pixel electrodes 624 and 626 side are alternately arranged in an engaging manner; thus, an oblique electric field is effectively generated, and alignment of the liquid crystal can be controlled. Accordingly, a direction in which the liquid crystal is aligned can vary depending on location, and a viewing angle is increased.

A first liquid crystal element is formed by overlapping of the pixel electrode 624, a liquid crystal layer 650, and the counter electrode 640. A second liquid crystal element is formed by overlapping of the pixel electrode 626, the liquid crystal layer 650, and the counter electrode 640. This is a multi-domain structure in which the first liquid crystal element and the second liquid crystal element are included in one pixel.

Next, a horizontal electric field liquid crystal display device is described. The horizontal electric field mode is a method in which an electric field is horizontally applied to liquid crystal molecules in a cell, whereby the liquid crystal is driven to express a gray scale. By this method, a viewing angle can be increased to approximately 180 degrees. Hereinafter, a liquid crystal display device employing the horizontal electric field mode is described.

Figure 21:
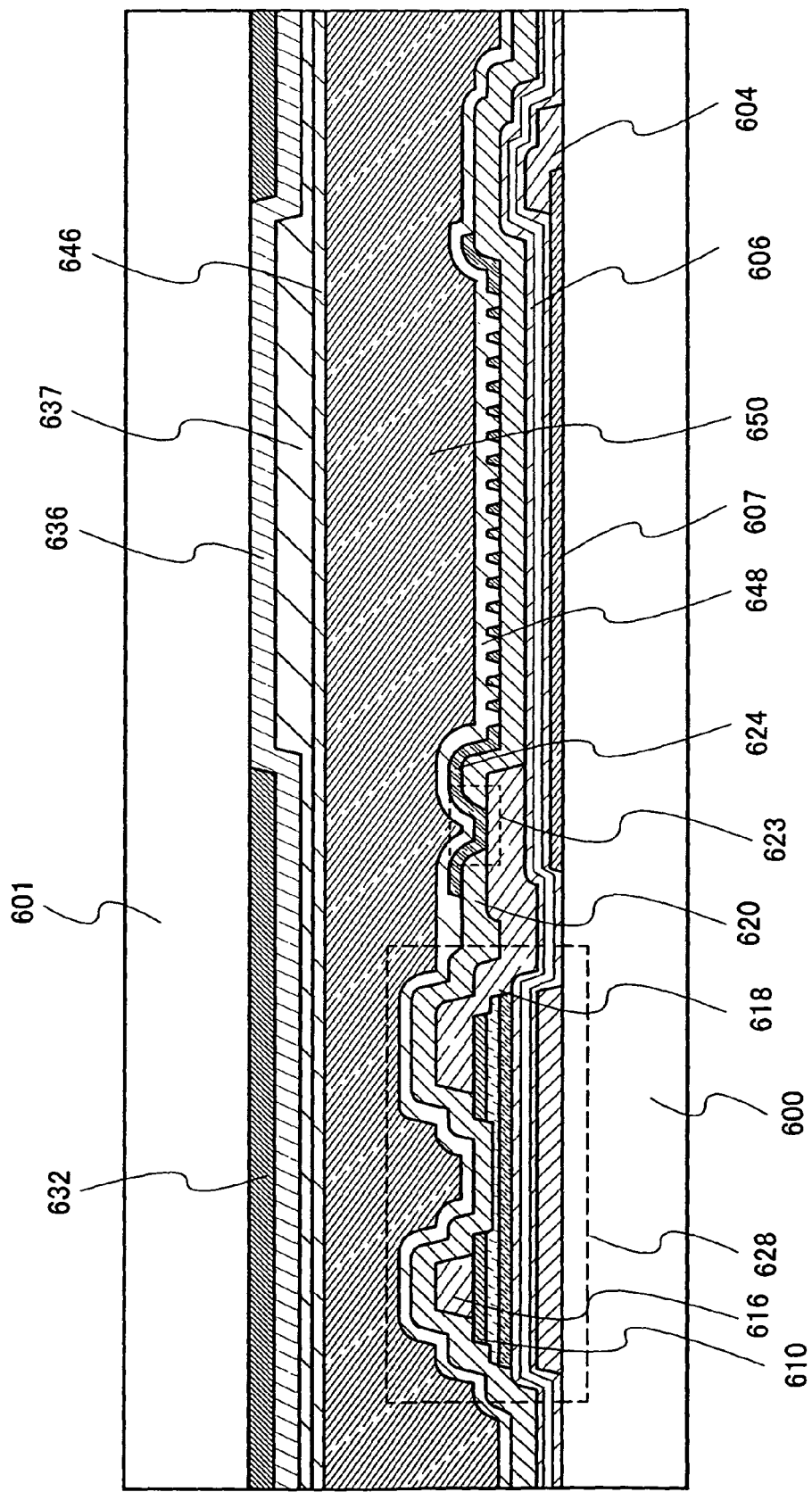
FIG. 21 is a view illustrating one example of a liquid crystal display device.

FIG. 21 illustrates a state in which a substrate 600 provided with a TFT 628 and a first pixel electrode 624 connected to the TFT 628 overlaps with a counter substrate 601, and liquid crystal is injected therebetween. The counter substrate 601 is provided with a light-blocking film 632, a color film 636, a planarization film 637, and the like. The first pixel electrode 624 is provided on the substrate 600 side, and it is not provided on the counter substrate 601 side. A liquid crystal layer 650 is formed between the substrate 600 and the counter substrate 601.

A second pixel electrode 607, a capacitor wiring 604 connected to the second pixel electrode 607, and the TFT 628 described in Embodiment Mode 1 are formed over the substrate 600. The second pixel electrode 607 can be formed using a material similar to that of the pixel electrode 77 described in Embodiment Mode 1. The second pixel electrode 607 is formed in a shape which is compartmentalized roughly in a pixel shape. Note that a gate insulating film 606 is formed over the second pixel electrode 607 and the capacitor wiring 604.

Wirings 616 and 618 of the TFT 628 are formed over the gate insulating film 606. The wiring 616 serves as a data line extending in one direction, through which a video signal is transmitted in a liquid crystal panel, and is connected to a source region and serves as one of a source electrode and a drain electrode. The wiring 618 serves as the other of the source electrode and the drain electrode, and is connected to the second pixel electrode 624.

An insulating film 620 is formed over the wirings 616 and 618. Over the insulating film 620, the first pixel electrode 624 connected to the wiring 618 via a contact hole formed in the insulating film 620 is formed. The first pixel electrode 624 is formed using a material similar to that of the pixel electrode 77 described in Embodiment Mode 1.

In such a manner, the TFT 628 and the first pixel electrode 624 connected to the TFT 628 are formed over the substrate 600. Note that a storage capacitor is formed between the first pixel electrode 624 and the second pixel electrode 607.

Figure 22:
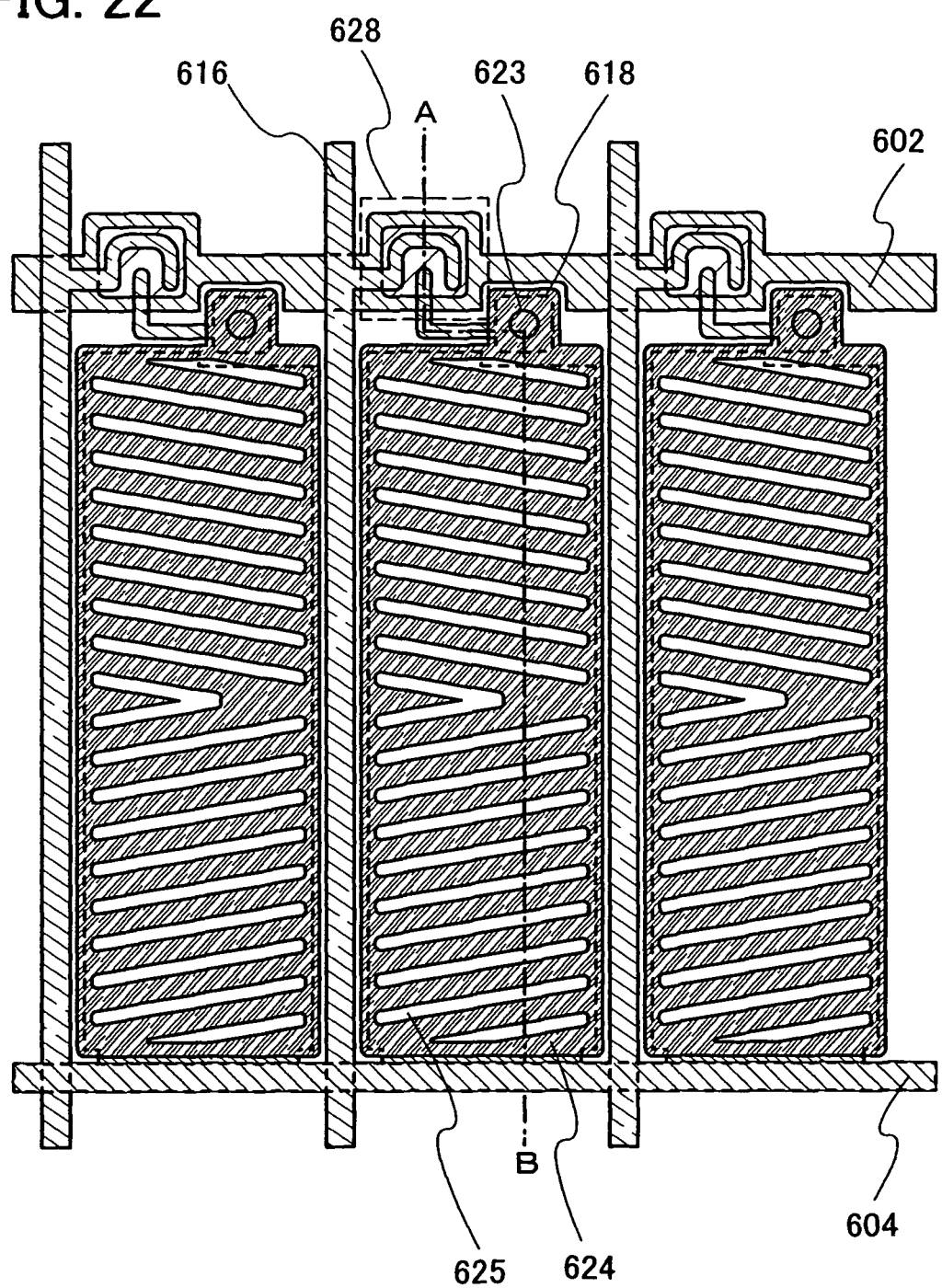
FIG. 22 is a view illustrating one example of a liquid crystal display device.

FIG. 22 is a plan view illustrating a structure of the pixel electrode. The pixel first electrode 624 is provided with a slit 625. The slit 625 is for controlling alignment of the liquid crystal. In this case, an electric field is generated between the first pixel electrode 624 and the second pixel electrode 607. The thickness of the gate insulating film 606 formed between the first pixel electrode 624 and the second pixel electrode 607 is 50 nm to 200 nm, which is thin enough compared to the liquid crystal layer with a thickness of 2 μm to 10 μm. Accordingly, an electric field is generated substantially in parallel (in a horizontal direction) to the substrate 600. Alignment of the liquid crystal is controlled by the electric field. The liquid crystal molecules are horizontally rotated using the electric field which is approximately parallel to the substrate. In this case, since the liquid crystal molecules are parallel to the substrate in any state, contrast or the like is less affected by change in angle of viewing, and a viewing angle is increased. Further, since both the first pixel electrode 624 and the second pixel electrode 607 are light-transmitting electrodes, an aperture ratio can be increased.

Next, another example of a horizontal electric field liquid crystal display device is described.

Figure 23:
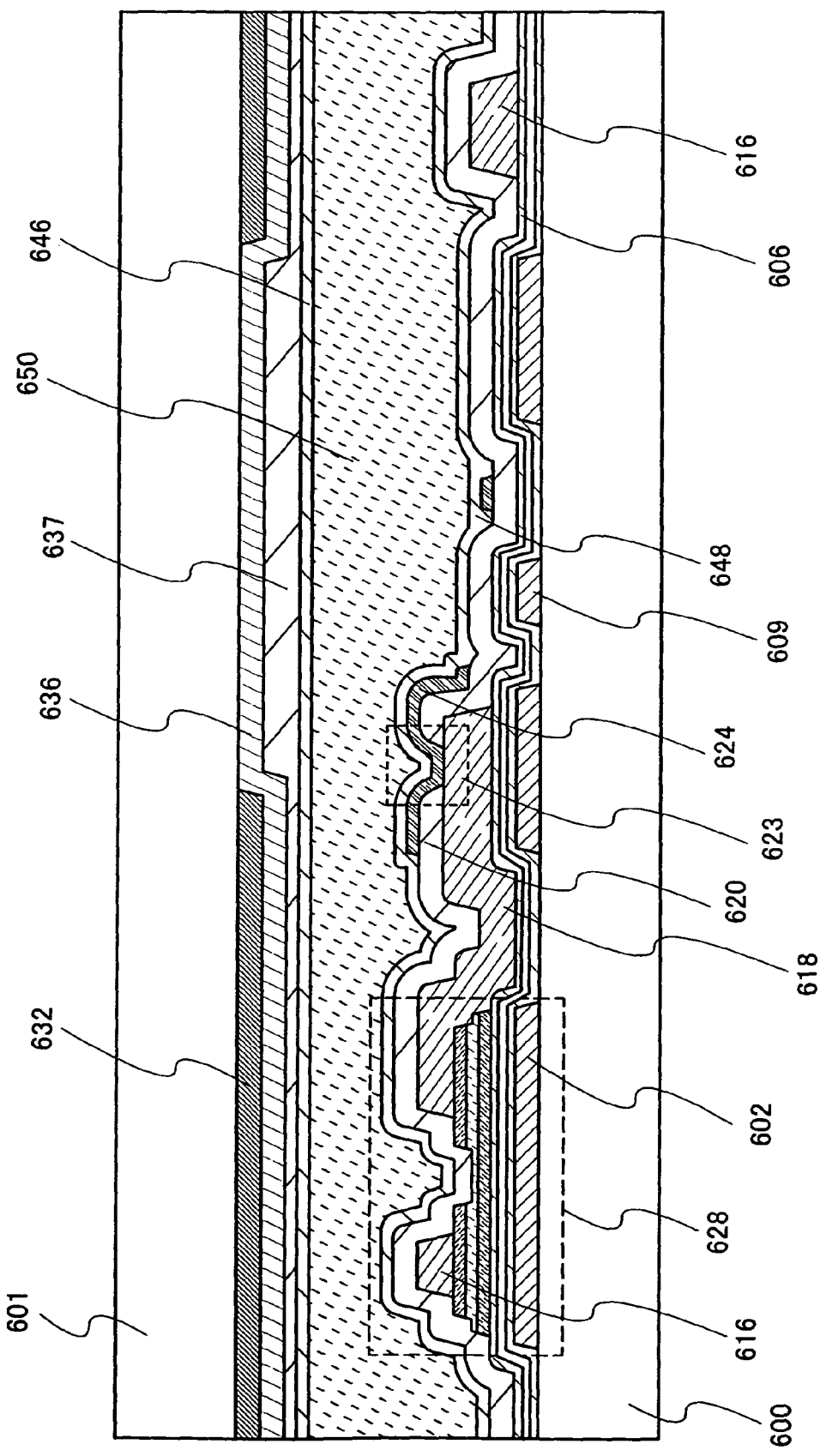
FIG. 23 is a view illustrating a liquid crystal display device of the present invention.
Figure 24:
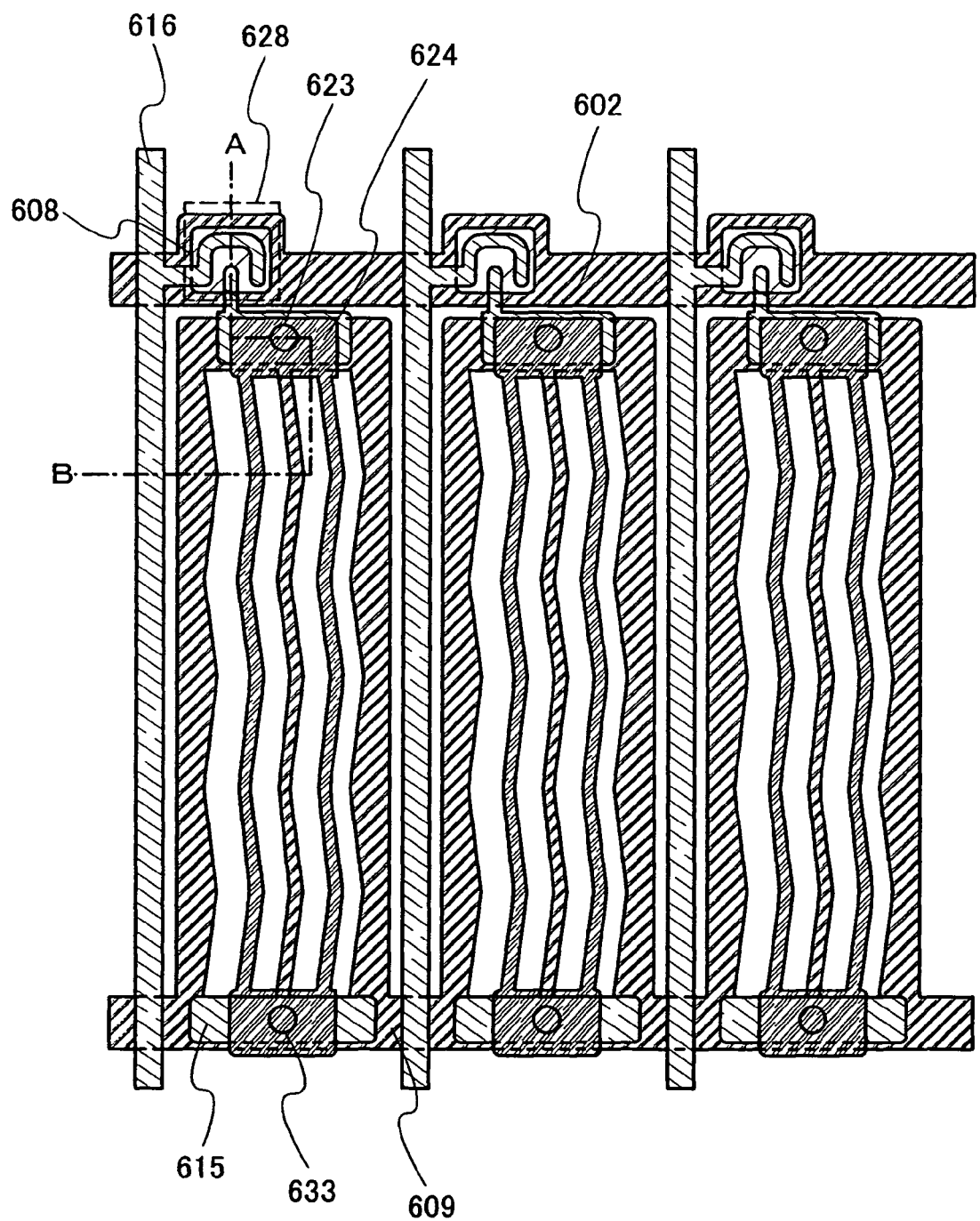
FIG. 24 is a view illustrating a liquid crystal display device of the present invention.

FIG. 23 and FIG. 24 each show a pixel structure of an in-plane switching (IPS) liquid crystal display device. FIG. 24 is a plan view. FIG. 23 shows a cross-sectional structure along a line A-B in FIG. 24. Hereinafter, description is made with reference to these drawings.

FIG. 23 illustrates a state in which a substrate 600 provided with a TFT 628 and a pixel electrode 624 connected to the TFT 628 overlaps with a counter substrate 601, and liquid crystal is injected therebetween. The counter substrate 601 is provided with a light-blocking film 632, a color film 636, a planarization film 637, and the like. The pixel electrode 624 is provided on the substrate 600 side, and it is not provided on the counter substrate 601 side. A liquid crystal layer 650 is formed between the substrate 600 and the counter substrate 601.

A common potential line 609 and the TFT 628 described in Embodiment Mode 1 are formed over the substrate 600. The common potential line 609 can be formed at the same time as a gate wiring 602 of the TFT 628. The pixel electrode 624 is formed in a shape which is compartmentalized roughly in a pixel shape.

Wirings 616 and 618 of the TFT 628 are formed over a gate insulating film 606. The wiring 616 serves as a data line extending in one direction, through which a video signal is transmitted in a liquid crystal panel, and is connected to the source region and serves as one of a source electrode and a drain electrode. The wiring 618 serves as the other of the source electrode and the drain electrode, and is connected to the pixel electrode 624.

An insulating film 620 is formed over the wirings 616 and 618. Over the insulating film 620, the pixel electrode 624 connected to the wiring 618 via a contact hole 623 formed in the insulating film 620 is formed. The pixel electrode 624 is formed using a material similar to that of the pixel electrode 77 described in Embodiment Mode 1. Note that as shown in FIG. 24, the pixel electrode 624 is formed so as to generate a horizontal electric field with a comb-shaped electrode which is formed at the same time as the common potential line 609. Moreover, the pixel electrode 624 is formed so that comb-teeth portions of the pixel electrode 624 are alternately engaged with the comb-shaped electrode which is formed at the same time as the common potential line 609.

Alignment of the liquid crystal is controlled by an electric field generated between a potential applied to the pixel electrode 624 and a potential of the common potential line 609. The liquid crystal molecules are horizontally rotated using the electric field which is approximately parallel to the substrate. In this case, since the liquid crystal molecules are parallel to the substrate in any state, contrast or the like is less affected by change in angle of viewing, and a viewing angle is increased.

In such a manner, the TFT 628 and the pixel electrode 624 connected to the TFT 628 are formed over the substrate 600. A storage capacitor is formed by the common potential line 609, a capacitor electrode 615, and the gate insulating film 606 provided therebetween. The capacitor electrode 615 and the pixel electrode 624 are connected via a contact hole 633.

Next, a mode of a TN liquid crystal display device is described.

Figure 25:
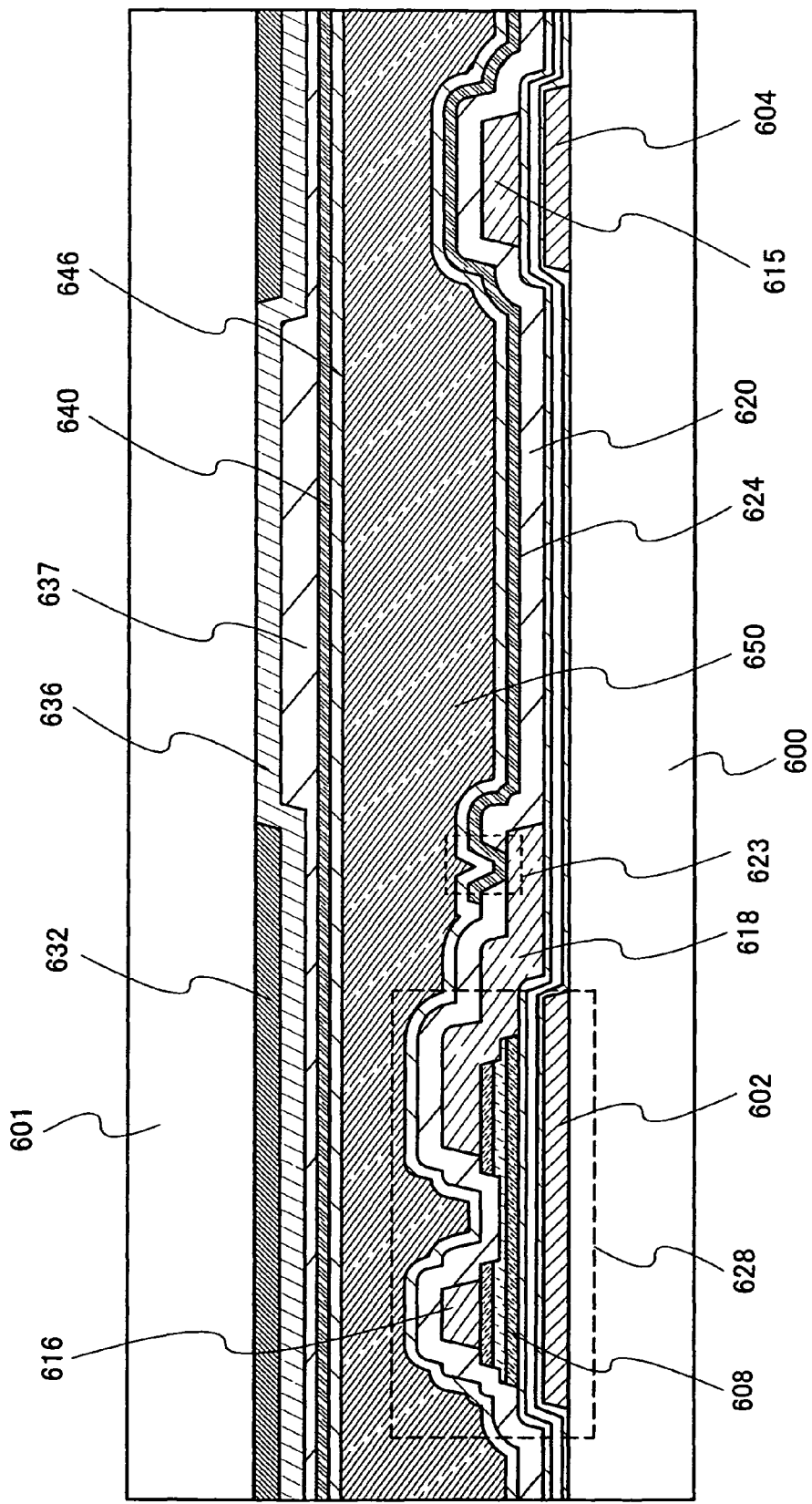
FIG. 25 is a view illustrating one example of a liquid crystal display device.
Figure 26:
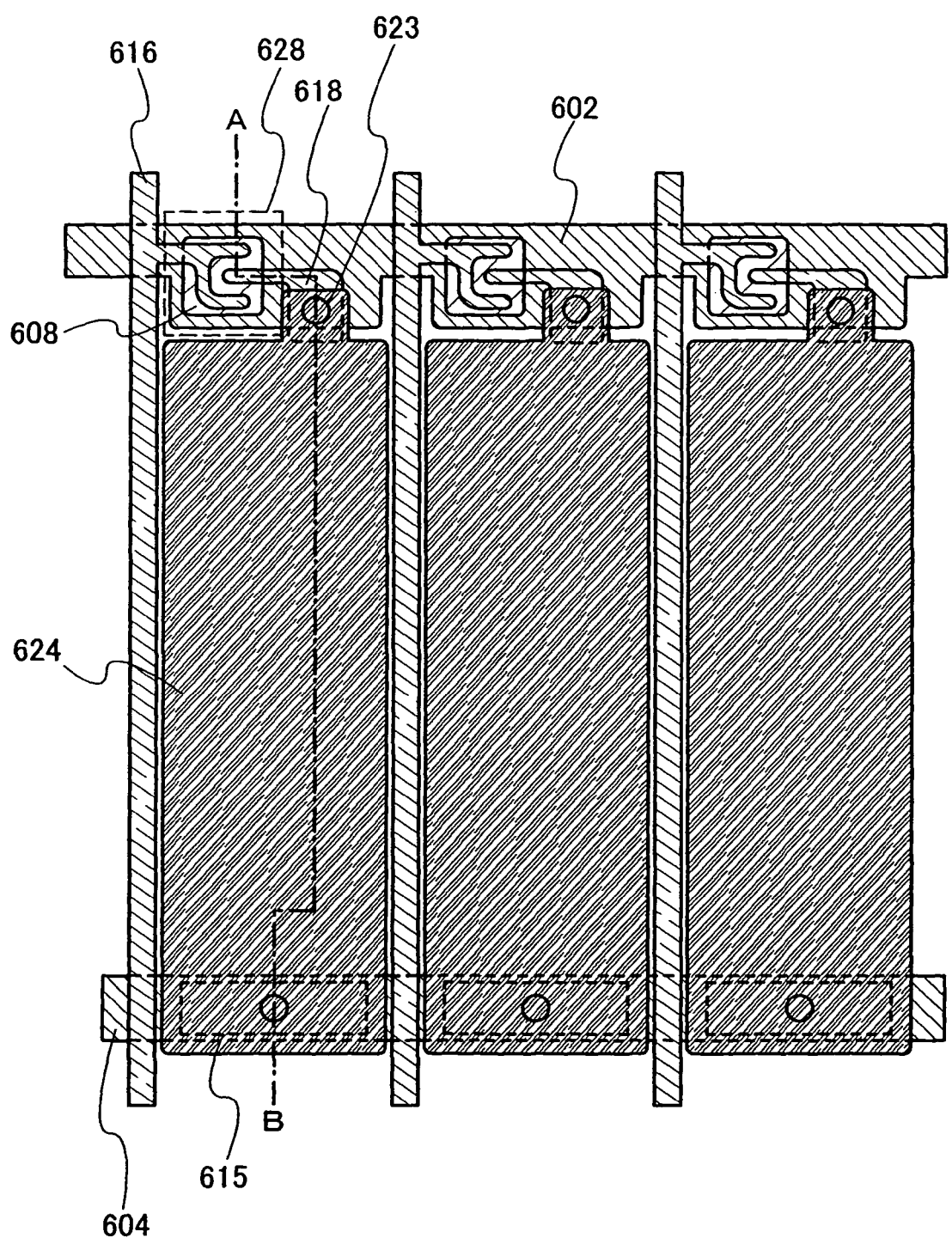
FIG. 26 is a view illustrating one example of a liquid crystal display device.

FIG. 25 and FIG. 26 each show a pixel structure of a TN liquid crystal display device. FIG. 26 is a plan view. FIG. 25 shows a cross-sectional structure along a line A-B in FIG. 26. Hereinafter, description is made with reference to these drawings.

A pixel electrode 624 is connected to a TFT 628 by a wiring 618 via a contact hole 623. A wiring 616 functioning as a data line is connected to the TFT 628. As the TFT 628, any of the TFTs described in Embodiment Mode 1 can be used.

The pixel electrode 624 is formed using a material similar to that of the pixel electrode 77 described in Embodiment Mode 1.

A counter substrate 601 is provided with the light-blocking film 632, a color film 636, and a counter electrode 640. A planarization film 637 is formed between the color film 636 and the counter electrode 640 to prevent alignment disorder of liquid crystal. A liquid crystal layer 650 is formed between the pixel electrode 624 and the counter electrode 640.

A liquid crystal element is formed by overlapping of the pixel electrode 624, the liquid crystal layer 650, and the counter electrode 640.

A substrate 600 or the counter substrate 601 may be provided with a color filter, a blocking film (a black matrix) for preventing disclination, or the like. Further, a polarizing plate is attached to a surface of the substrate 600, which is opposite to a surface on which the thin film transistor is formed. Moreover, a polarizing plate is attached to a surface of the counter substrate 601, which is opposite to a surface on which the counter electrode 640 is formed.

The counter electrode 640 can be formed using a material similar to that of the pixel electrode 624. The liquid crystal element is formed by overlapping of the pixel electrode 624, the liquid crystal layer 650, and the counter electrode 640.

Through the above-described steps, the liquid crystal display device can be formed. Since a thin film transistor with small off current, high electric characteristics, and high reliability is used in the liquid crystal display device of this embodiment mode, the liquid crystal display device has high contrast and high visibility.

(Embodiment Mode 6)

In this Embodiment Mode, a light-emitting device which is one mode of the display device will be described with reference to FIGS. 9A and 9B, FIGS. 10A to 10C, FIGS. 11A and 11B, FIGS. 27A and 27B, and FIGS. 28A to 28C. A light-emitting device, in which a light-emitting element utilizing electroluminescence is used, is described here. Light-emitting elements utilizing electroluminescence are classified according to whether a light-emitting material is an organic compound or an inorganic compound. In general, the former is referred to as organic EL elements and the latter as inorganic EL elements.

In an organic EL element, by application of voltage to a light-emitting element, electrons and holes are separately injected from a pair of electrodes into a layer containing a light-emitting organic compound, and current flows. Then, recombination of these carriers (the electrons and holes) causes the light-emitting organic compound to be in an excited state and to emit light when it returns from the excited state to a ground state. Due to such a mechanism, such a light-emitting element is referred to as a current-excitation light-emitting element.

Inorganic EL elements are classified into a dispersion type inorganic EL element and a thin-film type inorganic EL element, depending on their element structures. A dispersion type inorganic EL element has a light-emitting layer where particles of a light-emitting material are dispersed in a binder, and its light emission mechanism is donor-acceptor recombination type light emission that utilizes a donor level and an acceptor level. A thin-film type inorganic EL element has a structure in which a light-emitting layer is sandwiched between dielectric layers, which are further sandwiched between electrodes, and its light emission mechanism is localized type light emission that utilizes inner-shell electron transition of metal ions. Note that description is made here using an organic EL element as a light-emitting element. In addition, description is made using the thin film transistor described in Embodiment Mode 1 as a thin film transistor which controls driving of a light-emitting element. In a light-emitting device in which the thin film transistor obtained according to Embodiment Mode 1 is used, variation in threshold voltage of the thin film transistor can be suppressed and reliability can be improved. In particular, the thin film transistor which is used in the light-emitting device is driven by direct current. Thus, the thin film transistor described in Embodiment Mode 1 having a gate insulating film with a three-layer structure in which a silicon nitride film is formed as a first layer, a silicon oxynitride film is formed as a second layer, and a silicon nitride film is formed as a third layer can suppress a drift of the threshold voltage mainly owing to the silicon oxyntiride film in the second layer.

Figure 27A:
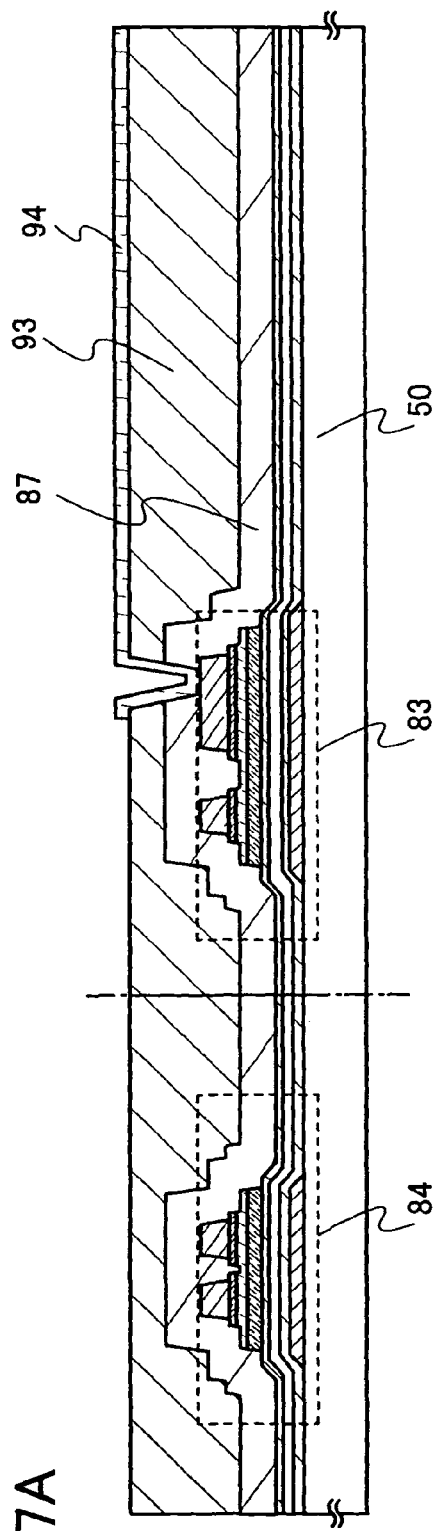
FIGS. 27A and 27B are cross-sectional views illustrating one example of a method for manufacturing a light-emitting device.
Figure 27B:
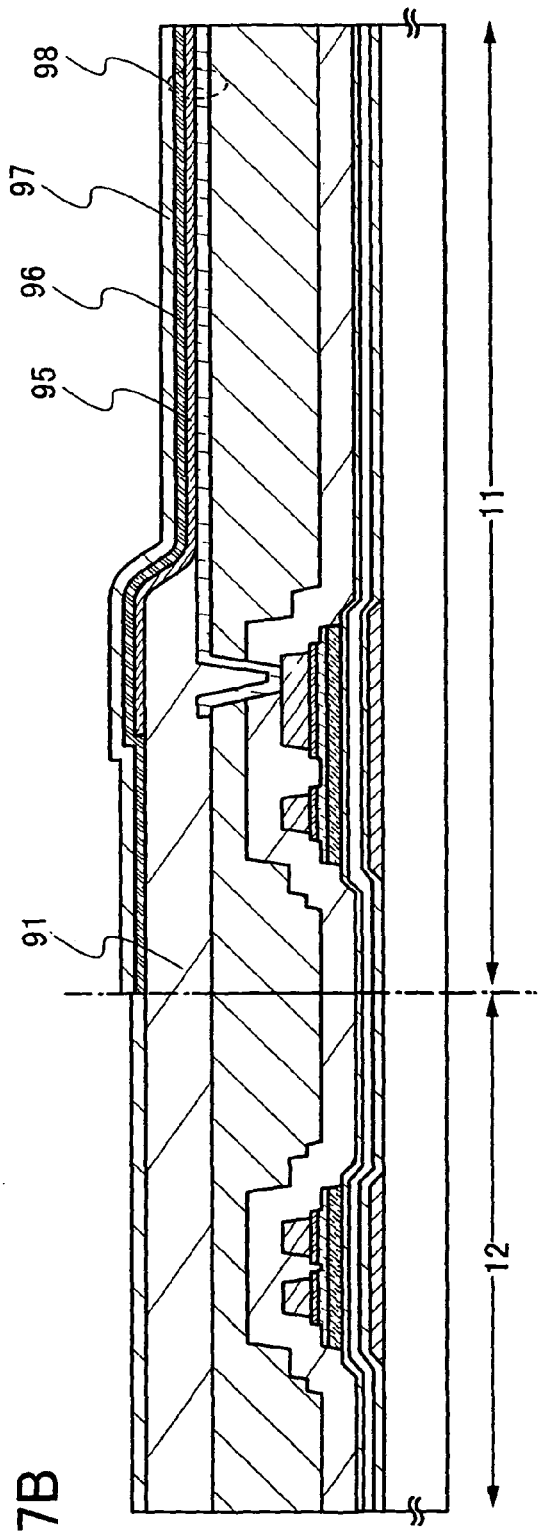

Through the process of FIGS. 9A and 9B, FIGS. 10A to 10C, and FIGS. 11A and 11B, as shown in FIGS. 27A and 27B, a thin film transistor 83 is formed over a substrate 50, and an insulating film 87 functioning as a protective film is formed over the thin film transistor 83. A thin film transistor 84 is formed for a driver circuit 12. The thin film transistor 84 can be formed in the same manufacturing process as the thin film transistor 83 in a pixel portion 11. Next, a planarization film 93 is formed over the insulating film 87, and a pixel electrode 94 connected to a source or drain electrode of the thin film transistor 83 is formed over the planarization film 93.

It is preferable that the planarization film 93 be formed using an organic resin such as acrylic, polyimide, or polyamide, or using siloxane.

In FIG. 27A, the thin film transistor in the pixel portion 11 is an n-type transistor; thus, it is desired that the pixel electrode 94 be a cathode. In contrast, when the thin film transistor is a p-type transistor, it is desired that the pixel electrode 94 be an anode. Specifically, as a cathode, a known material with a low work function, such as calcium, aluminum, calcium fluoride, a magnesium-silver alloy, or a lithium-aluminum alloy, can be used.

Next, as shown in FIG. 27B, a partition 91 is formed over the planarization film 93 and an end portion of the pixel electrode 94. The partition 91 has an opening, through which the pixel electrode 94 is exposed. The partition 91 is formed using an organic resin film, an inorganic insulating film, or organic polysiloxane. It is particularly preferable that the partition be formed using a photosensitive material to have an opening over the pixel electrode so that a sidewall of the opening is formed as a tilted surface with continuous curvature.

Next, a light-emitting layer 95 is formed in contact with the pixel electrode 94 in the opening of the partition 91. The light-emitting layer 95 may be formed using either a single layer or a stacked layer of a plurality of layers.

Then, a common electrode 96 serving as an anode is formed to cover the light-emitting layer 95. The common electrode 96 can be formed of a light-transmitting conductive film using any of the light-transmitting conductive materials listed in Embodiment Mode 1 for the pixel electrode 77. As the common electrode 96, a titanium nitride film or a titanium film may be used in addition to the above-mentioned light-transmitting conductive films. In FIG. 27B, indium tin oxide is used for the common electrode 96. In the opening of the partition 91, a light-emitting element 98 is formed by overlapping of the pixel electrode 94, the light-emitting layer 95, and the common electrode 96. After that, it is preferable that a protective film 97 be formed over the common electrode 96 and the partition 91 so that oxygen, hydrogen, moisture, carbon dioxide, or the like does not enter the light-emitting element 98. As the protective film 97, a silicon nitride film, a silicon nitride oxide film, a DLC film, or the like can be formed.

Furthermore, practically, after the steps to the step of FIG. 27B are completed, it is preferable that packaging (sealing) be performed using a protective film (a laminated film, an ultraviolet curable resin film, or the like), or a cover material having high airtightness and causing less degasification, in order to prevent further exposure to external air.

Next, structures of light-emitting elements are described with reference to FIGS. 28A to 28C. Here, the case where a driving TFT is of n-type is given as an example, and cross-sectional structures of pixels are described.

In a light-emitting element, it is acceptable as long as at least one of an anode and a cathode is transparent in order to extract light emission. There are light-emitting elements having the following structures: a top emission structure in which a thin film transistor and a light-emitting element are formed over a substrate and light is extracted from a side opposite to the substrate; a bottom emission structure in which light is extracted from the substrate side; and a dual emission structure in which light is extracted from both the substrate side and the side opposite to the substrate. The pixel structure of the present invention can be applied to a light-emitting element with any of the emission structures.

A light-emitting element having a top emission structure is described with reference to FIG. 28A.

Figure 28A:
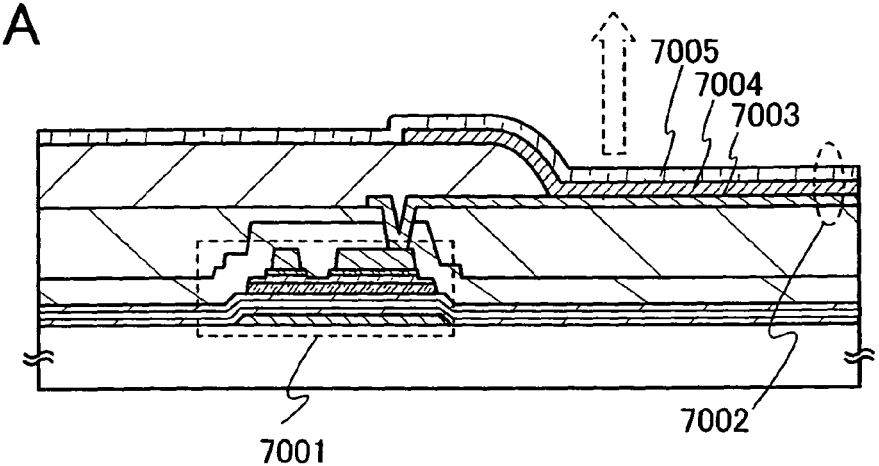
FIGS. 28A to 28C are cross-sectional views each illustrating a pixel which can be applied to a light-emitting device.

FIG. 28A is a cross-sectional view of a pixel in the case where a driving TFT 7001 is of n-type and light is emitted from a light-emitting element 7002 to an anode 7005 side. In FIG. 28A, a cathode 7003 of the light-emitting element 7002 is electrically connected to the driving TFT 7001, and a light-emitting layer 7004 and the anode 7005 are sequentially stacked over the cathode 7003. The cathode 7003 can be formed using any known conductive material as long as it has a low work function and reflects light. For example, calcium, aluminum, calcium fluoride, a magnesium-silver alloy, a lithium-aluminum alloy, or the like is preferable. The light-emitting layer 7004 may be formed using either a single layer or a stacked layer of a plurality of layers. In the case of using a plurality of layers, an electron injection layer, an electron transport layer, a light-emitting layer, a hole transport layer, and a hole injection layer are stacked in this order over the cathode 7003. Note that all of these layers do not always need to be provided. The anode 7005 is formed using a light-transmitting conductive material that transmits light, and for example, a light-transmitting conductive film of indium oxide containing tungsten oxide, indium zinc oxide containing tungsten oxide, indium oxide containing titanium oxide, indium tin oxide containing titanium oxide, indium tin oxide, indium zinc oxide, indium tin oxide to which silicon oxide is added, or the like may be used.

A region where the light-emitting layer 7004 is sandwiched between the cathode 7003 and the anode 7005 corresponds to the light-emitting element 7002. In the case of the pixel shown in FIG. 28A, light is emitted from the light-emitting element 7002 to the anode 7005 side as indicated by an outlined arrow.

Next, a light-emitting element having a bottom emission structure is described with reference to FIG. 28B. FIG. 28B is a cross-sectional view of a pixel in the case where a driving TFT 7011 is of n-type and light is emitted from a light-emitting element 7012 to a cathode 7013 side. In FIG. 28B, the cathode 7013 of the light-emitting element 7012 is formed over a light-transmitting conductive material 7017 which is electrically connected to the driving TFT 7011, and a light-emitting layer 7014 and an anode 7015 are sequentially stacked over the cathode 7013. Note that, in the case where the anode 7015 has a light-transmitting property, a blocking film for reflecting or blocking light may be formed to cover the anode. As in FIG. 28A, the cathode 7013 can be formed using any known conductive material as long as it has a low work function. Note that the thickness of the cathode 7013 is set such that light is transmitted therethrough (preferably, about 5 nm to 30 nm). For example, an Al film with a thickness of 20 nm can be used as the cathode 7013. As in FIG. 28A, the light-emitting layer 7014 may be formed using either a single layer or a stacked layer of a plurality of layers. Although the anode 7015 does not need to be able to transmit light, as in FIG. 28A, it can be formed using a light-transmitting conductive material. The blocking film can be formed using, for example, a metal which reflects light, or the like; however, the blocking film is not limited to a metal film. For example, a resin to which black colorant is added can also be used.

A region where the light-emitting layer 7014 is sandwiched between the cathode 7013 and the anode 7015 corresponds to the light-emitting element 7012. In the case of the pixel shown in FIG. 28B, light is emitted from the light-emitting element 7012 to the cathode 7013 side as indicated by an outlined arrow.

Next, a light-emitting element having a dual emission structure is described with reference to FIG. 28C. In FIG. 28C, a cathode 7023 of a light-emitting element 7022 is formed over a light-transmitting conductive material 7027 which is electrically connected to a driving TFT 7021, and a light-emitting layer 7024 and an anode 7025 are sequentially stacked over the cathode 7023. As in FIG. 28A, the cathode 7023 can be formed using any known conductive material as long as it has a low work function. Note that the thickness of the cathode 7023 is set such that light is transmitted therethrough. For example, an Al film with a thickness of 20 nm can be used as the cathode 7023. As in FIG. 28A, the light-emitting layer 7024 may be formed using either a single layer or a stacked layer of a plurality of layers. As in FIG. 28A, the anode 7025 can be formed using a light-transmitting conductive material which transmits light.

A region where the cathode 7023, the light-emitting layer 7024, and the anode 7025 overlap with each other corresponds to the light-emitting element 7022. In the case of the pixel shown in FIG. 28C, light is emitted from the light-emitting element 7022 to both the anode 7025 side and the cathode 7023 side as indicated by outlined arrows.

Note that, although an organic EL element is described here as a light-emitting element, an inorganic EL element can also be provided as a light-emitting element.

Note that, in this embodiment mode, the example is described in which a thin film transistor (a driving TFT) which controls the driving of a light-emitting element is electrically connected to the light-emitting element, but a structure may be employed in which a TFT for current control is connected between the driving TFT and the light-emitting element.

Figure 28B:
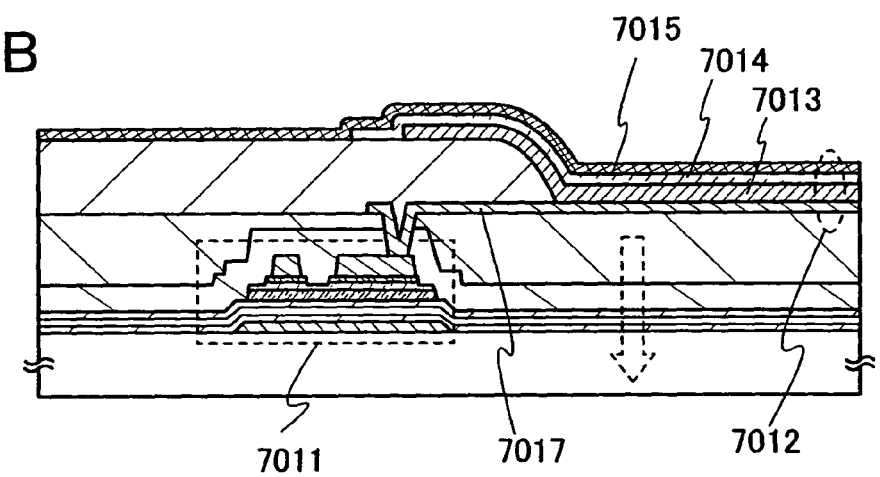
Figure 28C:
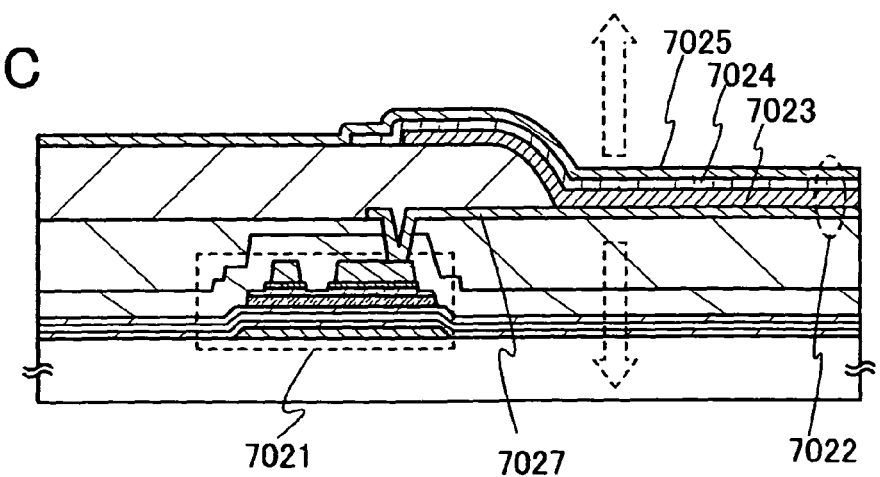

Note that the light-emitting device described in this embodiment mode is not limited to the structures shown in FIGS. 28A to 28C and can be modified in various ways based on the technical idea of the present invention.

Through the above-described process, a light-emitting device can be manufactured. Since a thin film transistor with small off current, high electric characteristics, and high reliability is used in the light-emitting device of this embodiment mode, the light-emitting device has high contrast and high visibility.

(Embodiment Mode 7)

A structure of a display panel, which is one mode of the display device of the present invention, will be described below.

Figure 29A:
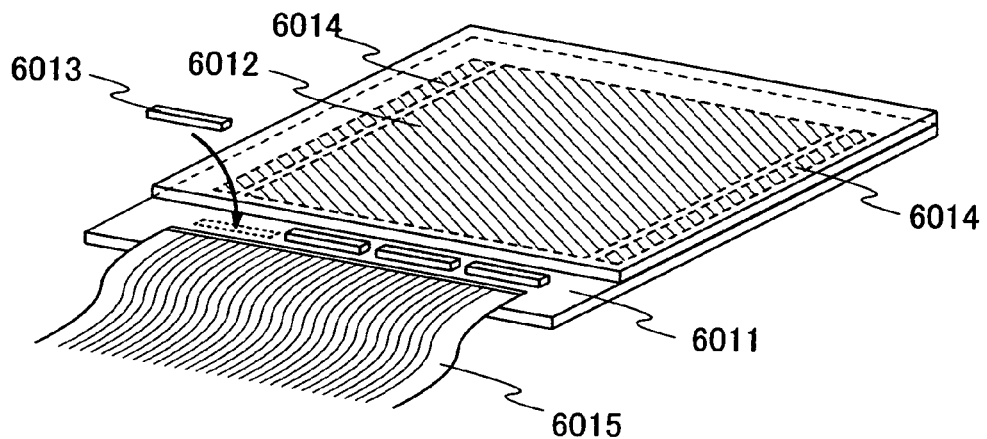
FIGS. 29A to 29C are perspective views each illustrating a display panel.

FIG. 29A shows a mode of a display panel in which a signal line driver circuit 6013 which is separately formed is connected to a pixel portion 6012 formed over a substrate 6011. The pixel portion 6012 and a scanning line driver circuit 6014 are each formed using a thin film transistor in which a microcrystalline semiconductor film is used. When the signal line driver circuit is formed using a transistor in which higher mobility can be obtained compared to the thin film transistor using the microcrystalline semiconductor film, an operation of the signal line driver circuit which demands a higher driving frequency than that of the scanning line driver circuit can be stabilized. Note that the signal line driver circuit 6013 may be formed using a transistor using a single crystalline semiconductor, a thin film transistor using a polycrystalline semiconductor, or a transistor using SOI. The pixel portion 6012, the signal line driver circuit 6013, and the scanning line driver circuit 6014 are each supplied with a potential of a power source, a variety of signals, and the like via an FPC 6015.

Note that both the signal line driver circuit and the scanning line driver circuit may be formed over the same substrate as that of the pixel portion.

Figure 29B:
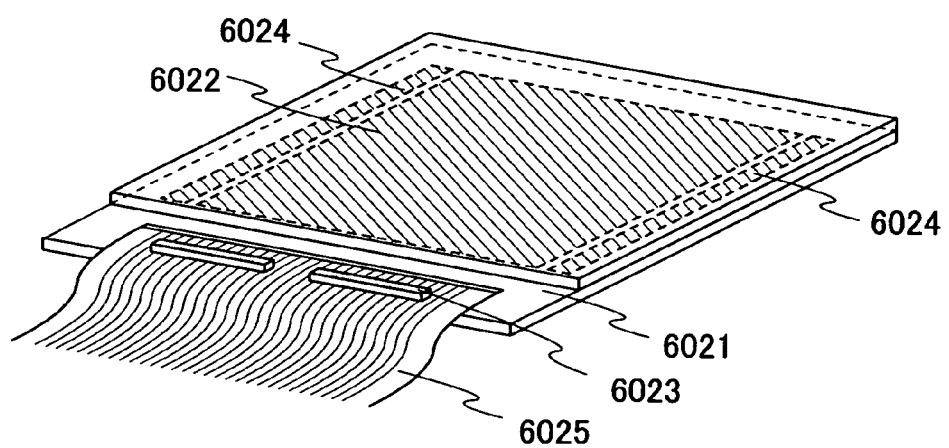

When a driver circuit is separately formed, a substrate over which the driver circuit is formed is not necessarily attached to a substrate over which a pixel portion is formed, and may be attached to an FPC, for example. FIG. 29B shows a mode of a liquid crystal display panel in which a signal line driver circuit 6023 which is separately formed is connected to a pixel portion 6022 and a scanning line driver circuit 6024 formed over a substrate 6021. The pixel portion 6022 and the scanning line driver circuit 6024 are each formed using a thin film transistor in which a microcrystalline semiconductor film is used. The signal line driver circuit 6023 is connected to the pixel portion 6022 via an FPC 6025. The pixel portion 6022, the signal line driver circuit 6023, and the scanning line driver circuit 6024 are each supplied with a potential of a power source, a variety of signals, and the like via the FPC 6025.

Figure 29C:
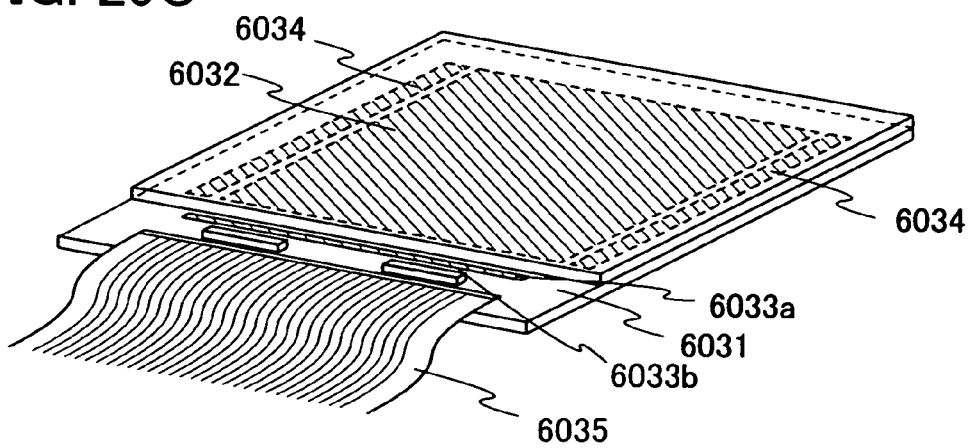

Alternatively, only part of a signal line driver circuit or part of a scanning line driver circuit may be formed over the same substrate as that of a pixel portion by using a thin film transistor which uses a microcrystalline semiconductor film, and the other part of the driver circuit may be separately formed and electrically connected to the pixel portion. FIG. 29C shows a mode of a liquid crystal display panel in which an analog switch 6033a which is part of a signal line driver circuit is formed over a substrate 6031, which is the same substrate as that of a pixel portion 6032 and a scanning line driver circuit 6034, and a shift register 6033b which is part of the signal line driver circuit is separately formed over a different substrate and attached to the substrate 6031. The pixel portion 6032 and the scanning line driver circuit 6034 are each formed using a thin film transistor in which a microcrystalline semiconductor film is used. The shift register 6033b which is part of the signal line driver circuit is connected to the pixel portion 6032 via an FPC 6035. The pixel portion 6032, the signal line driver circuit, and the scanning line driver circuit 6034 are each supplied with a potential of a power source, a variety of signals, and the like via the FPC 6035.

As shown in FIGS. 29A to 29C, in a liquid crystal display device of the present invention, all or a part of the driver circuit can be formed over the same substrate as that of the pixel portion, using the thin film transistor in which the microcrystalline semiconductor film is used.

Note that a connection method of a substrate which is separately formed is not particularly limited, and a known method such as a COG method, a wire bonding method, or a TAB method can be used. Further, a connection position is not limited to the positions shown in FIGS. 29A to 29C as long as electrical connection is possible. Moreover, a controller, a CPU, a memory, or the like may be formed separately and connected.

Note that a signal line driver circuit used in the present invention is not limited to a structure including only a shift register and an analog switch. In addition to the shift register and the analog switch, another circuit such as a buffer, a level shifter, or a source follower may be included. Moreover, the shift register and the analog switch are not necessarily provided. For example, a different circuit such as a decoder circuit by which a signal line can be selected may be used instead of the shift register, or a latch or the like may be used instead of the analog switch.

Figure 32:
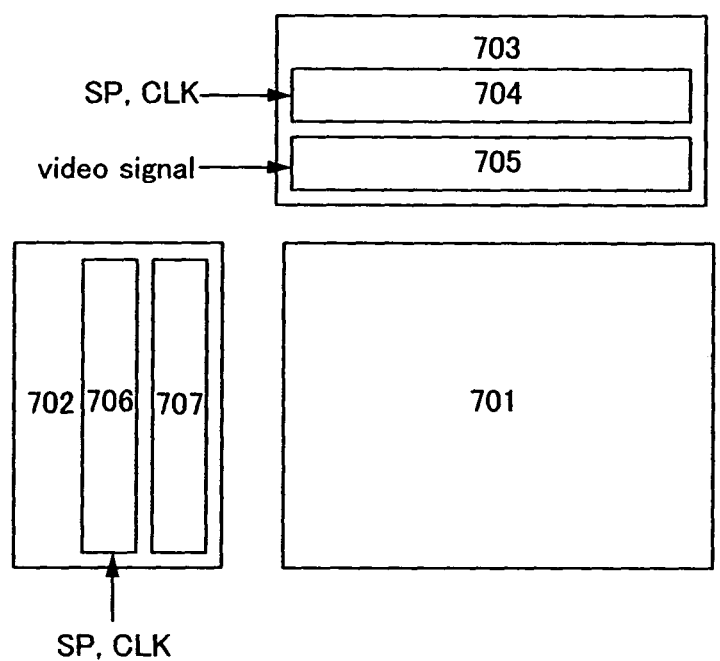
FIG. 32 is a block diagram illustrating a structure of a light-emitting device.

FIG. 32 is a block diagram of a liquid crystal display device of the present invention. The display device shown in FIG. 32 includes a pixel portion 701 including a plurality of pixels each provided with a display element, a scanning line driver circuit 702 which selects each pixel, and a signal line driver circuit 703 which controls input of a video signal to a selected pixel.

In FIG. 32, the signal line driver circuit 703 includes a shift register 704 and an analog switch 705. A clock signal (CLK) and a start pulse signal (SP) are input to the shift register 704. When the clock signal (CLK) and the start pulse signal (SP) are input, a timing signal is generated in the shift register 704 and input to the analog switch 705.

A video signal is supplied to the analog switch 705. The analog switch 705 samples the video signal in accordance with the timing signal that is input and supplies the resulting signal to a signal line of the next stage.

Next, a structure of the scanning line driver circuit 702 is described. The scanning line driver circuit 702 includes a shift register 706 and a buffer 707. The scanning line driver circuit 702 may also include a level shifter in some cases. In the scanning line driver circuit 702, when the clock signal (CLK) and the start pulse signal (SP) are input to the shift register 706, a selection signal is generated. The generated selection signal is buffered and amplified by the buffer 707, and the resulting signal is supplied to a corresponding scanning line. Gates of transistors in pixels of one line are connected to the scanning line. Further, since the transistors in the pixels of one line have to be turned on at the same time, a buffer through which large current can flow is used as the buffer 707.

In a full color liquid crystal display device, when video signals corresponding to R (red), G (green), and B (blue) are sequentially sampled and supplied to a corresponding signal line, the number of terminals for connecting the shift register 704 and the analog switch 705 corresponds to approximately ⅓ of the number of terminals for connecting the analog switch 705 and the signal line in the pixel portion 701. Accordingly, when the analog switch 705 and the pixel portion 701 are formed over the same substrate, the number of terminals used for connecting a substrate which is separately formed can be suppressed compared to the case where the analog switch 705 and the pixel portion 701 are formed over different substrates; thus, occurrence probability of bad connection can be suppressed, and the yield can be increased.

Note that although the scanning line driver circuit 702 shown in FIG. 32 includes the shift register 706 and the buffer 707, the scanning line driver circuit 702 may be formed using only the shift register 706.

Note that structures of the signal line driver circuit and the scanning line driver circuit are not limited to the structures shown in FIG. 32, which are merely one mode of the display device of the present invention. In a liquid crystal display device including the circuit as shown in FIG. 32 having a transistor using a microcrystalline semiconductor, the circuit can be operated at high speed. For example, mobility of a transistor using a microcrystalline semiconductor film is higher than that of a transistor using an amorphous semiconductor film; thus, a driving frequency of a driver circuit (e.g., the shift register 706 in the scanning line driver circuit 702) can be increased. Since the scanning line driver circuit 702 can be operated at high speed, a frame frequency can be increased or black frame insertion can be realized, for example.

When the frame frequency is increased, data for a screen is preferably generated in accordance with a direction of movement of an image. That is, motion compensation is preferably performed to interpolate data. When the frame frequency is increased and image data is interpolated in such a manner, display characteristics of moving images are improved, and smooth display can be performed. For example, when a frame frequency is twice (e.g., 120 Hz or 100 Hz) or more, and preferably four times (e.g., 480 Hz or 400 Hz) or more, blurring and afterimages of moving images can be reduced. In this case, the driving frequency of the scanning line driver circuit 702 is also increased to be operated; thus, the frame frequency can be increased.

When black frame insertion is performed, image data or data for black display is supplied to the pixel portion 701. Thus, such a display mode is closer to impulse driving, and afterimages can be reduced. In this case, the driving frequency of the scanning line driver circuit 702 is also increased to be operated, and thus, black frame insertion can be performed.

In addition, when the channel width of the thin film transistor in the scanning line driver circuit 702 is increased or a plurality of scanning line driver circuits is provided, for example, a higher frame frequency can be realized. For example, a frame frequency can be eight times (e.g., 960 Hz or 800 Hz) or more. When a plurality of scanning line driver circuits is provided, a scanning line driver circuit for driving even-numbered scanning lines is provided on one side and a scanning line driver circuit for driving odd-numbered scanning lines is provided on the opposite side; thus, increase in frame frequency can be realized.

When the circuit as shown in FIG. 32 includes a thin film transistor in which a microcrystalline semiconductor is used, the layout area can be reduced. Accordingly, a frame of the liquid crystal display device which is one example of the display device can be reduced. For example, mobility of the thin film transistor in which a microcrystalline semiconductor film is used is higher than that of a thin film transistor in which an amorphous semiconductor film is used; thus, the channel width of the thin film transistor can be reduced. As a result, a frame of the liquid crystal display device can be narrowed.

The thin film transistor in which a microcrystalline semiconductor film is used is harder to deteriorate than a thin film transistor in which an amorphous semiconductor film is used. Accordingly, when the microcrystalline semiconductor film is used, the channel width of the thin film transistor can be reduced. Alternatively, the thin transistor can be normally operated without any circuit for compensation for deterioration. Accordingly, the layout area of a thin transistor for one pixel can be reduced.

(Embodiment Mode 8)

Figure 33A:
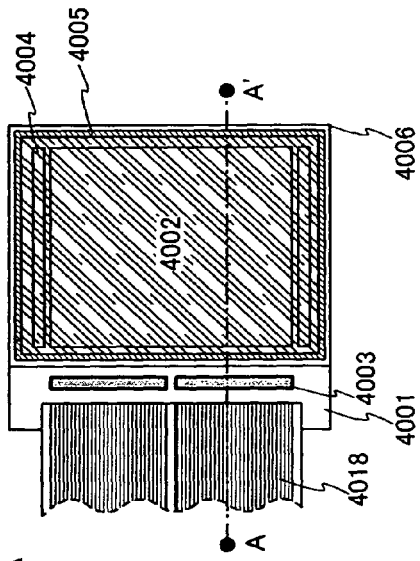
FIG. 33A is a top view and FIG. 33B is a cross-sectional view illustrating a display panel.
Figure 33B:
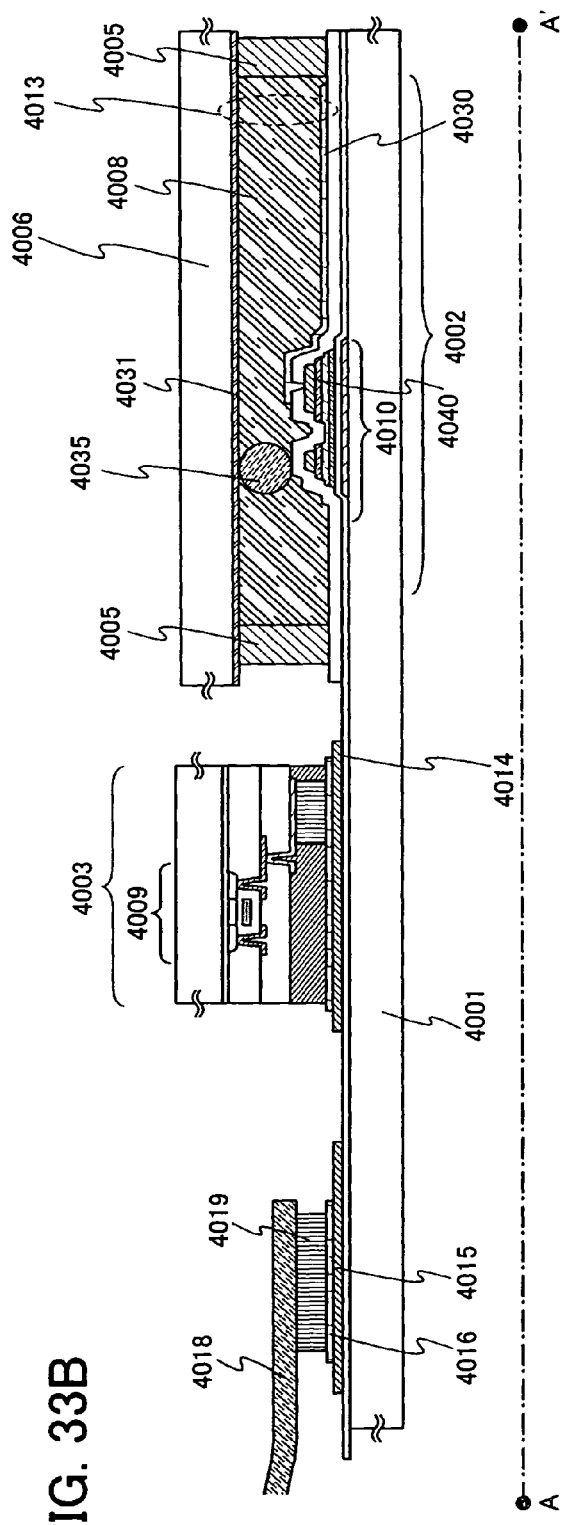

Next, the appearance and a cross section of a liquid crystal display panel which is one mode of the display device of the present invention will be described with reference to FIGS. 33A and 33B. FIG. 33A is a top view of a panel. In the panel, a thin film transistor 4010 in which a microcrystalline semiconductor film is used and a liquid crystal element 4013 which are formed over a first substrate 4001 are sealed between the first substrate 4001 and a second substrate 4006 by a sealing material 4005. FIG. 33B is a cross-sectional view along a line A-A' in FIG. 33A.

The sealing material 4005 is provided so as to surround a pixel portion 4002 and a scanning line driver circuit 4004 which are provided over the first substrate 4001. The second substrate 4006 is provided over the pixel portion 4002 and the scanning line driver circuit 4004. Accordingly, the pixel portion 4002 and the scanning line driver circuit 4004 are sealed together with liquid crystal 4008 by the first substrate 4001, the sealing material 4005, and the second substrate 4006. Further, a signal line driver circuit 4003 formed using a polycrystalline semiconductor film over a different substrate is mounted on a region over the first substrate 4001, which is different from the region surrounded by the sealing material 4005. Note that in this embodiment mode, an example is described in which the signal line driver circuit including a thin film transistor using a polycrystalline semiconductor film is attached to the first substrate 4001; however, a signal line driver circuit may be formed using a transistor using a single crystalline semiconductor and attached to a substrate. FIGS. 33A and 33B illustrate a thin film transistor 4009 formed using a polycrystalline semiconductor film, which is included in the signal line driver circuit 4003.

Each of the pixel portion 4002 and the scanning line driver circuit 4004 which are provided over the first substrate 4001 includes a plurality of thin film transistors. FIG. 33B illustrates the thin film transistor 4010 included in the pixel portion 4002. The thin film transistor 4010 corresponds to a thin film transistor in which a microcrystalline semiconductor film is used.

A pixel electrode 4030 included in the liquid crystal element 4013 is electrically connected the thin film transistor 4010 through a wiring 4040. A counter electrode 4031 of the liquid crystal element 4013 is formed on the second substrate 4006. A portion where the pixel electrode 4030, the counter electrode 4031, and the liquid crystal 4008 overlap with each other corresponds to the liquid crystal element 4013.

Note that for each of the first substrate 4001 and the second substrate 4006, glass, a metal (typically, stainless steel), ceramics, or plastics can be used. As plastics, a fiberglass-reinforced plastics (FRP) plate, a polyvinyl fluoride (PVF) film, a polyester film, or an acrylic resin film can be used. Moreover, a sheet in which aluminum foil is interposed by a PVF film or a polyester film can also be used.

A spherical spacer 4035 is provided to control a distance (a cell gap) between the pixel electrode 4030 and the counter electrode 4031. Note that a spacer obtained by selective etching of an insulating film may be used.

A variety of signals and a potential supplied to the separately formed signal line driver circuit 4003, the scanning line driver circuit 4004, and the pixel portion 4002 are supplied from an FPC 4018 through lead wirings 4014 and 4015.

In this embodiment mode, a connection terminal 4016 is formed using the same conductive film as the pixel electrode 4030 included in the liquid crystal element 4013. Further, the lead wirings 4014 and 4015 are formed using the same conductive film as the wiring 4040.

The connection terminal 4016 is electrically connected to a terminal included in the FPC 4018 through an anisotropic conductive film 4019.

Note that although not shown, a liquid crystal display device shown in this embodiment mode includes an alignment film and a polarizing plate, and may also include a color filter or a blocking film.

FIGS. 33A and 33B illustrate an example in which the signal line driver circuit 4003 is separately formed and attached to the first substrate 4001; however, this embodiment mode is not limited to this structure. A scanning line driver circuit may be separately formed and attached to a substrate, or only part of a signal line driver circuit or part of a scanning line driver circuit may be separately formed and attached to a substrate.

This embodiment mode can be implemented in combination with any of the structures described in other embodiment modes.

(Embodiment Mode 9)

Next, the appearance and a cross section of a light-emitting display panel which is one mode of the display device of the present invention will be described with reference to FIGS. 34A and 34B. FIG. 34A is a top view of a panel. In the panel, a thin film transistor in which a microcrystalline semiconductor film is used and a light-emitting element which are formed over a first substrate are sealed between the first substrate and a second substrate by a sealing material. FIG. 34B is a cross-sectional view along a line A-A' in FIG. 34A.

The sealing material 4005 is provided so as to surround a pixel portion 4002 and a scanning line driver circuit 4004 which are provided over the first substrate 4001. The second substrate 4006 is provided over the pixel portion 4002 and the scanning line driver circuit 4004. Accordingly, the pixel portion 4002 and the scanning line driver circuit 4004 are sealed together with a filler 4007 by the first substrate 4001, the sealing material 4005, and the second substrate 4006. Further, a signal line driver circuit 4003 formed using a polycrystalline semiconductor film over a different substrate is mounted on a region over the first substrate 4001, which is different from the region surrounded by the sealing material 4005. Note that in this embodiment mode, an example is described in which the signal line driver circuit including a thin film transistor using a polycrystalline semiconductor film is attached to the first substrate 4001; however, a signal line driver circuit may be formed using a transistor using a single crystalline semiconductor and attached to a substrate. FIG. 34B illustrates a thin film transistor 4009 formed using a polycrystalline semiconductor film, which is included in the signal line driver circuit 4003.

Each of the pixel portion 4002 and the scanning line driver circuit 4004 which are provided over the first substrate 4001 includes a plurality of thin film transistors. FIG. 34B illustrates the thin film transistor 4010 included in the pixel portion 4002. Note that in this embodiment mode, description is made on the assumption that the thin film transistor 4010 is a driving TFT; however, the thin film transistor 4010 may be a TFT for current control or a TFT for erasing. The thin film transistor 4010 corresponds to a thin film transistor in which a microcrystalline semiconductor film is used.

Reference numeral 4011 denotes a light-emitting element. A pixel electrode 4017 included in the light-emitting element 4011 is electrically connected to a source or drain electrode of the thin film transistor 4010 through a wiring 4020. Moreover, in this embodiment mode, a light-transmitting conductive film 4012 and a common electrode of the light-emitting element 4011 are electrically connected to each other. Note that a structure of the light-emitting element 4011 is not limited to that described in this embodiment mode. The structure of the light-emitting element 4011 can be changed as appropriate depending on a direction in which light is extracted from the light-emitting element 4011, the polarity of the thin film transistor 4010, or the like.

Although not shown in the cross-sectional view of FIG. 34B, a variety of signals and a potential supplied to the separately formed signal line driver circuit 4003, the scanning line driver circuit 4004, and the pixel portion 4002 are supplied from an FPC 4018 through lead wirings 4014 and 4015.

In this embodiment mode, a connection terminal 4016 is formed using the same conductive film as that of the pixel electrode 4017 included in the light-emitting element 4011. Further, the lead wirings 4014 and 4015 are formed using the same conductive film as that of the wiring 4020.

The connection terminal 4016 is electrically connected to a terminal included in the FPC 4018 through an anisotropic conductive film 4019.

The second substrate located in the direction in which light is extracted from the light-emitting element 4011 needs to be transparent. In this case, a light-transmitting material such as a glass plate, a plastic plate, a polyester film, or an acrylic film is used.

As the filler 4007, an ultraviolet curable resin or a thermosetting resin as well as inert gas such as nitrogen or argon can be used. For example, polyvinyl chloride (PVC), acrylic, polyimide, an epoxy resin, a silicone resin, polyvinyl butyral (PVB), or ethylene vinyl acetate (EVA) can be used. In this embodiment mode, nitrogen is used for the filler 4007.

If needed, an optical film such as a polarizing plate, a circular polarizing plate (including an elliptical polarizing plate), a retardation plate (a quarter-wave plate or a half-wave plate), or a color filter may be provided on an emission surface of the light-emitting element as appropriate. Further, the polarizing plate or the circular polarizing plate may be provided with an antireflection film. For example, anti-glare treatment for diffusing reflected light by unevenness of the surface and reducing reflection can be performed.

FIGS. 34A and 34B illustrate an example in which the signal line driver circuit 4003 is separately formed and attached to the first substrate 4001; however, this embodiment mode is not limited to this structure. A scanning line driver circuit may be separately formed and attached to a substrate, or only part of a signal line driver circuit or part of a scanning line driver circuit may be separately formed and attached to a substrate.

This embodiment mode can be implemented in combination with any of the structures described in other embodiment modes.

(Embodiment Mode 10)

The display device obtained by the present invention, and the like can be used for an active matrix display module. That is, the present invention can be implemented in any of electronic devices having a display portion into which such a display module is incorporated.

Examples of such electronic devices include a camera such as a video camera or a digital camera, a head-mounted display (a goggle-type display), a car navigation system, a projector, a car stereo, a personal computer, and a portable information terminal (e.g., a mobile computer, a cellular phone, and an e-book reader). FIGS. 30A to 30D show examples of such electronic devices.

Figure 30A:
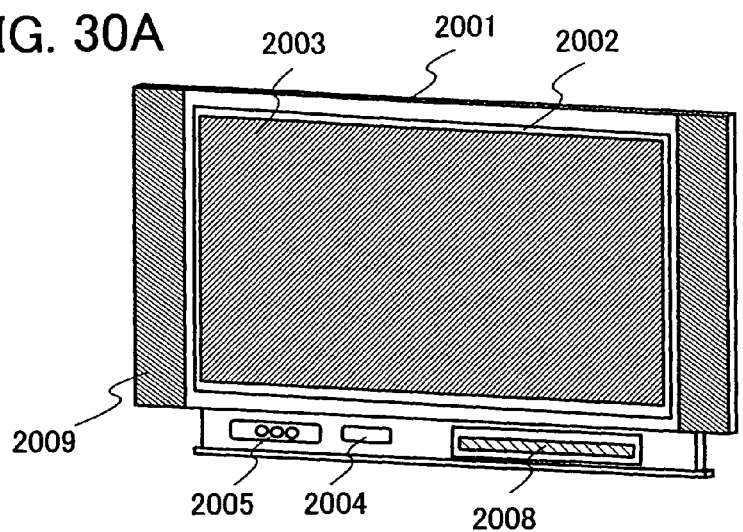
FIGS. 30A to 30D are perspective views illustrating electronic devices using a light-emitting device.

FIG. 30A shows a television device. The television device can be completed by incorporating a display module into a housing as shown in FIG. 30A. A display panel at the stage after an FPC is attached is also referred to as a display module. A main screen 2003 is formed using the display module, and other accessories such as a speaker portion 2009 and an operation switch are provided. Thus, the television device can be completed.

As shown in FIG. 30A, a display panel 2002 using a display element is incorporated into a housing 2001. The television device can receive general TV broadcast by a receiver 2005, and can be connected to a wired or wireless communication network via a modem 2004 so that one-way (from a sender to a receiver) or two-way (between a sender and a receiver or between receivers) information communication can be performed. The television device can be operated by a switch incorporated into the housing or a separate remote control unit 2006. The remote control unit may include a display portion 2007 for displaying information to be output.

Further, the television device may include a sub screen 2008 formed using a second display panel for displaying channels, sound volume, and the like, in addition to the main screen 2003. In this structure, the main screen 2003 may be formed using a liquid crystal display panel with an excellent viewing angle, and the sub screen may be formed using a light-emitting display panel in which display is performed with low power consumption. Alternatively, when reduction in power consumption is prioritized, a structure may be employed in which the main screen 2003 is formed using a light-emitting display panel, the sub screen is formed using a light-emitting display panel, and the sub screen can be turned on and off.

Figure 31:
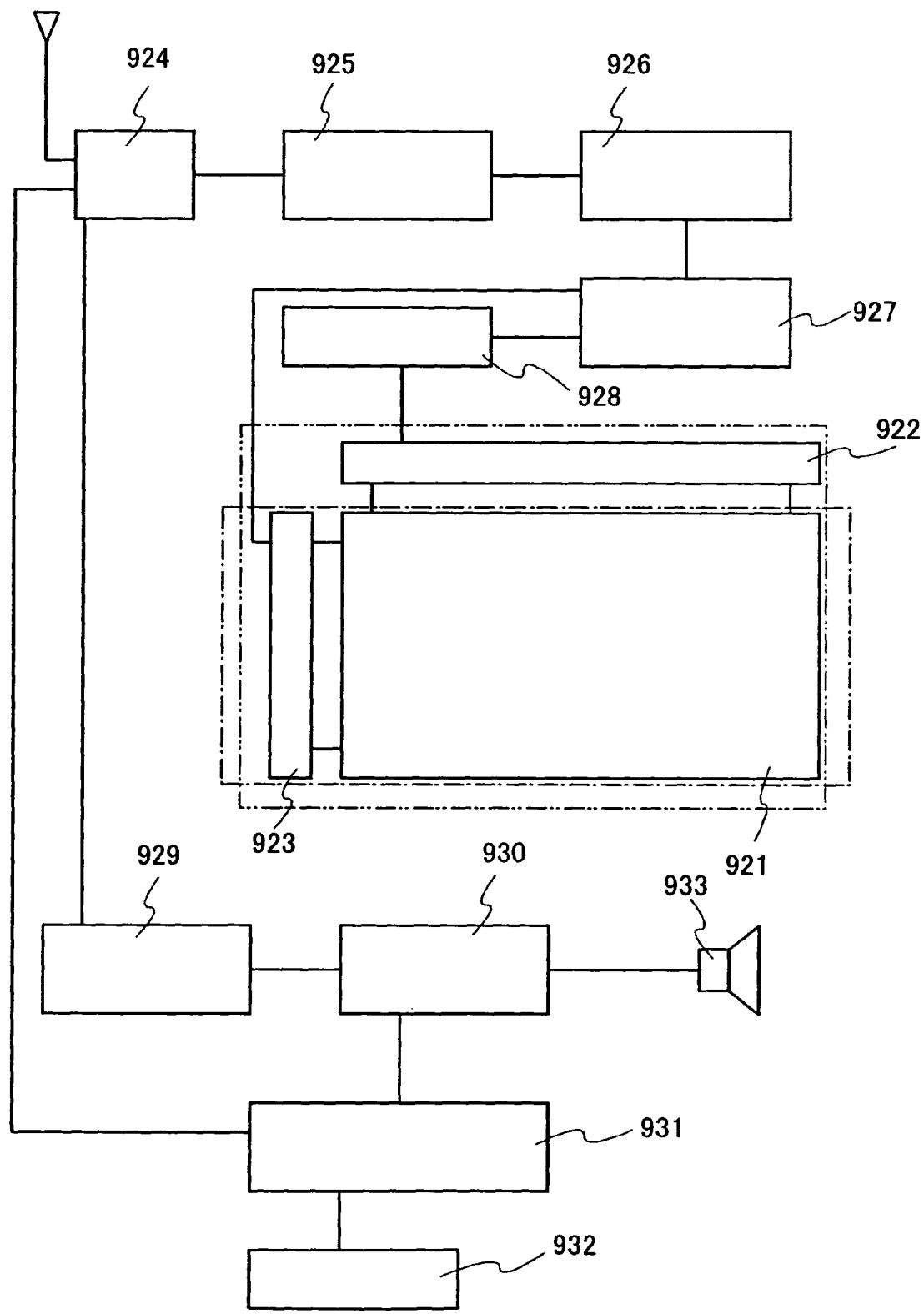
FIG. 31 is a diagram illustrating an electronic device using a light-emitting device.

FIG. 31 is a block diagram of a main structure of a television device. A display panel is provided with a pixel portion 921. A signal line driver circuit 922 and a scanning line driver circuit 923 may be mounted on the display panel by a COG method.

As for other external circuits, the television device includes a video signal amplifier circuit 925 which amplifies a video signal among signals received by a tuner 924; a video signal processing circuit 926 which converts a signal output from the video signal amplifier circuit 925 into a color signal corresponding to each color of red, green, and blue; a control circuit 927 which converts the video signal into an input specification of a driver IC; and the like, on the input side of the video signal. The control circuit 927 outputs signals to each of the scanning line side and the signal line side. When digital driving is performed, a structure may be employed in which a signal dividing circuit 928 is provided on the signal line side and an input digital signal is divided into m signals to be supplied.

Among the signals received by the tuner 924, an audio signal is transmitted to an audio signal amplifier circuit 929, and an output thereof is supplied to a speaker 933 through an audio signal processing circuit 930. A control circuit 931 receives control information on receiving station (receiving frequency) and volume from an input portion 932 and transmits a signal to the tuner 924 and the audio signal processing circuit 930.

It is needless to say that the present invention is not limited to a television device and can be applied to various uses, e.g., a monitor of a personal computer, a large display medium such as an information display board at the train station, the airport, or the like, or an advertisement display board on the street, and the like.

Figure 30B:
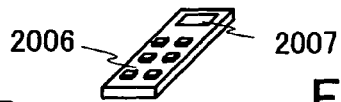

FIG. 30B shows an example of a cellular phone 2301. The cellular phone 2301 includes a display portion 2302, an operation portion 2303, and the like. When the display device described in the above-described embodiment mode is used for the display portion 2302, mass productivity can be increased.

Figure 30C:
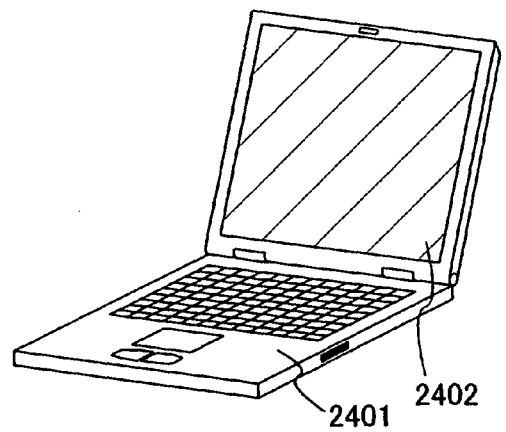

A portable computer shown in FIG. 30C includes a main body 2401, a display portion 2402, and the like. When the display device described in the above-described embodiment mode is used for the display portion 2402, mass productivity can be increased.

Figure 30D:
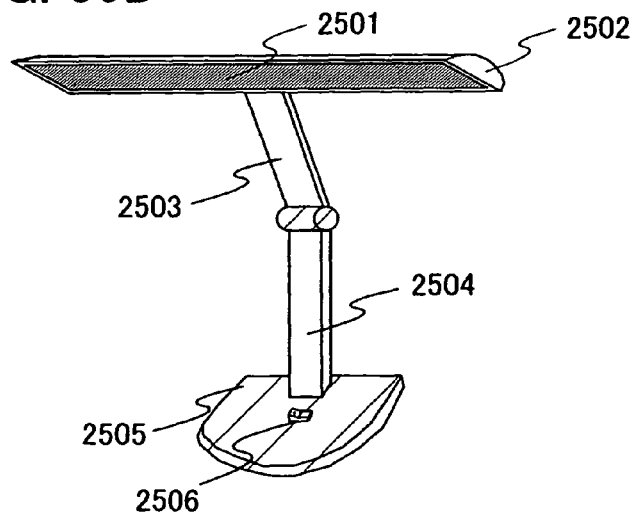

FIG. 30D shows a desk lamp including a lighting portion 2501, a shade 2502, an adjustable arm 2503, a support 2504, a base 2505, and a power source switch 2506. The desk lamp is formed using the light-emitting device, which is described in Embodiment Mode 6, for the lighting portion 2501. Note that a lamp includes a ceiling light, a wall light, and the like in its category. By employing the display device described in Embodiment Mode 6, mass productivity can be increased, and an inexpensive desk lamp can be provided.

This application is based on Japanese Patent Application Serial No. 2007-213057 filed with Japan Patent Office on Aug. 17, 2007, the entire contents of which are hereby incorporated by reference.

What is claimed is:

1. A method for manufacturing a semiconductor device, comprising the steps of:
   forming a gate electrode over a substrate having an insulating surface;
   forming an insulating film over the gate electrode;
   forming a film on an inner wall of a vacuum chamber by introducing a source gas to the vacuum chamber after evacuating the vacuum chamber;
   disposing the substrate into the vacuum chamber after forming the film;
   forming a microcrystalline semiconductor film over the insulating film in the vacuum chamber after disposing the substrate;
   forming a buffer layer over the microcrystalline semiconductor film;
   forming a semiconductor film to which an impurity element imparting one conductivity type is added;
   etching the microcrystalline semiconductor film, the buffer layer, and the semiconductor film to which the impurity element imparting one conductivity type is added, wherein the microcrystalline semiconductor film, the buffer layer, and the semiconductor film to which the impurity element imparting one conductivity type is added are narrower than the gate electrode;
   forming source and drain electrodes over the semiconductor film to which the impurity element imparting one conductivity type is added;
   etching and removing a part of the semiconductor film to which the impurity element imparting one conductivity type is added; and
   etching and removing a part of the buffer layer which is not covered with the source and drain electrodes,
   wherein substrate temperature is increased continuously in the step of forming the microcrystalline semiconductor film,
   wherein helium is introduced to the vacuum chamber in the step of forming the microcrystalline semiconductor film, and
   wherein in the step of forming the microcrystalline semiconductor film, at least one deposition condition is changed continuously such that a first region near an interface with the buffer layer is formed at a deposition rate that is higher than that for forming a second region near an interface with the insulating film.

2. The method for manufacturing a semiconductor device according to claim 1,
wherein the buffer layer is an amorphous semiconductor film, and
wherein the buffer layer is formed in a different vacuum chamber from the vacuum chamber used for forming the microcrystalline semiconductor film, under a deposition condition with substrate temperatures of greater than or equal to 300° C. and less than 400° C.

3. The method for manufacturing a semiconductor device according to claim 1,
wherein, under another deposition condition of forming a part of the microcrystalline semiconductor film near an interface with the insulating film, a plurality of discharge-stop-periods is provided in a deposition period of one substrate by turning off high-frequency power.

4. The method for manufacturing a semiconductor device according to claim 1,
wherein a source gas for forming the microcrystalline semiconductor film includes a silane gas, a hydrogen gas, and a trimethyl boron gas.

5. The method for manufacturing a semiconductor device according to claim 1,
wherein the inner wall of the vacuum chamber in which the microcrystalline semiconductor film is formed is heated to a temperature that is higher than a substrate temperature when the microcrystalline semiconductor film is formed.

6. The method for manufacturing a semiconductor device according to claim 1, wherein the buffer layer is formed using an amorphous semiconductor film containing halogen.

7. The method for manufacturing a semiconductor device according to claim 1, wherein the vacuum chamber is evacuated to have an atmosphere with a degree of vacuum of over $1 \times 10^{-8}$ Pa and less than or equal to $1 \times 10^{-5}$ Pa.

8. The method for manufacturing a semiconductor device according to claim 1, wherein argon is introduced to the vacuum chamber in the initial stage of forming the microcrystalline semiconductor film.

9. A method for manufacturing a semiconductor device, comprising the steps of:
forming a gate electrode over a substrate having an insulating surface;
forming an insulating film over the gate electrode;
forming a film on an inner wall of a vacuum chamber by introducing a source gas to the vacuum chamber after evacuating the vacuum chamber;
disposing the substrate in the vacuum chamber after forming the film;
forming a first microcrystalline semiconductor film over the insulating film by introducing a source gas including a silane gas and a hydrogen gas to the vacuum chamber under a first deposition condition in which substrate temperature is set at greater than or equal to 100° C. and less than 300° C. after disposing the substrate, so that an oxygen concentration in the first microcrystalline semiconductor film is less than or equal to $1 \times 10^{17}$ atoms/cm$^3$;
forming a second microcrystalline semiconductor film in the vacuum chamber under a second deposition condition in which substrate temperature is set at higher than that of the first deposition condition, and a flow rate ratio of the silane gas to the hydrogen gas is higher than that of the first deposition condition after forming the first microcrystalline semiconductor film, so that a deposition rate of the second microcrystalline semiconductor film is higher than that of the first microcrystalline semiconductor film;
forming a buffer layer over the second microcrystalline semiconductor film, so that an oxygen concentration in the buffer layer is less than or equal to $5 \times 10^{19}$ atoms/cm$^3$;
forming a semiconductor film to which an impurity element imparting one conductivity type is added;
etching the first microcrystalline semiconductor film, the second microcrystalline semiconductor film, the buffer layer, and the semiconductor film to which the impurity element imparting one conductivity type is added, wherein the first microcrystalline semiconductor film, the second microcrystalline semiconductor film, the buffer layer, and the semiconductor film to which the impurity element imparting one conductivity type is added are narrower than the gate electrode;
forming source and drain electrodes over the semiconductor film to which the impurity element imparting one conductivity type is added;
etching and removing a part of the semiconductor film to which the impurity element imparting one conductivity type is added;
etching and removing a part of the buffer layer which is not covered with the source and drain electrodes; and
forming an insulating film over and in contact with the etched part of the buffer layer, and the source and drain electrodes,
wherein between the step of forming the first microcrystalline semiconductor film and the step of forming the second microcrystalline semiconductor film, at least one of substrate temperature and the flow rate ratio of the silane gas to the hydrogen gas is changed continuously and deposition continues.

10. The method for manufacturing a semiconductor device according to claim 9,
wherein the buffer layer is an amorphous semiconductor film, and
wherein the buffer layer is formed in a different vacuum chamber from the vacuum chamber used for forming the first and second microcrystalline semiconductor films, under a deposition condition with substrate temperatures of greater than or equal to 300° C. and less than 400° C.

11. The method for manufacturing a semiconductor device according to claim 9,
wherein, before disposing the substrate in the vacuum chamber, the vacuum chamber is evacuated to have an atmosphere with a degree of vacuum of over $1 \times 10^{-8}$ Pa and less than or equal to $1 \times 10^{-5}$ Pa, and
wherein a hydrogen gas or a rare gas is introduced to generate plasma after the evacuation.

12. The method for manufacturing a semiconductor device according to claim 9,
wherein a hydrogen gas or a rare gas is introduced to generate plasma after disposing the substrate in the vacuum chamber.

13. The method for manufacturing a semiconductor device according to claim 9,
wherein, under the second deposition condition, a plurality of discharge-stop-periods is provided in a deposition period of one substrate by turning off high-frequency power.

14. The method for manufacturing a semiconductor device according to claim 9,
wherein the source gas for forming the first and second microcrystalline semiconductor films further includes a trimethyl boron gas.

15. The method for manufacturing a semiconductor device according to claim 2,
wherein the inner wall of the vacuum chamber in which the first and second microcrystalline semiconductor films are formed is heated to a temperature that is higher than the substrate temperature when the first and the second microcrystalline semiconductor films are formed.

16. The method for manufacturing a semiconductor device according to claim 9, wherein the buffer layer is formed using an amorphous semiconductor film containing halogen.

17. The method for manufacturing a semiconductor device according to claim 9, wherein the vacuum chamber is evacuated to have an atmosphere with a degree of vacuum of over $1 \times 10^{-8}$ Pa and less than or equal to $1 \times 10^{-8}$ Pa.

18. The method for manufacturing a semiconductor device according to claim 9, wherein, between the step of forming the first microcrystalline semiconductor film and the step of forming a second microcrystalline semiconductor film, substrate temperature is increased continuously and deposition continues.

* * * * *

UNITED STATES PATENT AND TRADEMARK OFFICE
CERTIFICATE OF CORRECTION

PATENT NO.         : 9,054,206 B2                                    Page 1 of 1
APPLICATION NO.    : 12/222109
DATED              : June 9, 2015
INVENTOR(S)        : Shunpei Yamazaki et al.

It is certified that error appears in the above-identified patent and that said Letters Patent is hereby corrected as shown below:

IN THE SPECIFICATION

At column 11, line 18, "Across-sectional" should be -- A cross-sectional --;

IN THE CLAIMS

In claim 15, column 45, line 2, "claim 2," should be -- claim 9, --;

In claim 17, column 45, line 14, "$1\times10^{-8}$" should be -- $1\times10^{-5}$ --. (2nd occurrence)

Signed and Sealed this
First Day of March, 2016

Michelle K. Lee
*Director of the United States Patent and Trademark Office*